(12) United States Patent
Shiraishi et al.

(10) Patent No.: US 10,934,159 B2
(45) Date of Patent: Mar. 2, 2021

(54) MEMS PACKAGE, MEMS MICROPHONE, METHOD OF MANUFACTURING THE MEMS PACKAGE AND METHOD OF MANUFACTURING THE MEMS MICROPHONE

(71) Applicant: SAE Magnetics (H.K.) Ltd., Hong Kong (HK)

(72) Inventors: Masashi Shiraishi, Hong Kong (HK); Akio Nakao, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 43 days.

(21) Appl. No.: 16/429,132

(22) Filed: Jun. 3, 2019

(65) Prior Publication Data

US 2020/0377364 A1 Dec. 3, 2020

(51) Int. Cl.
*B81B 7/00* (2006.01)
*B81B 7/02* (2006.01)
*B81C 1/00* (2006.01)
*H04R 19/04* (2006.01)

(52) U.S. Cl.
CPC .............. *B81B 7/0077* (2013.01); *B81B 7/02* (2013.01); *B81C 1/00333* (2013.01); *H04R 19/04* (2013.01); *B81B 2201/0257* (2013.01); *B81B 2203/0127* (2013.01); *B81B 2203/033* (2013.01); *B81B 2207/09* (2013.01); *B81C 2203/01* (2013.01)

(58) Field of Classification Search
CPC . B81B 7/0077; B81B 7/02; B81B 2201/0257; B81B 2203/0127; B81B 2203/033; B81B 2207/09; B81C 1/00333; B81C 2203/01; H04R 19/04
USPC ........................................................ 381/369
See application file for complete search history.

(56) References Cited

U.S. PATENT DOCUMENTS

| | | | |
|---|---|---|---|
| 9,426,581 B2 | 8/2016 | Khenkin et al. | |
| 2008/0175425 A1* | 7/2008 | Roberts | H04R 19/005 381/361 |
| 2014/0064546 A1 | 3/2014 | Szczech et al. | |
| 2015/0117681 A1* | 4/2015 | Watson | H04R 1/04 381/174 |
| 2015/0271610 A1* | 9/2015 | Vandyke | H04R 1/083 381/322 |
| 2017/0283246 A1* | 10/2017 | Elian | B81C 1/00277 |

FOREIGN PATENT DOCUMENTS

| | | |
|---|---|---|
| JP | 2011-49752 A | 3/2011 |
| JP | 2012-114672 A | 6/2012 |
| JP | 2015-523836 A | 8/2015 |
| JP | 2015-530790 A | 10/2015 |
| JP | 2016-523725 A | 8/2016 |

* cited by examiner

*Primary Examiner* — Sean H Nguyen

(57) ABSTRACT

A MEMS package has a MEMS chip, a package substrate, a dammed-seal part. The MEMS chip has an element substrate which a movable element is formed, the element substrate has an element hole-part which the movable element is arranged. The dammed-seal part has an annular dam-member which is formed on the element substrate so as to surround the element hole-part and a gel member. The gel member is formed by hardening of gel which is applied on the annular dam-member.

13 Claims, 53 Drawing Sheets

MEMS PACKAGE, MEMS MICROPHONE, METHOD OF MANUFACTURING THE MEMS PACKAGE AND METHOD OF MANUFACTURING THE MEMS MICROPHONE

BACKGROUND

Field of the Invention

The present invention relates to a MEMS package which a MEMS chip, being used as a microphone, a sensor and so on, is mounted on a package substrate, a MEMS microphone having the MEMS package, method of manufacturing the MEMS package, and method of manufacturing the MEMS Microphone.

Related Background Art

A minute device, which is called MEMS (Micro Electro Mechanical Systems), is conventionally known. The MEMS is a device which a minute movable element and an electronic circuit are integrated on a substrate (which is also called element substrate) made of silicon and so on. Because the whole of the MEMS is formed in a chip-like form, the MEMS is also called a MEMS chip, in the present invention. The MEMS chip is used as a microphone, sensor, actuator and so on.

For example, the MEMS chip, which is used as the microphone, has a membrane being a thin-film and electrodes made of one or two thin-film arranged in the neighborhood of the membrane, and the MEMS chip has a structure which a concave part, for arranging the membrane, is formed. In case of the MEMS chip, which is used as the microphone of capacitance-type, displacement of the membrane, in accordance with sound pressure, is detected as displacement of capacitance between the electrodes. Therefore, the MEMS chip, which is used as the microphone of capacitance-type, operates with the principle of a variable capacitor.

Then, concerning the MEMS package which the MEMS chip is mounted on the package substrate, the following two structures are conventionally known. The one is a structure which the MEMS chip is mounted on the package substrate by a FCB (Flip Chip Bonding, for example see JP2016-523725 (also called patent document 1)), and the other is a structure which the MEMS chip is mounted on the package substrate by a Wire Bonding (for example, see JP2012-114672 (also called patent document 2)).

SUMMARY OF THE INVENTION

By the way, in case of the MEMS package which is used as the microphone, it is important that the sound, entered from outside, reaches the membrane. As the structure for the-above, the following top-port structure is conventionally known.

The top-port structure means the structure which a sound hole is formed on a cap (also referred to lid, case, housing) for accommodating the MEMS package (for example, see JP2015-530790 (also called patent document 3), JP2011-49752 (also called patent document 4), JP2015-523836 (also called patent document 5), US2014/0064546 (also called patent document 6), U.S. Pat. No. 9,426,581 (also called patent document 7)).

Then, as the MEMS package having the top-port structure, for example, a MEMS package 510 illustrated in FIG. 52 and a MEMS package 610 illustrated in FIG. 53 are conventionally known.

The MEMS package 510 has the cap 501, the MEMS chip 502, an ASIC 503 and the package substrate 504. Then, a cylindrical seal-part 505 is formed to surround the sound hole 501b. The part, from the sound hole 501b to the MEMS chip 502, is sealed with the cylindrical seal-part 505. In the present invention, the structure, that the seal-part is formed to surround the sound hole of the cap, is also called "top-seal structure", like the MEMS package 510.

Further, the MEMS package 610 has the cap 601, the MEMS chip 602, the ASIC 603 and the package substrate 604. Then, the seal-part 605 is formed to surround the sound hole 601b. The part, from the sound hole 601b to the MEMS chip 602, is sealed with the seal-part 605, and a nozzle 606 is incorporated in the seal-part 605.

Then in the MEMS package having the above-described top-port structure, for example, in case of the MEMS package 510, the cylindrical seal-part 505 is formed with photoresist, thixotropic adhesive material. In this case, a liquid photoresist, adhesive is applied on the MEMS chip 502, the cylindrical seal-part 505 is formed by hardening the liquid photoresist, adhesive.

However, a hole part 502c, which the membrane (not illustrated) is arranged, is formed in the MEMS chip 502. Therefore, when a photoresist, adhesive is applied on a wafer, which a plurality of MEMS chips 502 are formed, the applied photoresist, adhesive is likely to flow into the hole parts 502c of the respective MEMS chips 502. When the photoresist, adhesive flow into the hole parts 502c, the membranes are likely to be damaged.

In addition to the above, it is extremely difficult that the three-dimensional cylindrical seal-part 505 is formed with liquid photoresist.

Accordingly, it is extremely difficult that the MEMS package 510 is manufactured certainly.

Further, in case of the MEMS package 610, because the nozzle 606 is needed to be incorporated in the seal-part 605, it is extremely difficult that the MEMS package 610 is manufactured.

As described above, it is extremely difficult that the conventional MEMS package, having the top-seal structure, is manufactured certainly.

Hence the present invention is made to solve the above problem, and it is an object to provide the MEMS package, the MEMS microphone, method of manufacturing the MEMS package and method of manufacturing the MEMS microphone, which can be manufactured certainly.

To solve the above problem, the present invention is a MEMS package, including: a MEMS chip, a package substrate which the MEMS chip is adhered, and a dammed-seal part, the MEMS chip includes an element substrate which a movable element is formed, the element substrate includes an element hole-part which the movable element is arranged, the dammed-seal part includes an annular dam-member which is formed on the element substrate so as to surround the element hole-part, and a gel member, the gel member is formed by hardening of gel which is applied on the annular dam-member.

In case of the above-described MEMS package, it is possible that the annular dam-member includes a dam upper surface, which is along with a chip surface being an outer surface of the element substrate, a dam bottom surface, which is in contact with the chip surface, a pair of dam side surfaces, which connect the dam upper surface and the dam bottom surface, the gel member is formed by being adhered to a dam upper end part of the dam upper surface side of the annular dam-member, without being in contact with the chip surface.

In case of the above-described MEMS package, it is possible that the annular dam-member has a double-ring structure constituted by an inner dam-member, which surrounds the element hole-part, and an outer dam-member, which surrounds the inner dam-member.

Further, in case of the above-described MEMS package, it is preferable that the inner dam-member and the outer dam-member includes respectively a dam upper surface, which is along with a chip surface being an outer surface of the element substrate, a dam bottom surface, which is in contact with the chip surface, a pair of dam slopes, which connects the dam upper surface and the dam bottom surface, and a variable width structure in which the width gradually increases toward the dam bottom surface from the dam upper surface, an annular groove-part, having a V-figure shape in a sectional view, is secured between the inner dam-member and the outer dam-member, the gel member is in contact with both the dam upper surface of the inner dam-member and the dam upper surface of the outer dam-member, and the gel member enters the annular groove-part to be in contact with the dam slopes of the inner dam-member and the outer dam-member.

Further, it is possible that the annular dam-member includes a dam upper surface, which is along with a chip surface being an outer surface of the element substrate, a dam bottom surface, which is in contact with the chip surface, a pair of dam slopes, which connect the dam upper surface and the dam bottom surface, and a variable width structure in which the width gradually increases toward the dam bottom surface from the dam upper surface, the gel member is in contact with the dam upper surface and the pair of dam slopes, and the gel member is formed so as to cover the annular dam-member.

Furthermore, it is possible that the annular dam-member includes a dam upper surface, which is along with a chip surface being an outer surface of the element substrate, a dam bottom surface, which is in contact with the chip surface, a pair of dam slopes, which connect the dam upper surface and the dam bottom surface, and a variable width structure in which the width gradually increases toward the dam bottom surface from the dam upper surface, the gel member is in contact with the dam upper surface and an outer dam slope, which is arranged outside, of the pair of dam slopes, and the gel member is formed so as to lean against the annular dam-member.

Then, the present invention provides a MEMS microphone including: a MEMS package, and a cap which wraps the MEMS package, the MEMS package comprises a MEMS chip, a package substrate which the MEMS chip is adhered, and a dammed-seal part, the MEMS chip includes an element substrate which a movable element is formed, the element substrate comprises an element hole-part which the movable element is arranged, the dammed-seal part includes an annular dam-member which is formed on the element substrate so as to surround the element hole-part, and a gel member, the gel member is formed by hardening of gel which is applied on the annular dam-member, the cap includes a top surface, which is formed so as to oppose to the package substrate, and a cap side-surface, which surrounds the top surface to be adhered to the package substrate, the top surface includes a sound hole, the gel member of the dammed-seal part is adhered to the top surface so as to surround the sound hole, or the gel member of the dammed-seal part is adhered to an annular end part, forming the sound hole.

In case of the above-described MEMS microphone, it is preferable that the annular dam-member includes a dam upper surface, which is along with a chip surface being an outer surface of the element substrate, a dam bottom surface, which is in contact with the chip surface, a pair of dam side surfaces, which connect the dam upper surface and the dam bottom surface, the gel member is formed by being adhered to a dam upper end part of the dam upper surface side of the annular dam-member, without being in contact with the chip surface.

Further, it is preferable that the dam upper end part of the annular dam-member is arranged inside the sound hole, and the gel member enters between the dam upper end part and the annular end part.

In case of the above-described MEMS microphone, it is preferable that the annular dam-member has a double-ring structure constituted by an inner dam-member, which surrounds the element hole-part, and an outer dam-member, which surrounds the inner dam-member, the inner dam-member and the outer dam-member includes respectively a dam upper surface, which is along with a chip surface being an outer surface of the element substrate, a dam bottom surface, which is in contact with the chip surface, a pair of dam slopes, which connects the dam upper surface and the dam bottom surface, and a variable width structure in which the width gradually increases toward the dam bottom surface from the dam upper surface, an annular groove-part, having a V-figure shape in a sectional view, is secured between the inner dam-member and the outer dam-member, the gel member is in contact with both the dam upper surface of the inner dam-member and the dam upper surface of the outer dam-member, and the gel member enters the annular groove-part to be in contact with the dam slopes of the inner dam-member and the outer dam-member.

Further, it is possible that the annular dam-member includes a dam upper surface, which is along with a chip surface being an outer surface of the element substrate, a dam bottom surface, which is in contact with the chip surface, a pair of dam slopes, which connect the dam upper surface and the dam bottom surface, and a variable width structure in which the width gradually increases toward the dam bottom surface from the dam upper surface, the gel member is in contact with the dam upper surface and the pair of dam slopes, and the gel member is formed so as to cover the annular dam-member.

Further, in case of the above-described MEMS microphone, it is possible that the annular dam-member includes an dam upper surface, which is along with a chip surface being an outer surface of the element substrate, a dam bottom surface, which is in contact with the chip surface, a pair of dam slopes, which connects the dam upper surface and the dam bottom surface, and a variable width structure in which the width gradually increases toward the dam bottom surface from the dam upper surface, the gel member is in contact with the dam upper surface and an outer dam slope, which is arranged outside, of the pair of dam slopes, and the gel member is formed so as to lean against the annular dam-member.

Further, it is preferable that the top surface has an annular end part which forms the sound hole, the annular end part sinks into the gel member.

Further, it is preferable that the annular end part has a sunk edge which protrudes along with the intersecting direction of the top surface, the sunk edge sinks into the gel member.

It is preferable that the annular dam-member includes an dam upper surface, which is along with a chip surface being an outer surface of the element substrate, a dam bottom surface, which is in contact with the chip surface, a pair of dam slopes, which connects the dam upper surface and the dam bottom surface, and a variable width structure in which the width gradually increases toward the dam bottom surface from the dam upper surface, a dam upper end part of the dam upper surface side of the annular dam-member is arranged inside the sound hole, the gel member is formed by being adhered to the dam upper end part, without being in contact with the chip surface, and the gel member enters between the dam upper end part and the annular end part.

Further, the present invention provides a method of manufacturing a MEMS package, using a MEMS chip, an ASIC and a package substrate including: an annular dam-member forming step for forming an annular dam-member having an annular structure which surrounds an element hole-part formed in each MEMS region of a MEMS wafer, having a plurality of MEMS regions for forming the MEMS chip; a MEMS chip manufacturing step for manufacturing a plurality of dam-MEMS chips by dividing a dam-MEMS wafer, which the annular dam-member is formed, into each MEMS region; a mounting step for mounting the dam-MEMS chip and the ASIC on each package region, for forming the package substrate, of a package-panel which a plurality of package regions are formed; and a gel member forming step for forming a gel member by applying gel on the annular dam-member in each package region of the package-panel and hardening of the gel.

Furthermore, in case of the above-described method of manufacturing the MEMS package, it is preferable that the annular dam-member forming step has a dam layer forming step for forming a dam layer by an ink application for applying ink according to the ink jet system, and an ink hardening for hardening the ink applied by the ink application, the dam layer forming step is performed repeatedly, thereby a laminated dam layer, which the dam layer is laminated, is formed as the annular dam-member.

Further, it is preferable that the dam layer forming step is performed so that a double-ring dam layer, having a double-ring structure constituted by an inner dam layer, which surrounds the element hole-part, and an outer dam layer, which surrounds the inner dam layer, is formed as the dam layer.

Further, the present invention provides a method of manufacturing the MEMS microphone, using a MEMS chip, an ASIC, a package substrate and cap including: an annular dam-member forming step for forming an annular dam-member having an annular structure which surrounds an element hole-part formed in each MEMS region of a MEMS wafer, having a plurality of MEMS regions for forming the MEMS chip; a MEMS chip manufacturing step for manufacturing a plurality of dam-MEMS chips by dividing a dam-MEMS wafer, which the annular dam-member is formed, into each MEMS region; a mounting step for mounting the dam-MEMS chip and the ASIC on each package region, for forming the package substrate, of a package-panel which a plurality of package regions are formed; a gel member forming step for forming a gel member by applying gel on the annular dam-member in each package region of the package-panel and hardening of the gel; and a cap mounting step for mounting the cap in each package region of the package-panel so that the cap is in contact with the gel which is applied or the gel member formed by the gel member forming step.

In case of the above-described method of manufacturing the MEMS microphone, it is preferable that the cap mounting step is performed so that a top-port cap is used as the cap, the annular dam-member forming step is performed so that a dam upper end part of the dam upper surface side of the annular dam-member is arranged inside the sound hole, the gel member forming step is performed so that the gel enters between the dam upper end part and an annular end part, which surrounds the sound hole of the top-port cap.

Furthermore, in case of the above-described method of manufacturing the MEMS microphone, it is preferable that the cap mounting step is performed so that the cap pushes the gel which is applied.

Further, it is preferable that the cap mounting step is performed so that a top-port cap is used as the cap, an annular end part, of the top-port cap, which surround the sound hole, sinks into the gel member.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

First Embodiment (Structure of the MEMS package, MEMS microphone)

To begin with, the structure of a MEMS package 1, a MEMS microphone 100, according to the first embodiment of the present invention will be explained with reference to FIG. 1 to FIG. 2.

Figure 1:
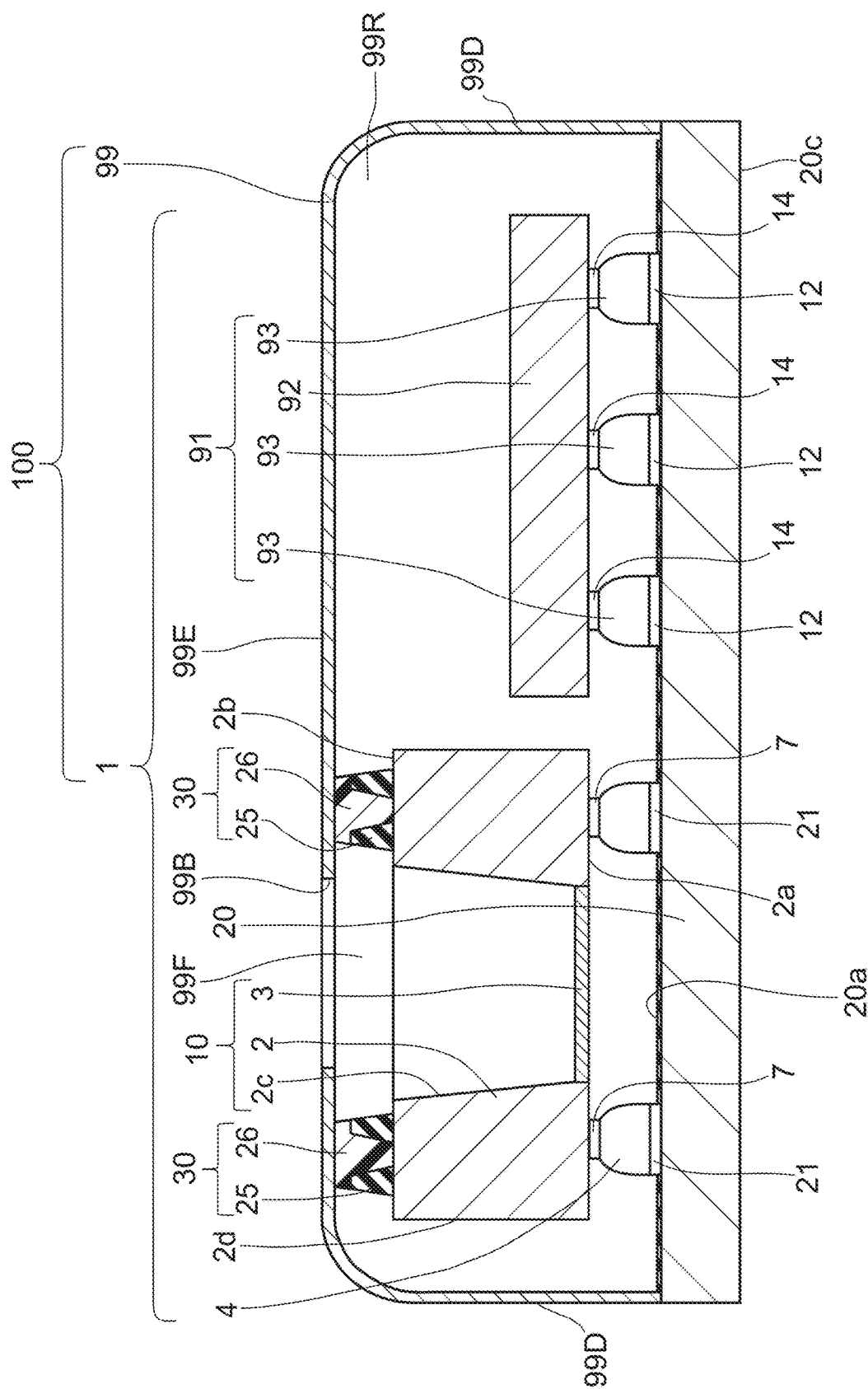
FIG. 1 is a sectional view, of a part corresponding to the line 1-1 in FIG. 2, showing a MEMS microphone according to the first embodiment of the present invention.
Figure 2:
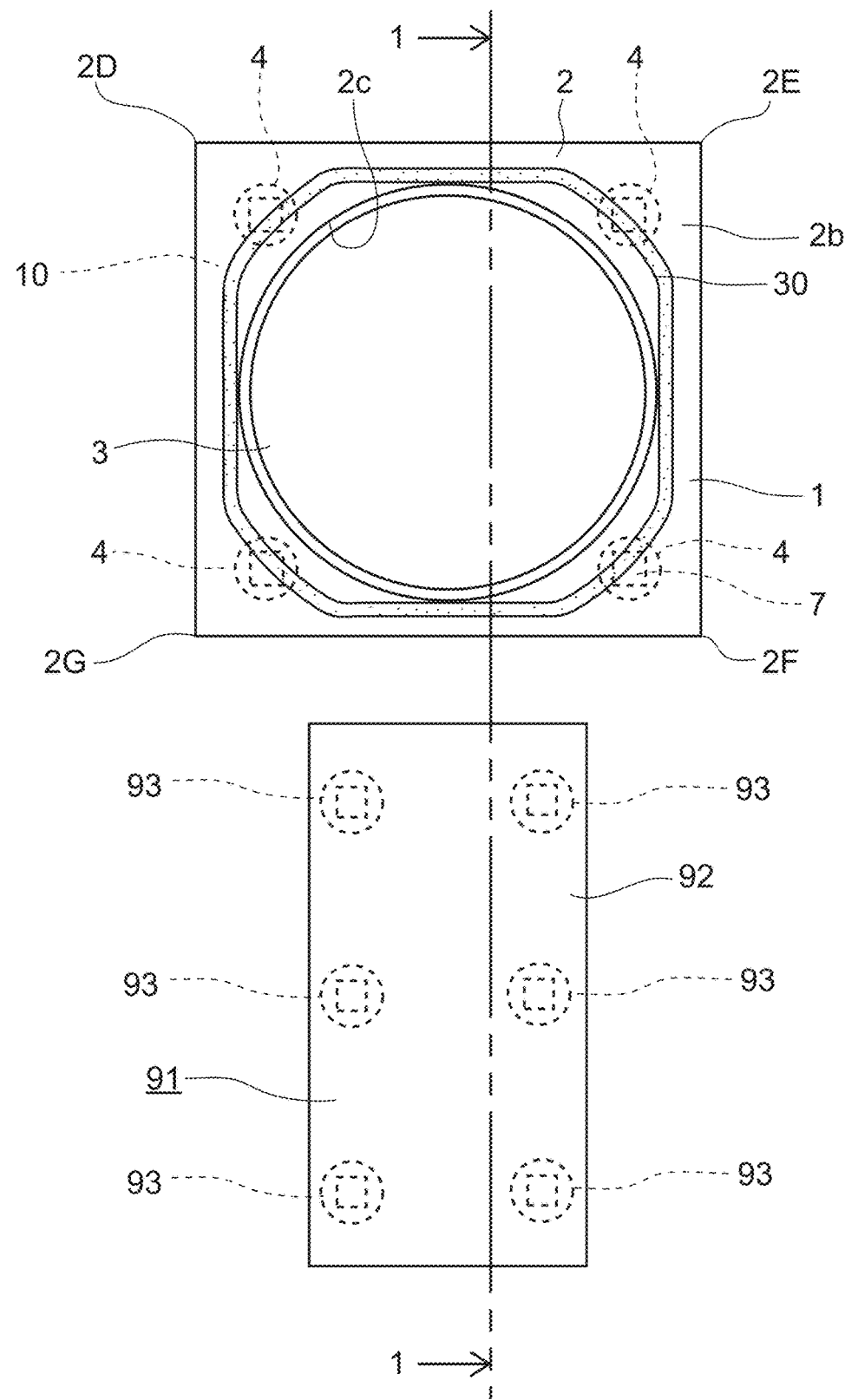
FIG. 2 is a plan view showing a principal part of a MEMS package according to the first embodiment of the present invention.

Here, FIG. 1 is a sectional view, of a part corresponding to the line 1-1 in FIG. 2, showing the MEMS microphone 100 according to the first embodiment of the present invention. FIG. 2 is a plan view showing a principal part of the MEMS package 1.

As illustrated in FIG. 1, the MEMS microphone 100 has the MEMS package 1 and a cap 99.

The MEMS package 1 has a MEMS chip 10, a package substrate 20, which the MEMS chip 10 is adhered, bonding bumps 4, a dammed-seal part 30 and an ASIC package 91. The MEMS chip 10 and an ASIC 92 are mounted on the package substrate 20 by the FCB, in the MEMS package 1.

The MEMS chip 10 has an element substrate 2 which a membrane 3, as a movable element, is formed. The MEMS chip 10 is used as the microphone of capacitance-type. The element substrate 2 is a substrate formed in a rectangular-shape in a plan view, as illustrated in FIG. 2, and it has a side surface 2d. The element substrate 2 is formed with silicon. An element hole-part 2c is formed in the center of the element substrate 2. The element hole-part 2c is formed in a cylindrical-shape from a chip surface 2b (outside surface of the element substrate 2) of the element substrate 2 to an opposing surface 2a (the surface of the element substrate 2, opposing to the package substrate 20), and the membrane 3 is arranged in the opposing surface 2a side of the element hole-part 2c. Note that two thin-films, which are called back-plates (not illustrated), are arranged in the upper side and the lower side of the membrane 3.

The membrane 3 is vibration film formed approximately in a circular-shape, and it is a thin-film made of an inorganic metal such as $SiO_2$, SiN or the like.

The bonding bumps 4 are solder bumps made of solder. As illustrated in FIG. 1, the bonding bumps 4 are adhered to both the MEMS chip 10 and the package substrate 20. Namely, the bonding bumps 4 are adhered respectively to electrode pads 7, formed in the opposing surface 2a, and electrode pads 21 formed in a package surface 20a (surface of the MEMS chip 10 side of the package substrate 20) of the package substrate 20. The bonding bumps 4 connect the MEMS chip 10 electrically and fixedly to the package substrate 20.

The package substrate 20 is a board like member made of such as silicon, ceramic or the like (or PCB: Printed Circuit Board). The electrode pads 21 and electrode pads 12 are formed on the package surface 20a of the package substrate 20. The MEMS chip 10 is mounted on the part, of the package surface 20a, which the electrode pads 21 are formed, the ASIC 92 is mounted on the part which the electrode pads 12 are formed.

In the MEMS package 1 and the MEMS microphone 100, the later-described dammed-seal part 30 is formed on the MEMS chip 10 to surround the element hole-part 2c. Further, the dammed-seal part 30 is formed by being adhered to the cap 99 to surround a sound hole 99B. The MEMS package 1 and the MEMS microphone 100 have the top-seal structure with the dammed-seal part 30.

The ASIC package 91 has the ASIC 92, and bonding bumps 93. The ASIC 92, for example, is an integral circuit which amplifies an output signal of the MEMS chip 10 (an integral circuit which outputs displacement of a capacitance as displacement of the voltage in the MEMS chip 10). Electrode pads 14 are formed lower side of the ASIC 92. The electrode pads 14 are connected to the electrode pads 12 of the package surface 20a by the bonding bumps 93.

The cap 99 covers the MEMS package 1. The cap 99 is adhered to the package surface 20a with not illustrated adhesive (or by soldering). The MEMS package 1 is accommodated inside the cap 99.

The cap 99 has a top surface 99E and a cap side-surface 99D. The top surface 99E is a part which is formed so as to oppose to the package substrate 20. The sound hole 99B, having a circular form, is formed in the top surface 99E. The cap side-surface 99D is a part which is formed on the peripheral part of the top surface 99E. The cap side-surface 99D surrounds the top surface 99E, and it is adhered to the package substrate 20. Because the sound hole 99B is formed in the cap 99, the cap 99 corresponds to a top-port cap in the present invention.

(Dammed-Seal Part)

Figure 3:
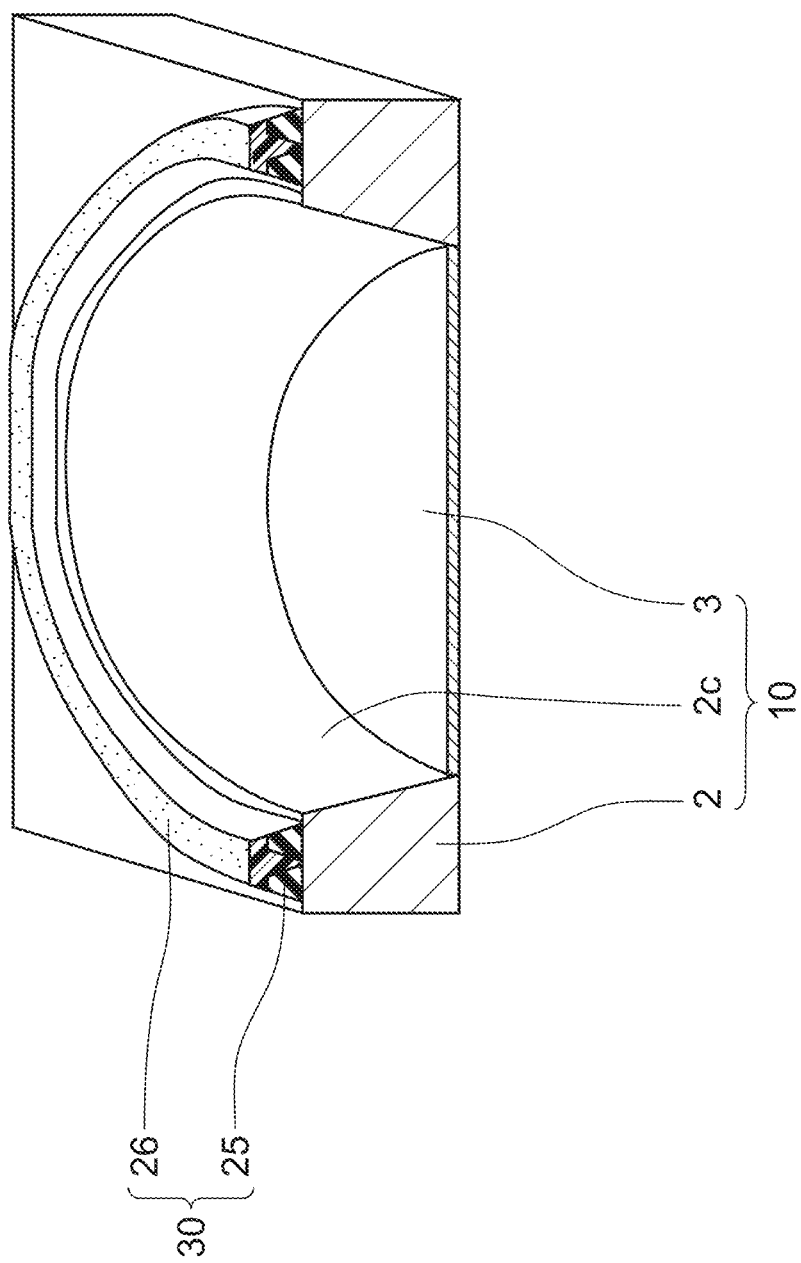
FIG. 3 is a perspective view showing a MEMS chip and a dammed-seal part, taken along the line 1-1 in FIG. 2.
Figure 4:
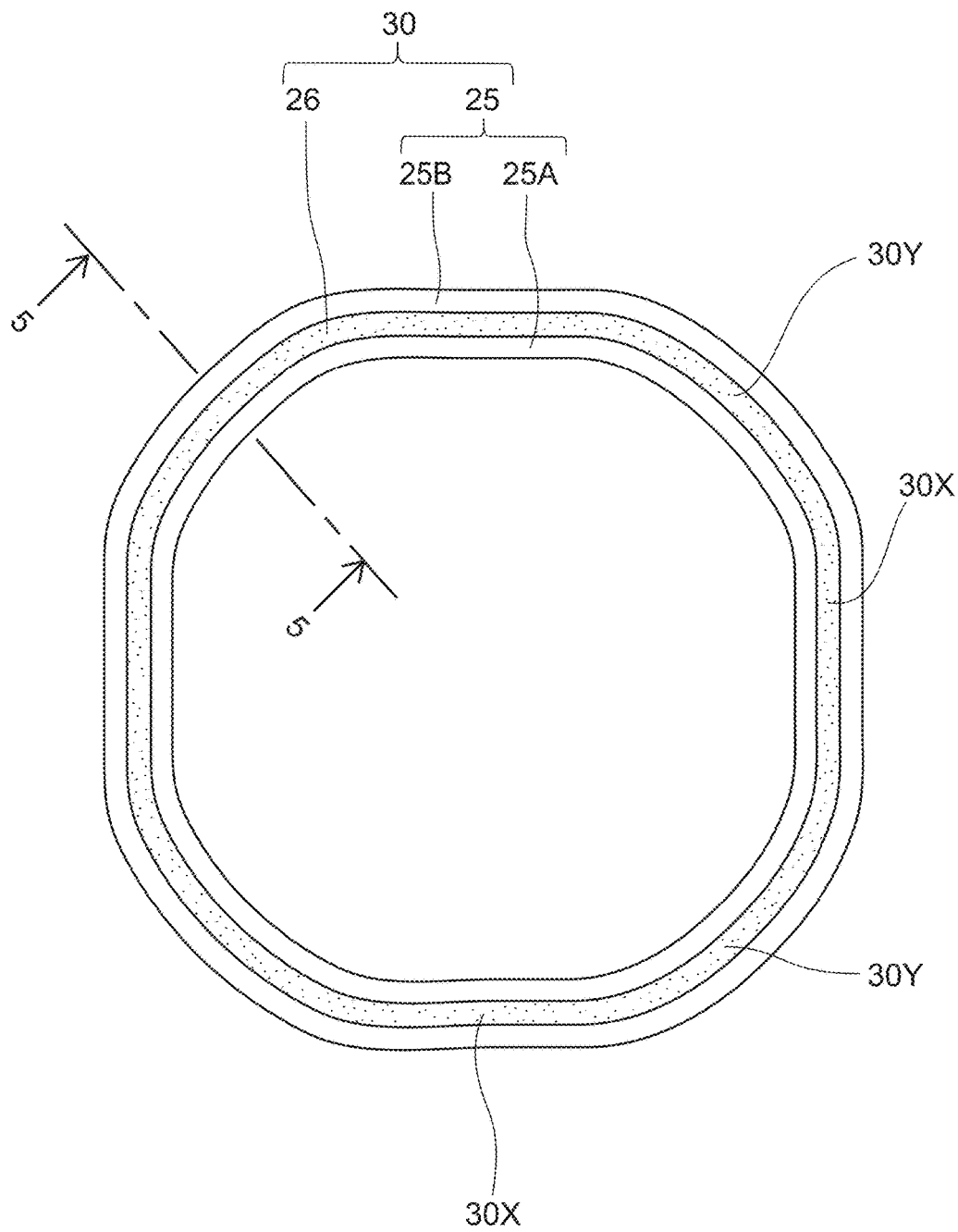
FIG. 4 is a plan view showing the dammed-seal part of the MEMS microphone according to the first embodiment of the present invention.
Figure 5:
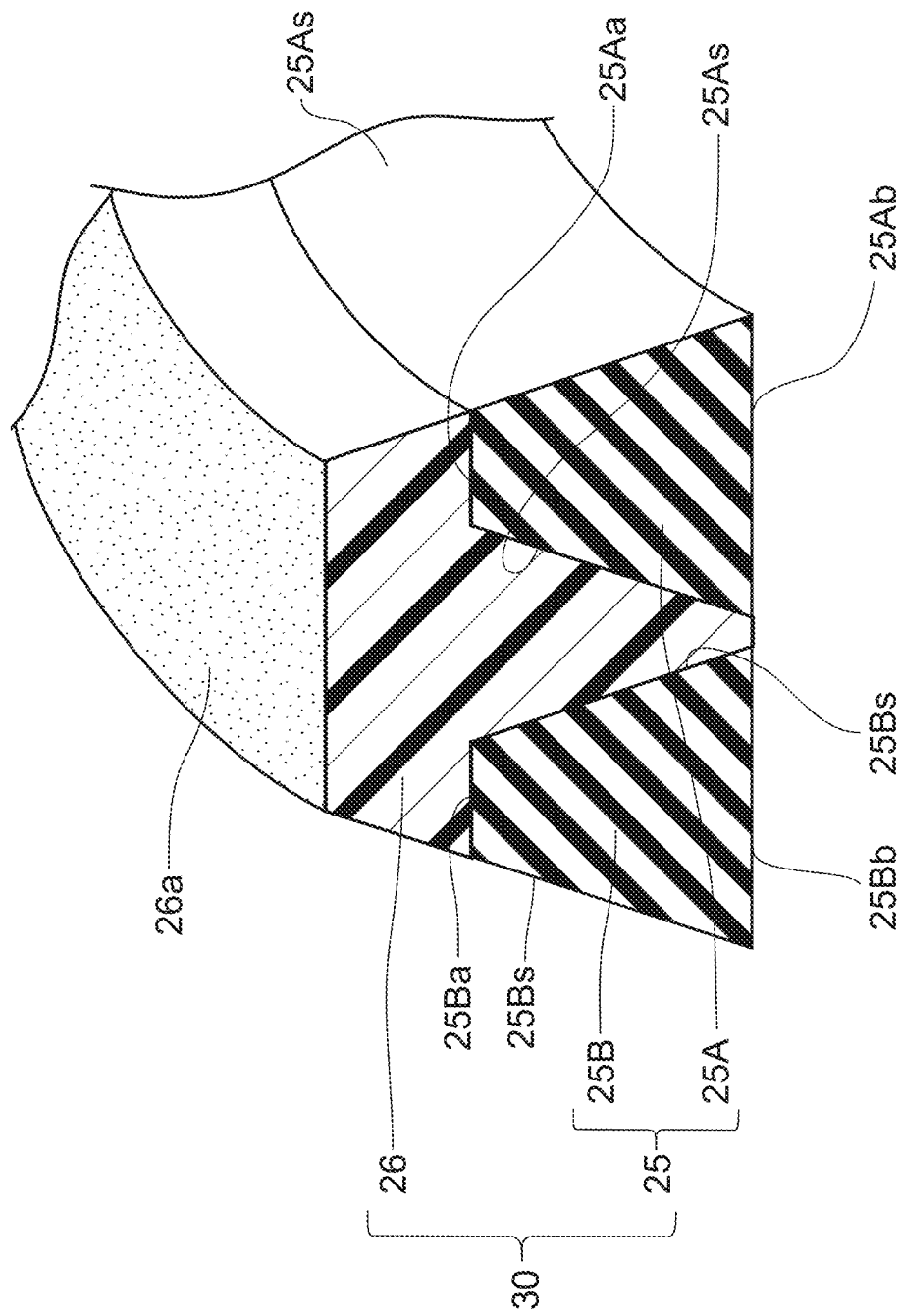
FIG. 5 is a perspective view, partially omitted, showing the dammed-seal part, taken along the line 5-5 in FIG. 4.
Figure 6:
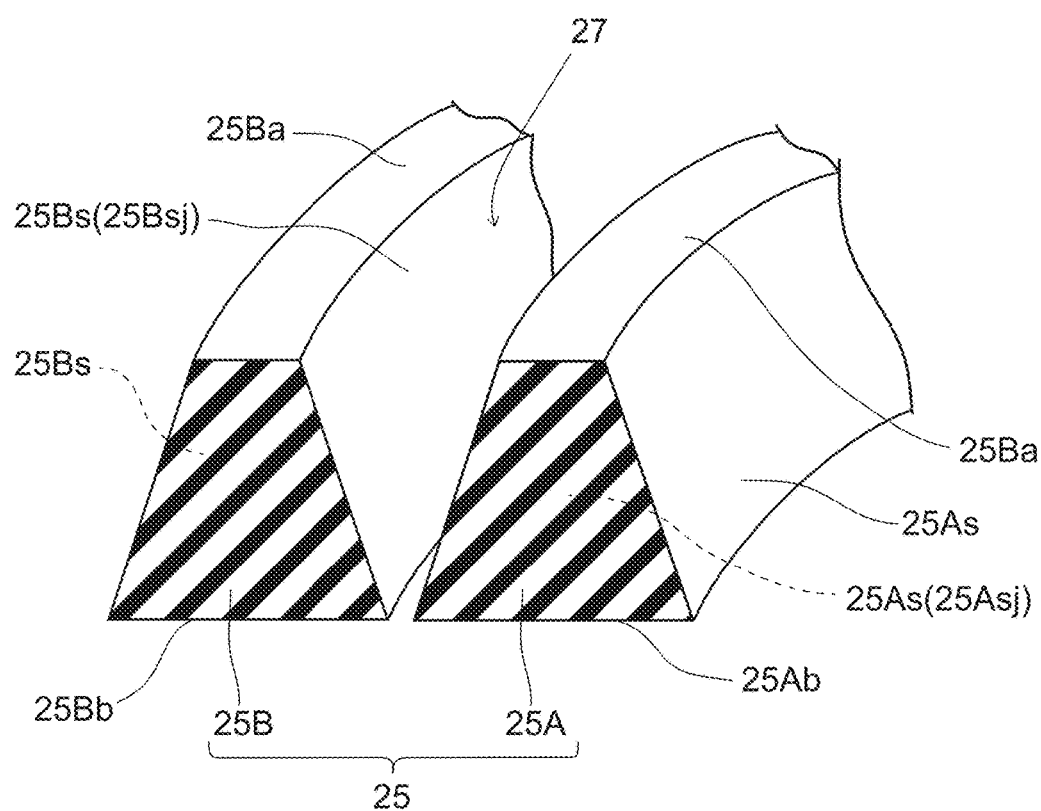
FIG. 6 is a perspective view showing an annular dam-member constituting the dammed-seal part, corresponding to FIG. 5.
Figure 15:
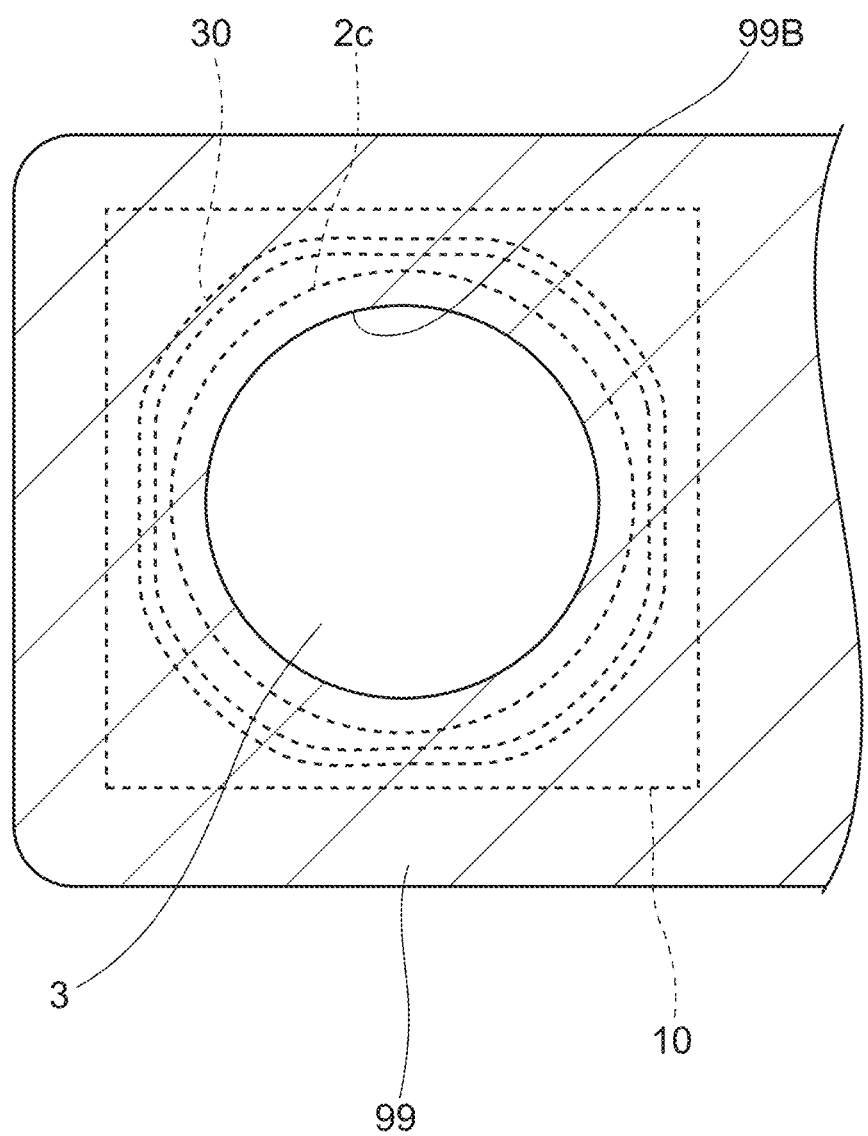
FIG. 15 is a plan view showing a principal part, including a sound hole, of a cap of the MEMS microphone according to the first embodiment of the present invention.

Subsequently, the dammed-seal part 30 will be explained with reference to FIG. 3 to FIG. 6, FIG. 15. Here, FIG. 3 is a perspective view showing the MEMS chip 10 and the dammed-seal part 30, taken along the line 1-1 in FIG. 2. FIG. 4 is a plan view showing the dammed-seal part 30, FIG. 5 is a perspective view, partially omitted, showing the dammed-seal part 30, taken along the line 5-5 in FIG. 4. FIG. 6 is a perspective view, showing an annular dam-member 25 constituting the dammed-seal part 30, corresponding to FIG. 5. FIG. 15 is a plan view showing a principal part, including the sound hole 99B, of the cap 99.

The dammed-seal part 30 has an annular structure, which surrounds the whole of the element hole-part 2c, as also illustrated in FIG. 2. Further, a later-described gel member 26 of the dammed-seal part 30 is adhered to the cap 99, thereby a front volume (also called front chamber) 99F is formed in the part from the sound hole 99B to the membrane 3 of the MEMS chip 10.

The dammed-seal part 30 has a plurality of (four, in FIG. 4) straight parts 30X and curved parts 30Y. The dammed-seal part 30 has an annular structure, which the straight parts 30X and the curved parts 30Y are connected alternately, and which circular shape and octagonal shape are combined in a plan view (also called circular-octagonal structure).

Then, as illustrated in FIG. 4, FIG. 5 in detail, the dammed-seal part 30 has an annular dam-member 25 and the gel member 26.

The annular dam-member 25 is formed on the chip surface 2b so as to surround the whole of the element hole-part 2c.

The annular dam-member 25 has an inner dam-member 25A and an outer dam-member 25B. The annular dam-member 25 has a double-ring structure constituted by the inner dam-member 25A and the outer dam-member 25B.

The inner dam-member 25A is formed on the neighborhood of the element hole-part 2c so as to surround the whole of the element hole-part 2c. The outer dam-member 25B is formed on the neighborhood of the inner dam-member 25A so as to surround the whole of the inner dam-member 25A.

As illustrated in FIG. 5, FIG. 6, the inner dam-member 25A has a dam upper surface 25Aa, which is along with the chip surface 2b, a dam bottom surface 25Ab, which is in contact with the chip surface 2b, a pair of dam slopes 25As, which connects the dam upper surface 25Aa and the dam bottom surface 25Ab. Then, the inner dam-member 25A has a variable width structure in which the width (the width means a width along with the chip surface) gradually increases toward the dam bottom surface 25Ab from the dam upper surface 25Aa.

Further, the outer dam-member 25B has a dam upper surface 25Ba, which is along with the chip surface 2b, a dam bottom surface 25Bb, which is in contact with the chip surface 2b, a pair of dam slopes 25Bs, which connects the dam upper surface 25Ba and the dam bottom surface 25Bb. Then, the outer dam-member 25B has a variable width structure in which the width gradually increases toward the dam bottom surface 25Bb from the dam upper surface 25Ba.

Then, as illustrated in FIG. 6, an annular groove-part 27 is secured between the inner dam-member 25A and the outer dam-member 25B. The annular groove-part 27 is a groove part, having a V-figure shape in a sectional view, which was surrounded with an opposing dam slope 25Asj of the inner dam-member 25A and an opposing dam slope 25Bsj of the outer dam-member 25B.

The opposing dam slope 25Asj is the inside dam slope 25As, opposing to the outer dam-member 25B. The opposing dam slope 25Bsj is the inside dam slope 25Bs, opposing to the inner dam-member 25A.

The gel member 26 is a member formed by hardening of gel which is applied on the annular dam-member 25. Gel is obtained by a hardening of colloidal solution into semisolid or solid. As described later, gel, having fluidity, is applied on the annular dam-member 25 in a step of manufacturing the MEMS package 1. After that, the gel becomes solid condition by fluidity loss caused by hardening, thereby the gel member 26 is formed.

The gel member 26 is in contact with both the dam upper surface 25Aa of the inner dam-member 25A and the dam upper surface 25Ba of the outer dam-member 25B. Further, the gel member 26 enters the annular groove-part 27, and the gel member 26 is in contact with the opposing dam slope 25Asj and the opposing dam slope 25Bsj. The inner dam-member 25A and the outer dam-member 25B have fixed structures which their forms do not change. The gel member 26 is in contact with the inner dam-member 25A and the outer dam-member 25B, as described-above, and it is supported by them, thereby the gel member 26 is formed.

The gel member 26 has a gel surface 26a. The gel surface 26a is an outer surface, of the gel member 26, along with the chip surface 2b. The gel surface 26a is adhered to the top surface 99E of the cap 99 so as to surround the whole of the sound hole 99B.

As illustrated in FIG. 15, concerning the sound hole 99B, the element hole-part 2c and the dammed-seal part 30, the element hole-part 2c is arranged outside the sound hole 99B, further the dammed-seal part 30 is arranged outside the element hole-part 2c.

Then, as illustrated in detail in FIG. 1, in the MEMS microphone 100, the above-described front volume 99F and a back volume (also called back chamber) 99R are formed inside the cap 99. The front volume 99F is a space which is surrounded with the dammed-seal part 30, the element hole-part 2c and the membrane 3. The back volume 99R is a space which is surrounded with the membrane 3, the cap 99 and the package substrate 20.

(Method of Manufacturing the MEMS Package 1, MEMS Microphone 100)

Figure 7:
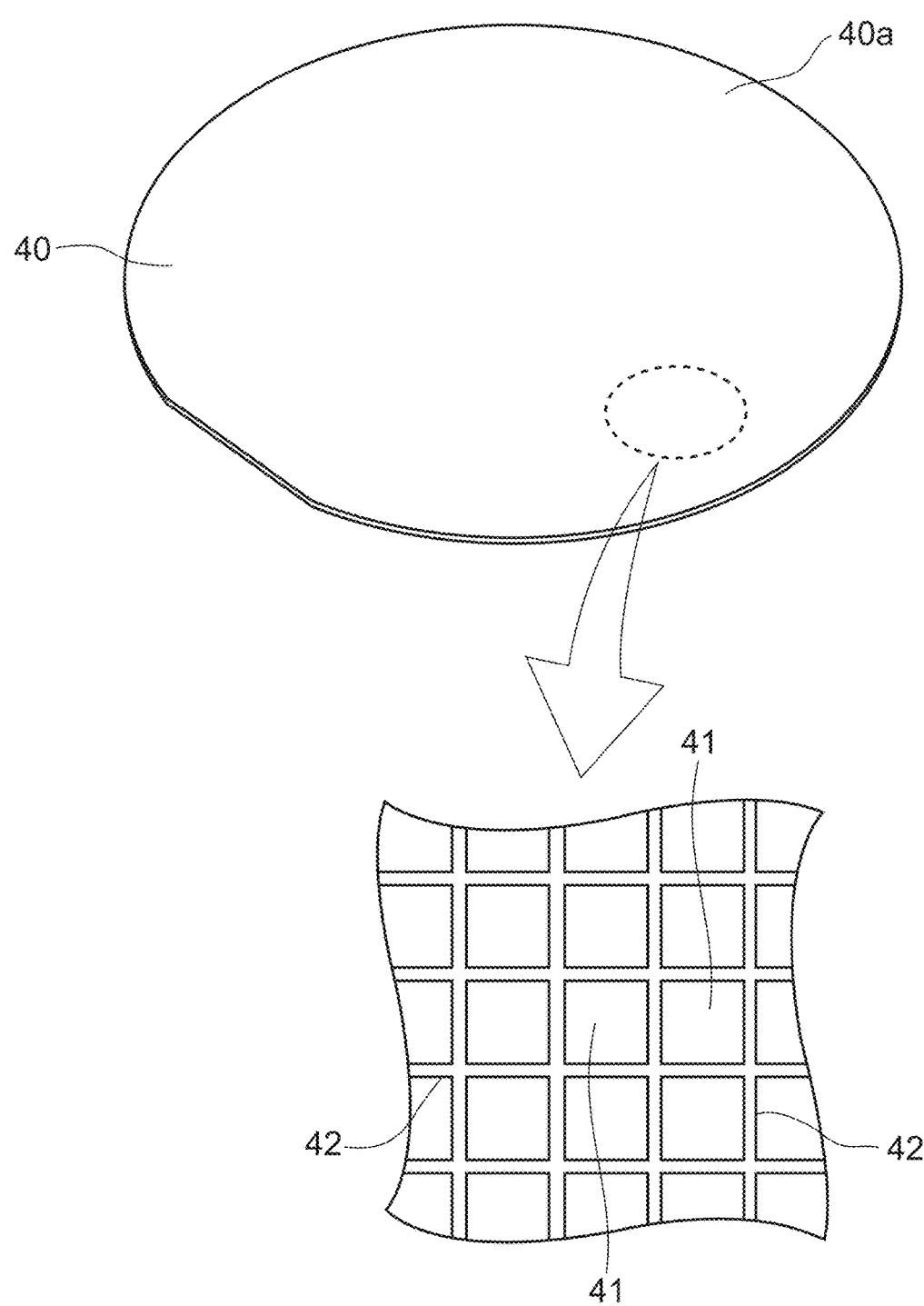
FIG. 7 is a perspective view showing a MEMS wafer used for manufacturing method according to the first embodiment of the present invention.
Figure 8:
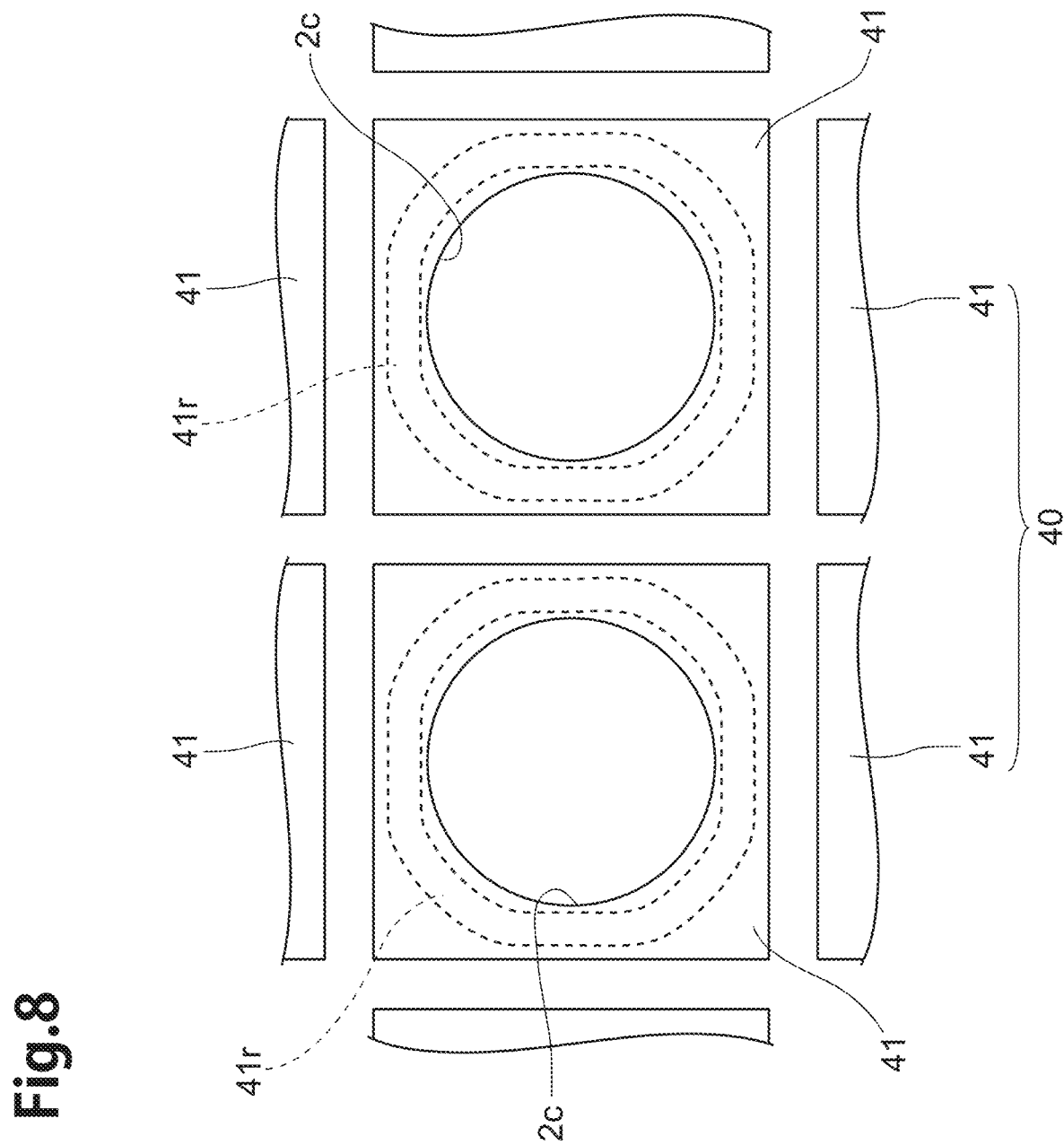
FIG. 8 is a plan view showing a principal part of the MEMS wafer with enlargement.
Figure 9:
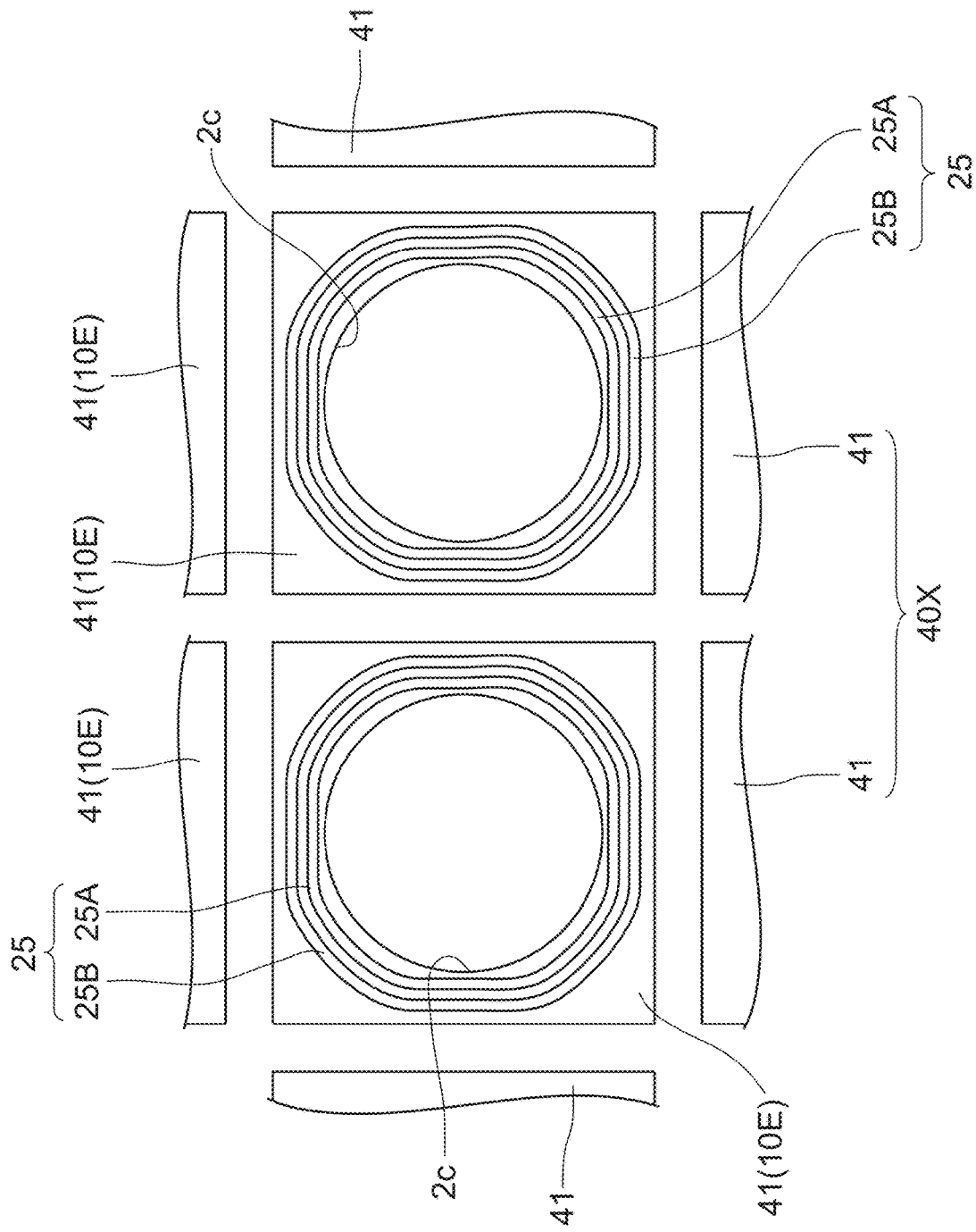
FIG. 9 is a plan view showing the manufacturing step of the MEMS package according to the first embodiment of the present invention, corresponding to FIG. 8.
Figure 10:
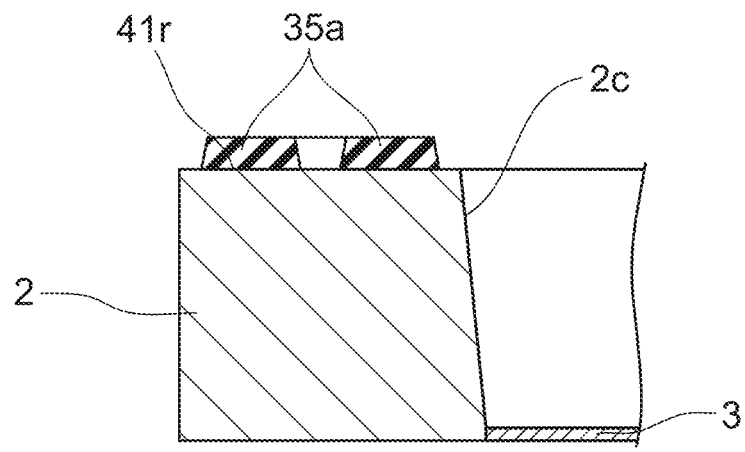
FIG. 10 (*a*) is a sectional view, partially omitted, showing a dam layer forming step, FIG. 10 (*b*) is a sectional view, partially omitted, showing the manufacturing step subsequent to that in FIG. 10 (*a*), FIG. 10 (*c*) is a sectional view, partially omitted, showing the manufacturing step subsequent to that in FIG. 10 (*b*)
Figure 10:
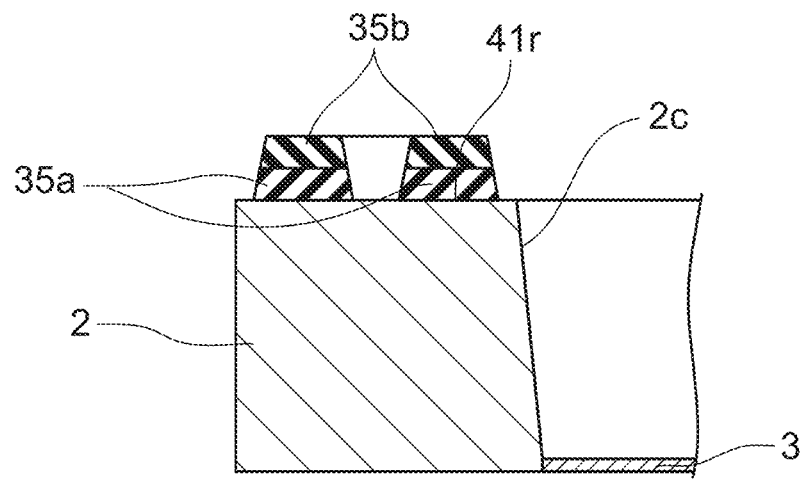
Figure 10:
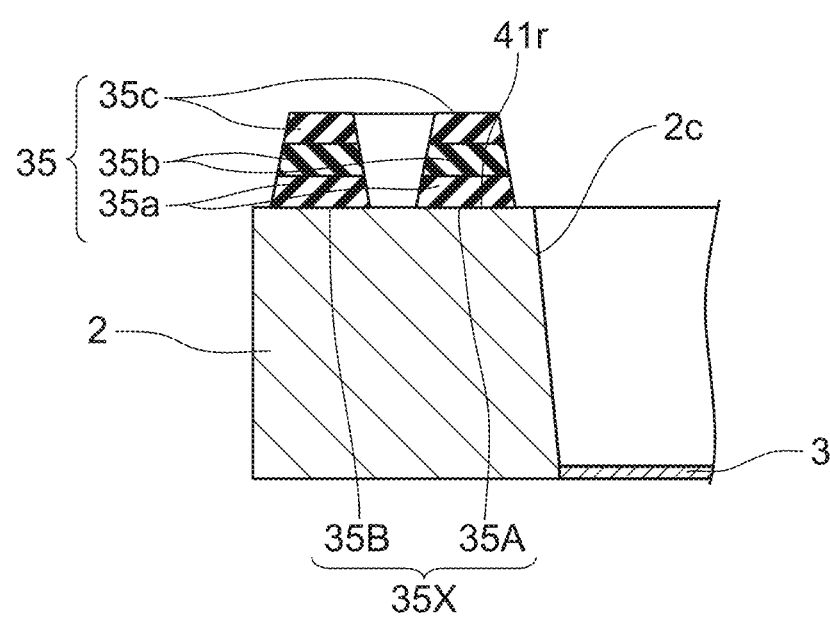
Figure 11:
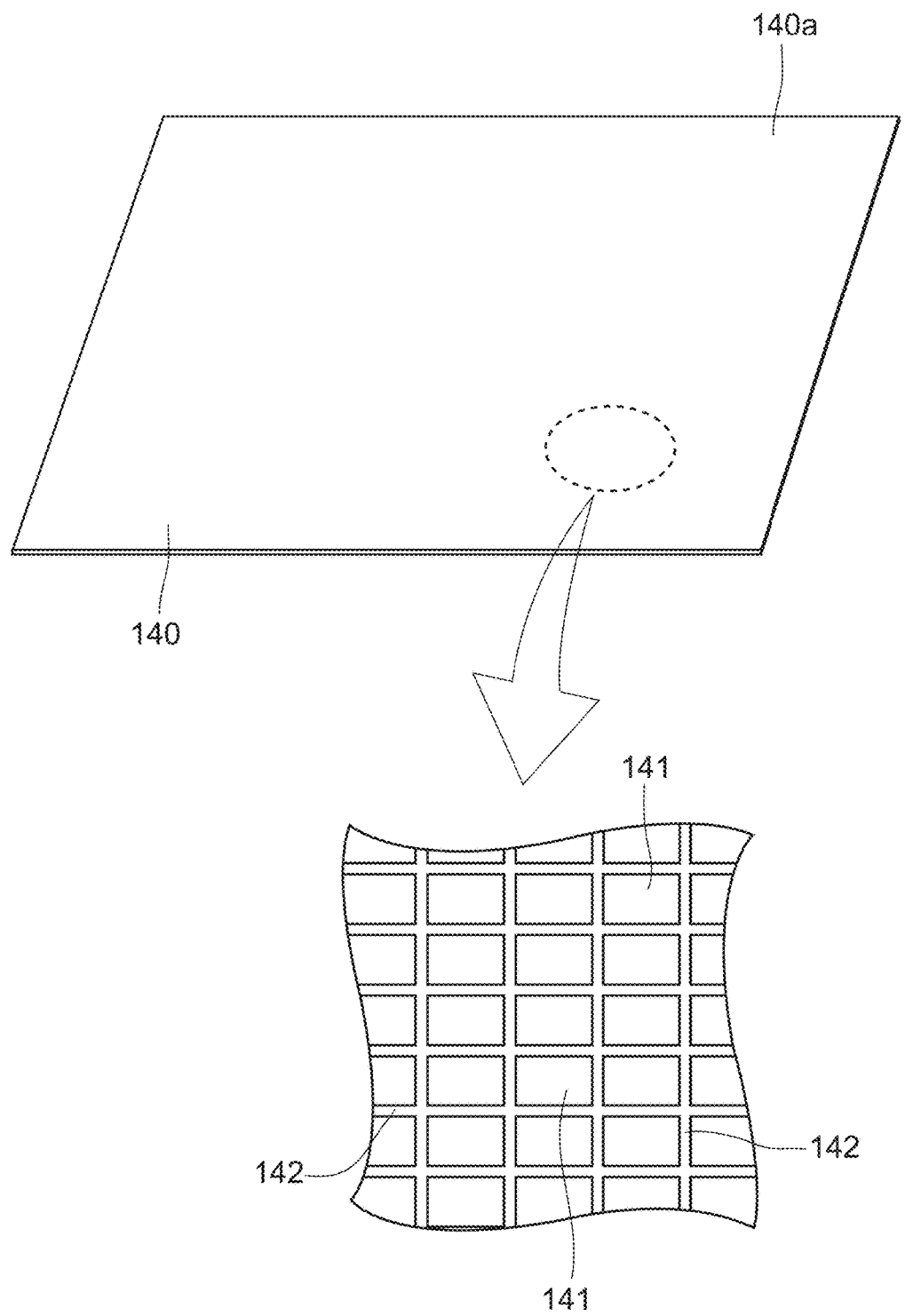
FIG. 11 is a perspective view showing a package-panel used for manufacturing method according to the first embodiment of the present invention.
Figure 12:
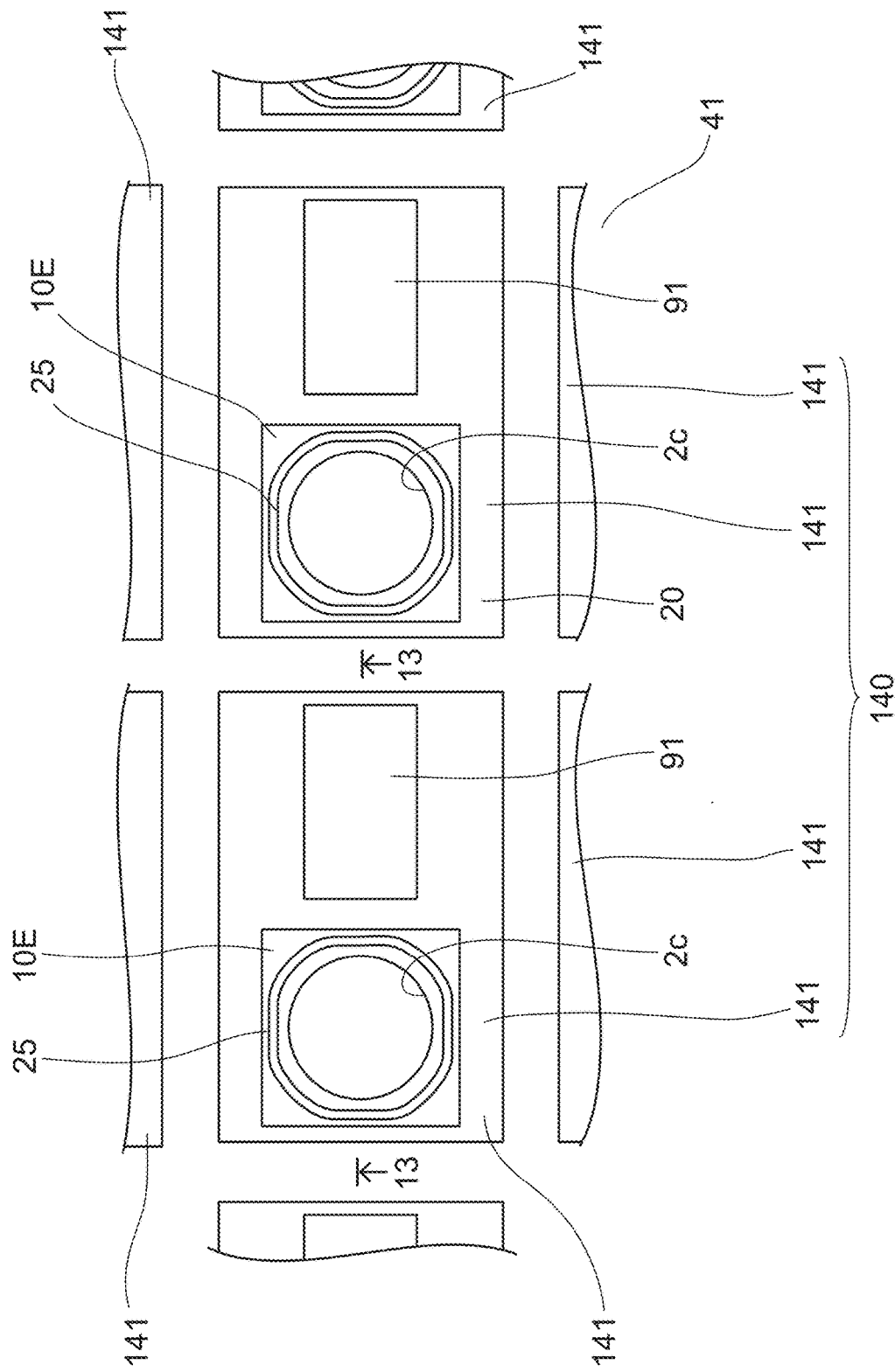
FIG. 12 is a plan view showing the manufacturing step subsequent to that in FIG. 9, showing a principal part in FIG. 11 with enlargement.
Figure 13:
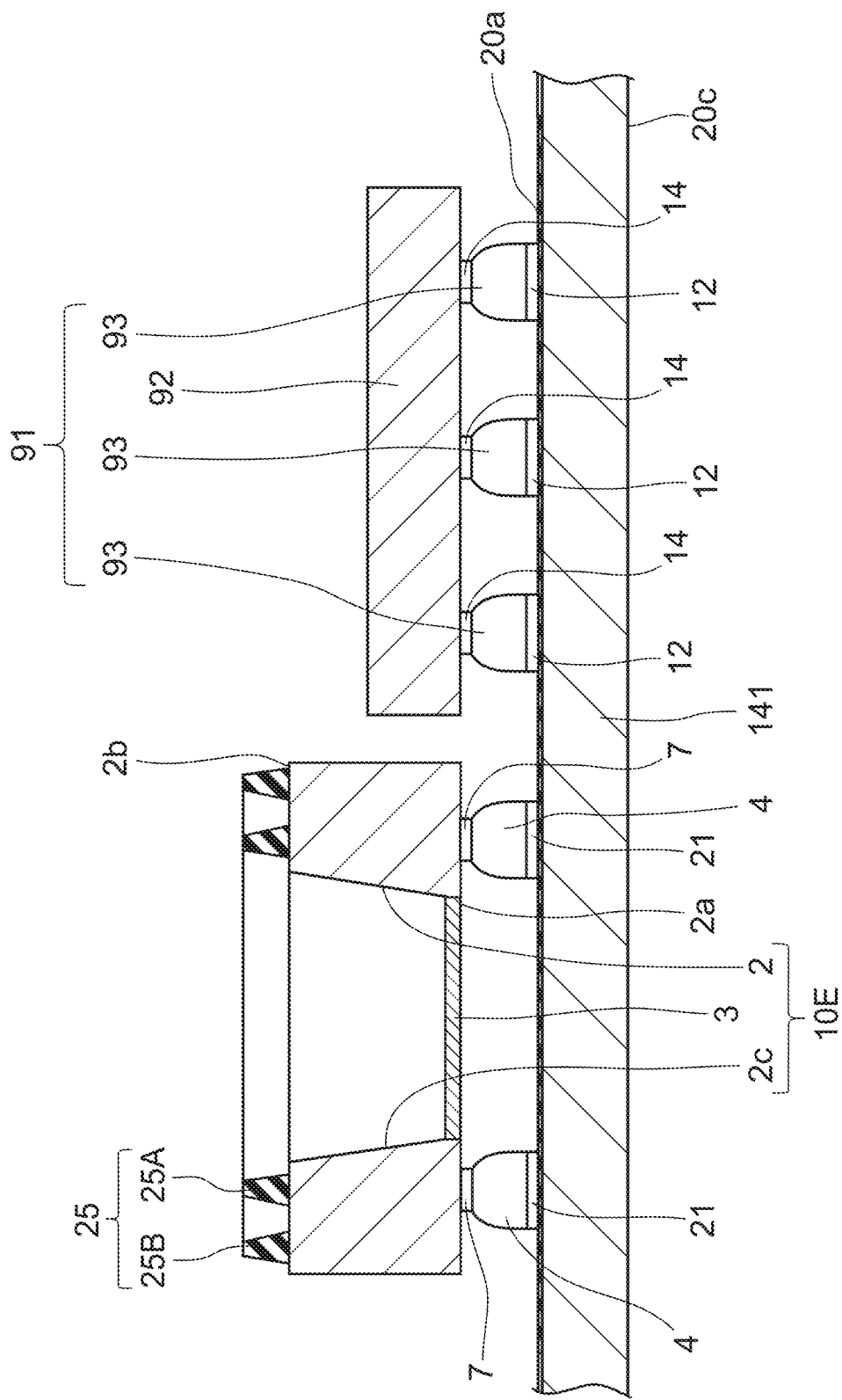
FIG. 13 is a sectional view, taken along the line 13-13 in FIG. 12, showing the manufacturing step subsequent to that in FIG. 9.
Figure 14:
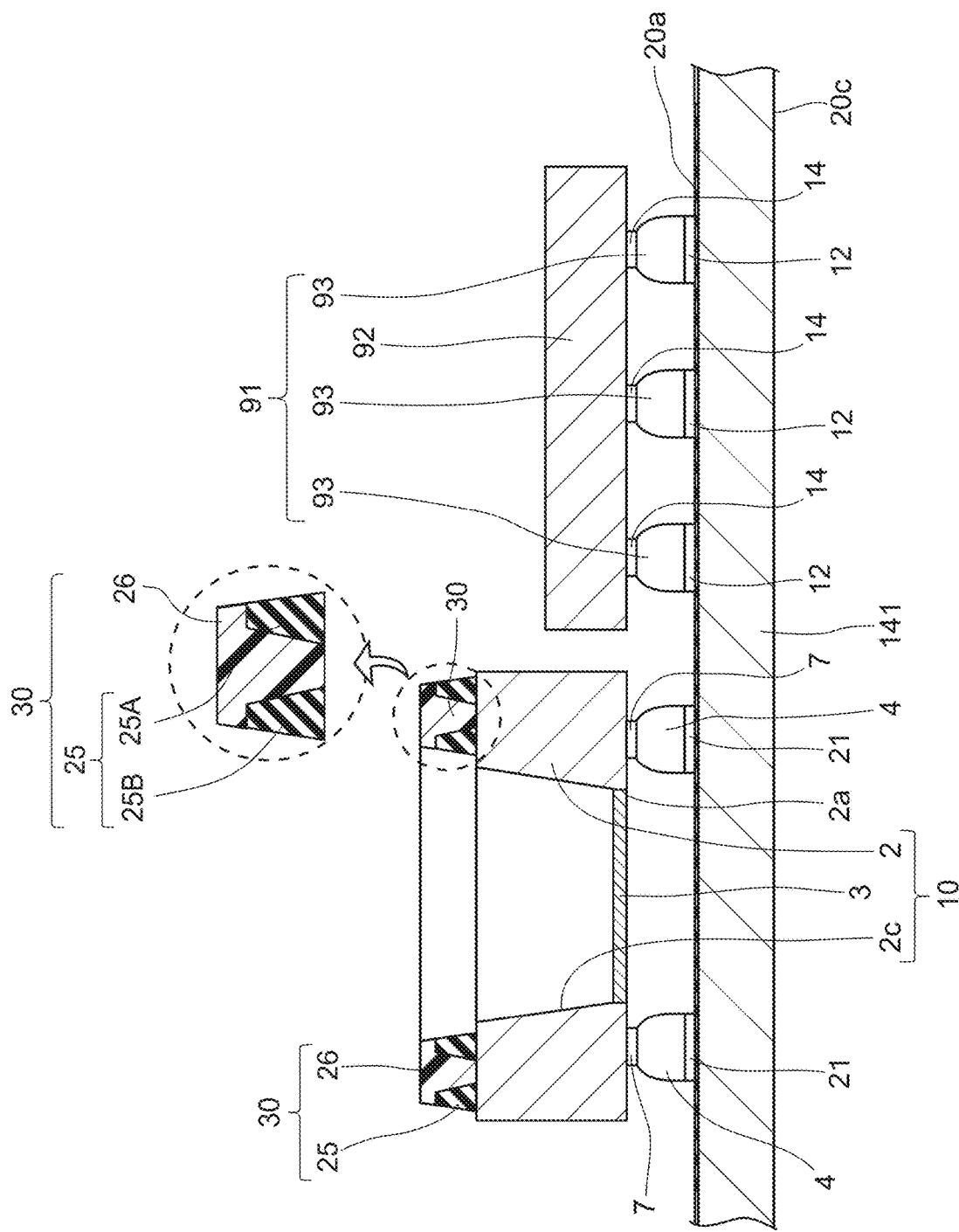
FIG. 14 is a sectional view, corresponding to FIG. 13, showing the manufacturing step subsequent to that in FIG. 13.

Subsequently, the method of manufacturing the MEMS package 1 and the MEMS microphone 100, having the above-described structures, will be explained with reference to FIG. 7 to FIG. 14. Here, FIG. 7 is a perspective view showing a MEMS wafer 40, FIG. 8 is a plan view showing the principal part of the MEMS wafer 40 with enlargement. FIG. 9 is a plan view showing the manufacturing step of the MEMS package 1, corresponding to FIG. 8. FIGS. 10 (a), (b), (c) are sectional views, partially omitted, showing a dam layer forming step, FIG. 11 is a perspective view showing a package-panel 140. FIG. 12 is a plan view showing the manufacturing step subsequent to that in FIG. 9, showing a principal part in FIG. 11 with enlargement. FIGS. 13, 14 are sectional views, taken along the line 13-13 in FIG. 12, showing the manufacturing step subsequent to that in FIG. 9.

In the Method of manufacturing the MEMS package 1, the Method of manufacturing the MEMS microphone 100, the above-described MEMS chip 10, the ASIC 92 and the package substrate 20 which the MEMS chip 10 and the ASIC 92 are adhered. The MEMS chip 10 is manufactured with the MEMS wafer 40, illustrated in FIG. 7. Further, the package substrate 20 is manufactured with the package-panel 140, illustrated in FIG. 11.

The MEMS wafer 40 is formed with a semiconductor wafer. As illustrated in FIG. 7, a plurality of MEMS regions 41 are formed on the MEMS wafer 40 by a uniform arrangement. The element hole-parts 2c and the membranes 3 are formed on the respective MEMS regions 41. When the MEMS wafer 40 is divided along with scribe lines 42, the MEMS chip 10 is formed from each of the MEMS regions 41 (about 10,000-20,000 MEMS chips 10 are formed by every wafer).

As illustrated in FIG. 11, the package-panel 140 is a board-like member, having rectangular shape, made of PCB or ceramic, and a plurality of package regions 141 are formed on the surface 140a by a uniform arrangement. When the package-panel 140 is divided along with divided lines 142, the package substrate 20 is manufactured from each of the package regions 141 (about 600 package substrates 20 are manufactured by every package-panel 140).

Then, an annular dam-member forming step, a MEMS chip manufacturing step, a mounting step, a gel member forming step and a panel cutting step are included in the method of manufacturing the MEMS package 1, the method of manufacturing the MEMS microphone 100. At first, the annular dam-member forming step is performed. A cap mounting step is further included in the method of manufacturing the MEMS microphone 100.

(Annular Dam-Member Forming Step)

In the annular dam-member forming step, the above-described annular dam-members 25 are formed. The annular dam-members 25 are formed on dam expected areas 41r of the respective MEMS regions 41, about the MEMS wafer 40. As illustrated in FIG. 8, the dam expected areas 41r are an annular area (illustrated with broken line in FIG. 8) surrounding the whole of the element hole-part 2c. The dam expected areas 41r are secured in the respective MEMS regions 41. The dam expected areas 41r have the circular-octagonal structure in a plan view, similar with the dammed-seal part 30.

A dam layer forming step is included in the annular dam-member forming step. In the dam layer forming step, a dam layer is formed by an ink application and an ink hardening. In the ink application, ink is applied on the wafer (MEMS wafer 40, in this embodiment) by the ink jet system. In the ink hardening, ink, applied by the ink application, is hardened.

Figure 33:
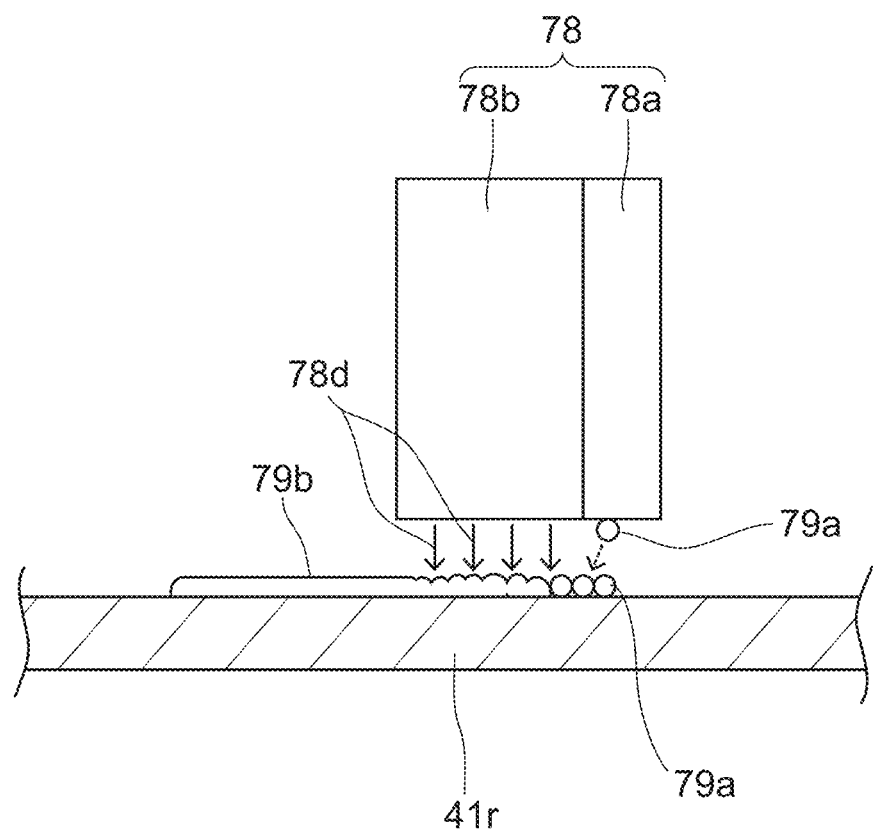
FIG. 33 is a side view showing a dam layer forming step using a printing hardening device.

In the dam layer forming step, for example, the dam layer is formed on the dam expected area 41r using a printing hardening device 78, illustrated in FIG. 33. The printing hardening device 78 has a printing head 78a and a light irradiation device 78b.

Then, when the printing hardening device 78 is used, minute ink drops 79a are discharged from the printing head 78a, and they are applied on the dam expected area 41r. Further, UV light irradiation 78d, by the light irradiation device 78b, is performed, works with the application of the ink drops 79a. Then, hardening the ink drops 79a is performed, thereby a hardened ink layer 79b is formed on the dam expected area 41r. The dam layer is formed from the hardened ink layer 79b.

In the Method of manufacturing the MEMS package 1, the Method of manufacturing the MEMS microphone 100, the above-described dam layer forming step is performed repeatedly, thereby a laminated dam layer is formed. The laminated dam layer is formed by laminating the dam layer.

The dam layer is formed by the above-described ink application and the ink hardening, after that the ink application and the ink hardening are performed again. Thereby another dam layer is formed on the dam layer which has been formed. Thereby, the laminated dam layer is formed.

For example, as illustrated in FIG. 10(*a*), at first, the dam layer 35a is formed on the dam expected area 41r, by the first dam layer forming step. Subsequently, as illustrated in FIG. 10(*b*), another dam layer 35b is formed on the dam layer 35a, which is already formed on the dam expected area 41r, by the second dam layer forming step. Further, as illustrated in FIG. 10(*c*), still another dam layer 35c is formed on the dam layer 35b, which is already formed on the dam expected area 41r, by the third dam layer forming step. In this way, the laminated dam layer 35 is formed by laminating the dam layers 35a, 35b, 35c.

In the Method of manufacturing the MEMS package 1, the Method of manufacturing the MEMS microphone 100, the above-described laminated dam layer 35 is formed, as the annular dam-member 25. Because the above-described laminated dam layer 35 is formed as the annular dam-member 25, the annular dam-member 25 is formed in the predetermined thickness.

Further, in the dam layer forming step, as illustrated in FIGS. 10(*a*), (*b*), (*c*), the dam layers 35a, 35b, 35c, having the double-ring structure, are formed, thereby a double-ring dam layer 35X is formed. The double-ring dam layer 35X corresponds to the annular dam-member 25. The dam layers 35a, 35b, 35c have respectively an inner dam layer 35A, an outer dam layer 35B.

As described above, the annular dam-member forming step is performed, thereby, as illustrated in FIG. 9, FIG. 13, the annular dam-members 25 are formed in the respective MEMS regions 41. Then, a dam-MEMS wafer 40X, which the annular dam-members 25 are formed in the MEMS regions 41, is manufactured.

(MEMS Chip Manufacturing Step)

Subsequently, the MEMS chip manufacturing step is performed. In the MEMS chip manufacturing step, the dam-MEMS wafer 40X is divided along with the scribe lines 42, thereby the dam-MEMS wafer 40x is cut into the respective MEMS regions 41. A dam-MEMS chip 10E is manufactured from each of the MEMS regions 41 (see FIG. 9 about dam-MEMS chip 10E).

(Mounting Step)

Next, the mounting step is performed. In the mounting step, as illustrated in FIG. 12, FIG. 13, the dam-MEMS chips 10E and ASICs 91 are mounted by FCB on the respective package regions 141 of the package-panel 140.

(Gel Member Forming Step)

Subsequently, the gel member forming step is performed. In the gel member forming step, the gel members 26 are formed.

Figure 34:
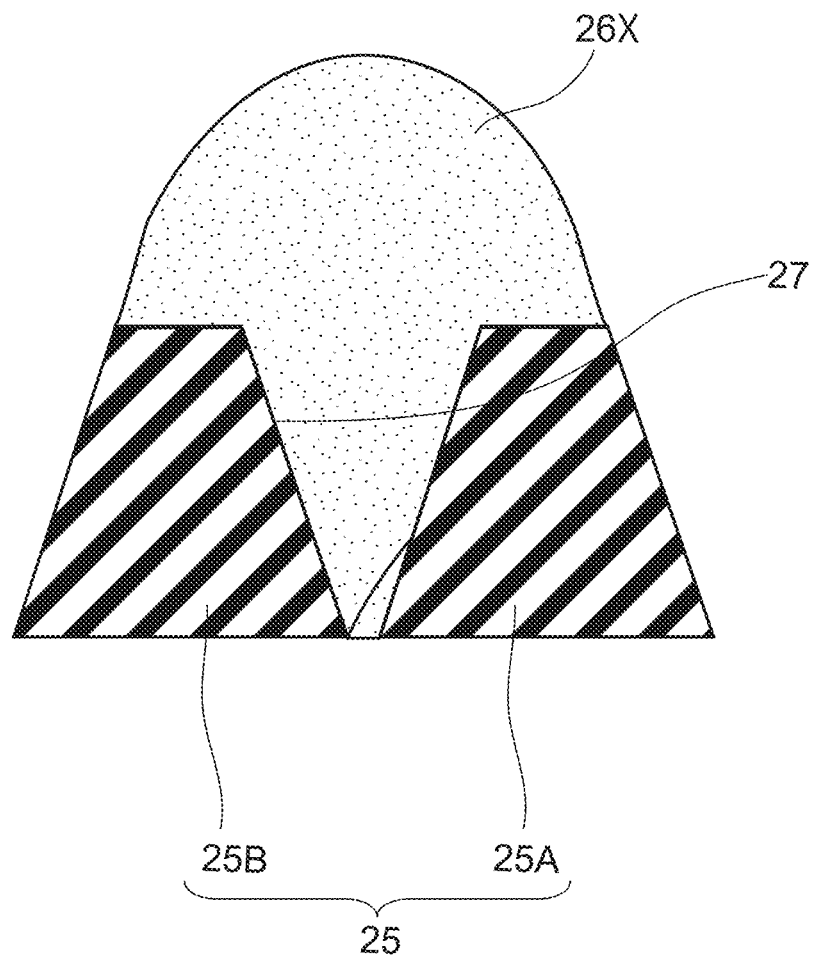
FIG. 34 is a sectional view showing the case which gel, applied on the annular dam-member, has a curved surface.

The annular dam-members 25 are formed on the dam-MEMS chips 10E. Therefore, the annular groove-parts 27 are formed between the inner dam-members 25A and the outer dam-members 25B of the annular dam-member 25, in the respective package regions 141. Therefore, in the gel member forming step, as illustrated in FIG. 34, gels 26X, of the predetermined amount, are applied so that the gels 26X enter the annular groove-parts 27, and they also remain on the inner dam-members 25A and the outer dam-members 25B. The gels 26X have fluidity at the time of being applied. However, because the inner dam-members 25A and the outer dam-members 25B are formed so as to surround the annular groove-part 27 from both horizontal direction sides, the gel 26X is cooped up in the annular groove-parts 27 so as not to move. After that, when the applied gels 26X are hardened by heating, UV light irradiation or the like, as illustrated in FIG. 14, the gel members 26 are formed.

(Cap Mounting Step)

After that, the cap mounting step is performed. In the cap mounting step, the caps 99 are mounted on the respective package regions 141 of the package-panel 140. The gel-members 26 are formed on the dam-MEMS chips 10E, mounted on the respective package regions 141, thereby as illustrated in FIG. 14, the dammed-seal parts 30 are formed on the MEMS chips 10. In the cap mounting step, the caps 99 are mounted so that the top surfaces 99E of the respective caps 99 are in contact with the gel members 26 of the dammed-seal parts 30.

At this time, when surface forms of gel are not plane forms according to the top surfaces 99E, like the above-described gels 26X, the caps 99 are mounted so that the top surfaces 99E are in contact with the gels 26X before the gels 26X lose fluidity. Thereby, the surface forms of the gels 26X change from curved surfaces to plane surfaces, in accordance with the top surfaces 99E. After that, the gel members 26 are formed at the time of fluidity lose by hardening. Therefore, the gel members 26 are in closely contact with the top surfaces 99E.

Figure 35:
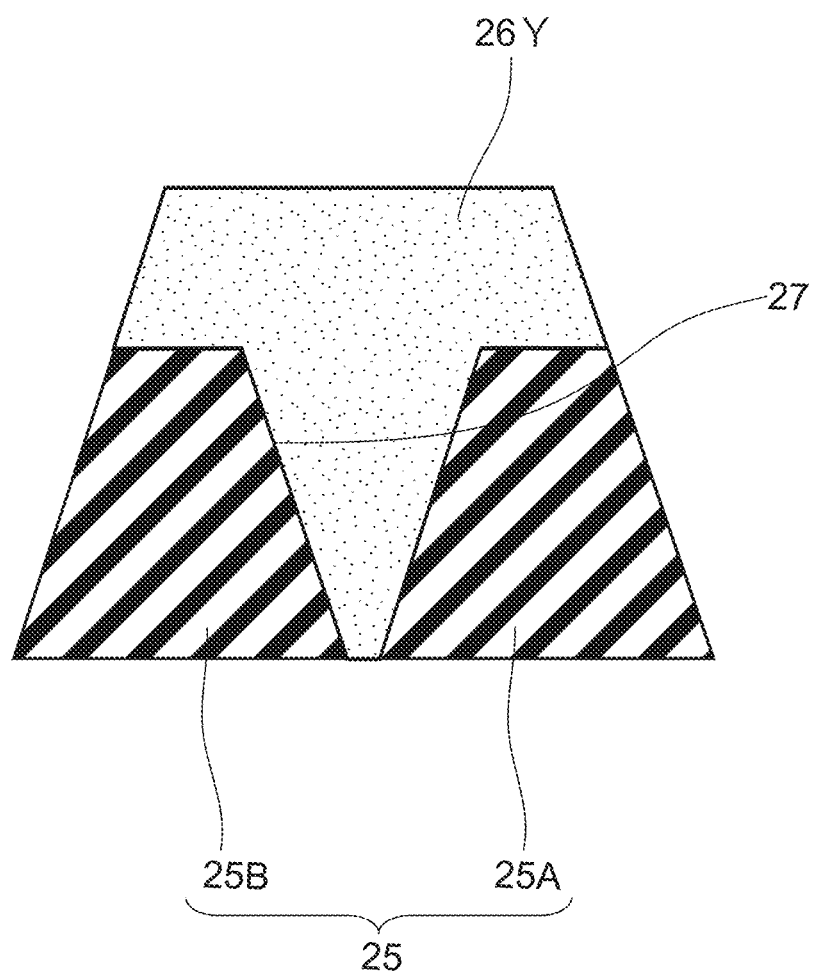
FIG. 35 is a sectional view showing the case which gel, applied on the annular dam-member, has a plane surface.

Further, it is possible that the gels 26Y, having plane surfaces corresponding to the top surfaces 99E, are formed in place of the gels 26X, as illustrated in FIG. 35, in the gel member forming step. At this time, the caps 99 are mounted on the respective package regions 141 so that the top surfaces 99E are in contact with the gels 26Y, before fluidity loss, or the gel members 26 formed by hardening of the gels 26Y. The gel members 26 are also in closely contact with the top surfaces 99E, at this case.

(Panel Cutting Step)

After that, the panel cutting step is performed. In the panel cutting step, the package-panel 140, which the MEMS chips 10 and the ASICs 92 are mounted, is cut along with the divided lines 142 to be divided into the respective package regions 141. Then, the package-panel 140 is divided into a plurality of the package regions 141. The MEMS package 1 and the MEMS microphone 100 are manufactured together with the package substrate 20 from each of the package regions 141.

(Operation and Effect of the MEMS Package, MEMS Microphone)

As mentioned above, the MEMS package 1 and the MEMS microphone 100 have the dammed-seal part 30. The dammed-seal part 30 has the annular dam-member 25 and the gel member 26, the gel member 26 is formed by hardening of gel which is applied on the annular dam-member 25.

Further, the gel member 26 is adhered to the top surface 99E of the cap 99 so as to surround the whole of the sound hole 99B. Namely, the dammed-seal part 30 is a seal part which surrounds the sound hole 99B. The gel member 26 is formed by fluidity loss of gel caused by hardening. Then, gel having fluidity must to be applied on the MEMS chip 10 so that the gel member 26 is formed.

However, when gel having fluidity is applied on the chip surface 2b of the MEMS chip 10, the gel enters the element hole-part 2c, thereby the membrane 3 is likely to be damaged. It is extremely difficult that the seal part, surrounds the sound hole 99B, is formed certainly with only gel having fluidity.

Then, in the MEMS package 1 and MEMS microphone 100, the annular dam-member 25 is formed on the chip surface 2b so as to surround the element hole-part 2c. Gel having fluidity is applied on the annular dam-member 25, the gel member 26 is formed by hardening of the gel.

In this case, the formation of gel, having fluidity, is maintained by the annular dam-member 25, having fixed structure. Because the gel member 26 is formed by hardening of gel, the dammed-seal part 30, which the annular dam-member 25 and the gel member 26 are united to one body, is obtained, at the moment when the gel member 26 is formed. Therefore, the seal part, which is adhered closely to the cap 99, is manufactured certainly, from gel having fluidity. Therefore, the MEMS package 1 and the MEMS microphone 100 are able to be manufactured certainly.

Then, because the annular dam-member 25 has the double-ring structure constituted by the inner dam-member 25A and the outer dam-member 25B, a space, which gel having fluidity is accommodated, is secured in an interval between the inner dam-member 25A and the outer dam-member 25B (also referred to dam-space). Therefore, gel having fluidity is kept certainly in the dam-space.

Further, the inner dam-member 25A and the outer dam-member 25B have the variable width structure. Therefore, the dam-space is secured as the annular groove-part 27 having the V-figure shape in a sectional view. Because the annular groove-part 27 has the V-figure shape in a sectional view, gel goes to the chip surface 2b from the inlet of the annular groove-part 27 along with the opposing dam slope 25Asj and the opposing dam slope 25Bsj. Therefore, gel is surely accommodated in the annular groove-part 27. Accordingly, gel having fluidity is kept certainly, outflow of gel is surely prevented.

Then, the gel member 26 enters the annular groove-part 27 and it is in contact with the dam slope 25As and the dam slope 25Bs, further it is in contact with the dam upper surface 25Aa and the dam upper surface 25Ba. Therefore, the gel member 26 is united closely with the annular dam-member 25 to form the dammed-seal part 30.

Further, the annular dam-member 25 is formed by performing the dam layer forming step repeatedly. Therefore, when the number of times for performing the dam layer forming step is changed, the size of the annular dam-member 25 is changed. Therefore, the annular dam-members, having various forms, are formed by the annular dam-member forming step. Further, because the dam layer is formed by the ink application and the ink hardening, the annular dam-member 25, having precise and minute form, is formed.

Modified Example

Figure 32:
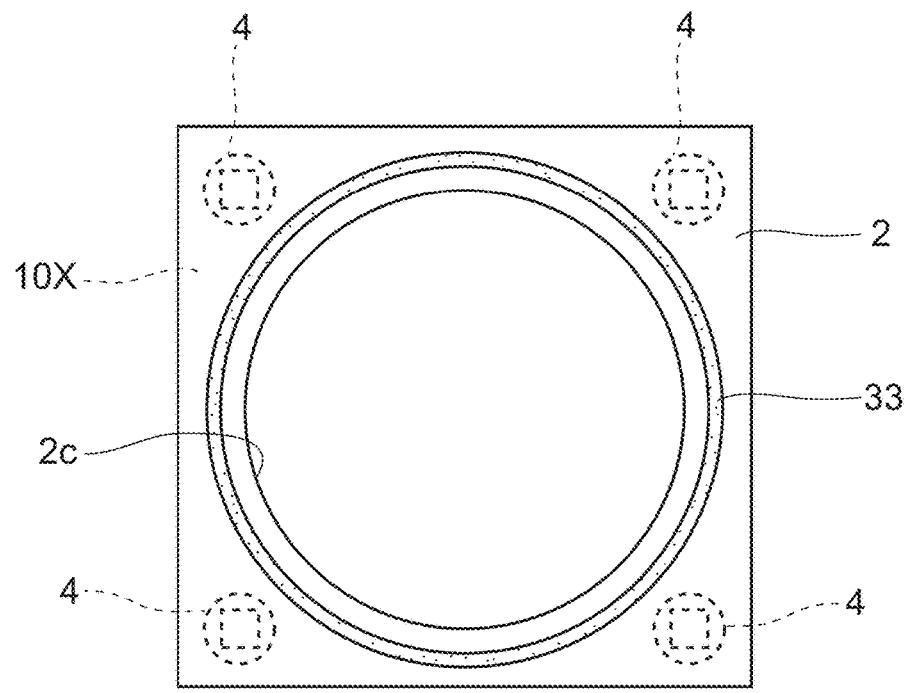
FIG. 32 (a) is a sectional view showing the MEMS chip according to the modified example, corresponding to FIG. 2, FIG. 32 (b) is a sectional view showing the MEMS chip according to another modified example, corresponding to FIG. 2.
Figure 32:
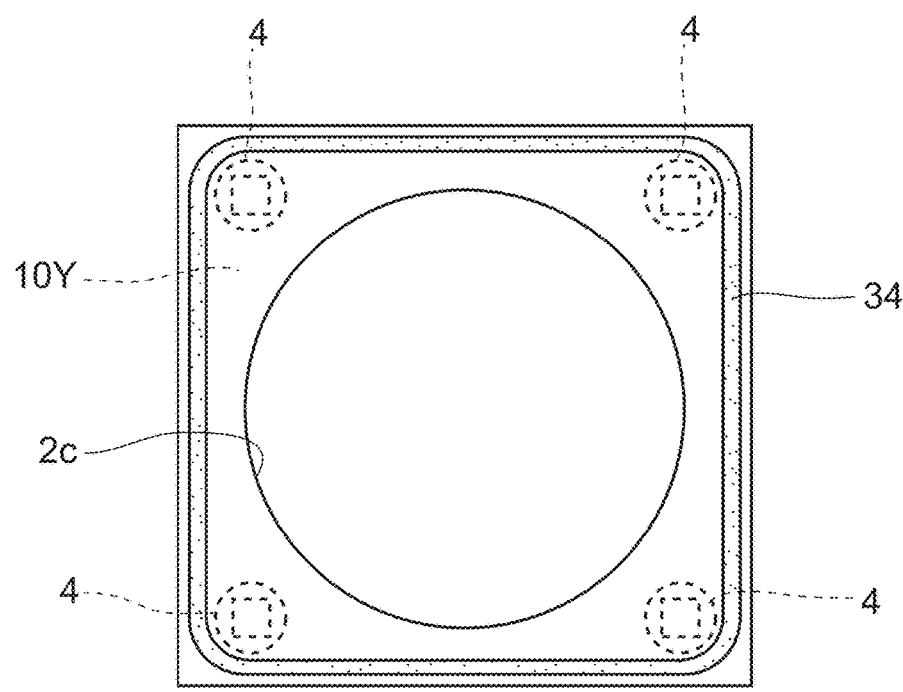

FIG. 32 (a) is a sectional view showing the MEMS chip 10X according to the modified example one of the first embodiment of the present invention, corresponding to FIG. 2. FIG. 32 (b) is a sectional view showing the MEMS chip 10Y according to the modified example two of the first embodiment of the present invention, corresponding to FIG. 2.

The MEMS chip 10X is different in that a dammed-seal part 33 is formed in place of the dammed-seal part 30, as compared with the MEMS chip 10. The dammed-seal part 33 is different from the dammed-seal part 30 in that the dammed-seal part 33 is formed in a circular shape.

Further, the MEMS chip 10Y is different in that a dammed-seal part 34 is formed in place of the dammed-seal part 30, as compared with the MEMS chip 10. The dammed-seal part 34 is different from the dammed-seal part 30 in that the dammed-seal part 34 is formed in a rectangular shape.

The dammed-seal parts 33, 34 are different from the dammed-seal part 30 in their form in a plan view though, they are the same with the dammed-seal part 30 in another points. Therefore, the MEMS package, the MEMS microphone, having the MEMS chips 10X, 10Y, exhibit operation and effect the same with the MEMS package 1, the MEMS microphone 100.

Second Embodiment (Structure of the MEMS Package, MEMS Microphone)

To begin with, the structure of the MEMS package 101, the MEMS microphone 121, according to the second embodiment of the present invention will be explained with reference to FIG. 16 to FIG. 18.

Figure 16:
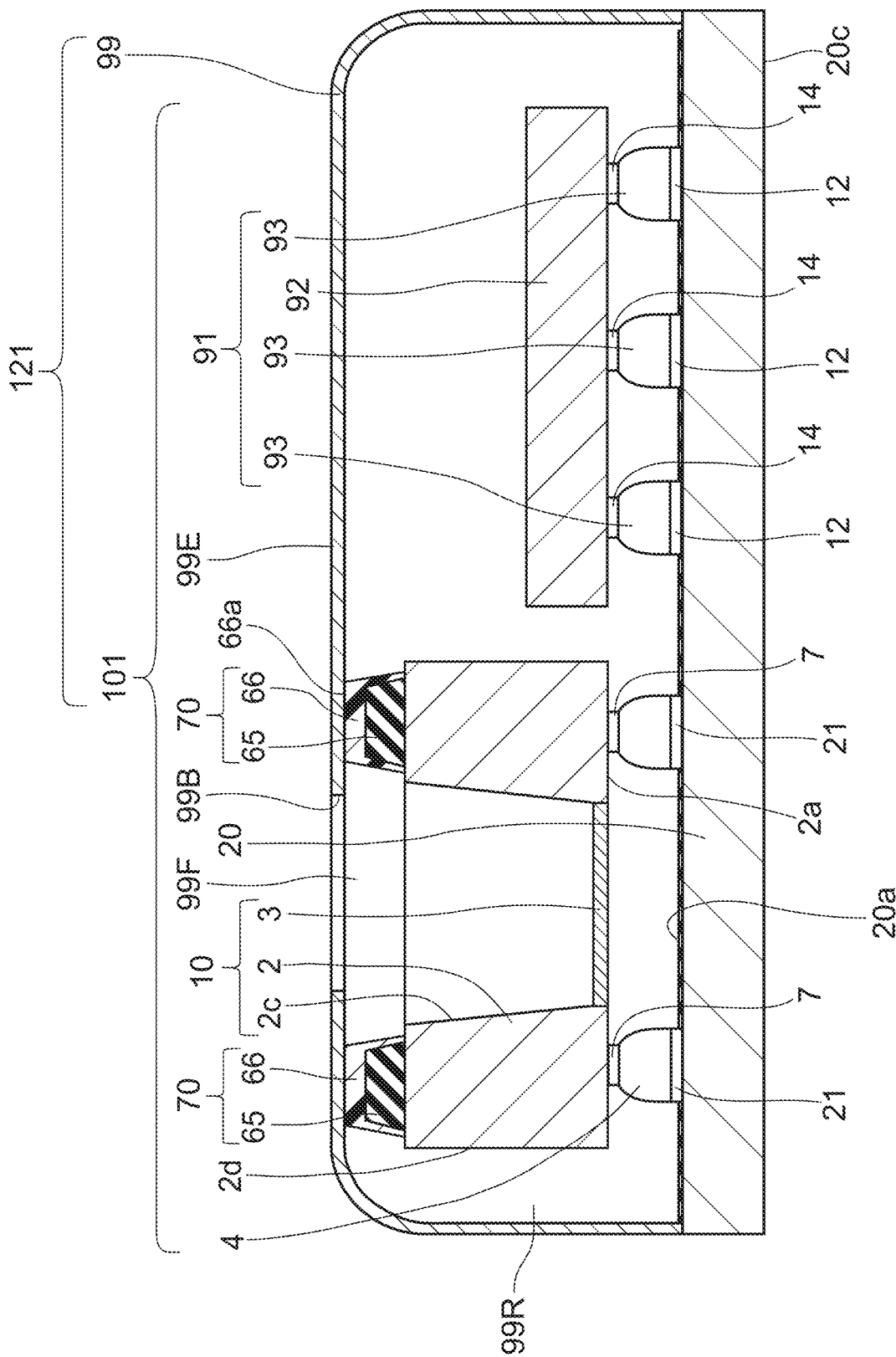
FIG. 16 is a sectional view showing the MEMS microphone according to the second embodiment of the present invention, corresponding to FIG. 1.

Here, FIG. 16 is a sectional view showing the MEMS microphone 121 according to the second embodiment of the present invention, corresponding to FIG. 1. FIG. 17 is a perspective view showing a dammed-seal part 70 of the MEMS microphone 121, corresponding to FIG. 5. FIG. 18 is a perspective view showing an annular dam-member 65, corresponding to FIG. 6.

The MEMS package 101, MEMS microphone 121 are different in that they have the dammed-seal parts 70, in place of the dammed-seal parts 30, as respectively compared with the MEMS package 1, MEMS microphone 100.

The dammed-seal part 70 is different in that it has the annular dam-member 65, a gel member 66 in place of the annular dam-member 25, the gel member 26, as compared with the dammed-seal parts 30.

Figure 17:
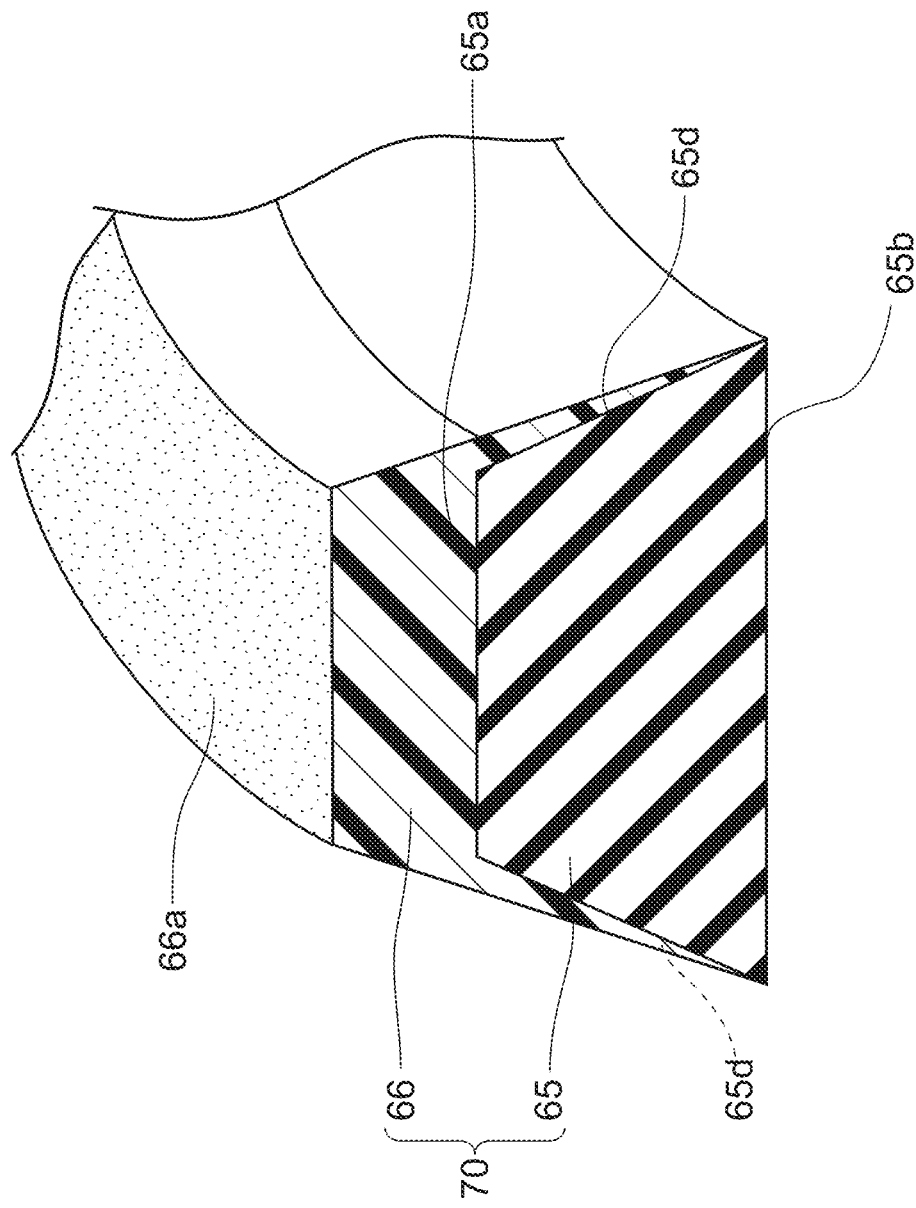
FIG. 17 is a perspective view showing the dammed-seal part according to the second embodiment of the present invention, corresponding to FIG. 5.
Figure 18:
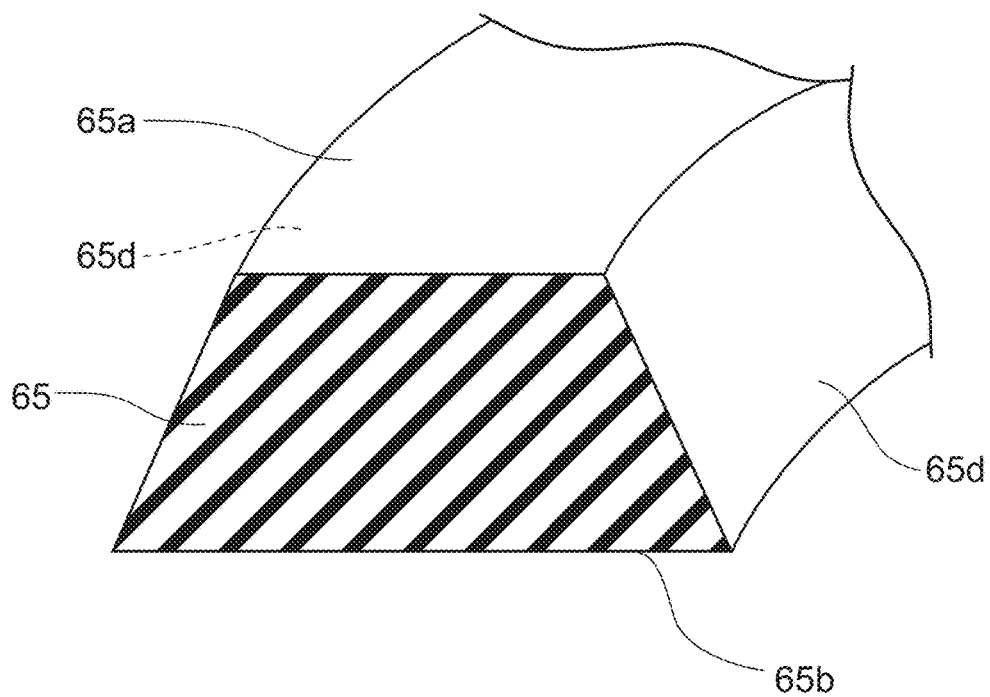
FIG. 18 is a perspective view showing the annular dam-member according to the second embodiment of the present invention, corresponding to FIG. 6.

As illustrated in FIG. 17, FIG. 18, the annular dam-member 65 has a dam upper surface 65a, being along with the chip surface 2b, a dam bottom surface 65b, being in contact with the chip surface 2b, a pair of dam slopes 65d, connecting the dam upper surface 65a and the dam bottom surface 65b. Then, the annular dam-member 65 has the variable width structure in which the width (the width is a width along with the chip surface) gradually increases toward the dam bottom surface 65b from the dam upper surface 65a. The annular dam-member 65 has the fixed structures which its form does not change, similar with the annular dam-member 25. However, the annular dam-member 65 has a single-ring structure, being different form the annular dam-member 25.

The gel-member 66 is a member formed by hardening of gel which is applied on the annular dam-member 65. The gel-member 66 is in contact with the dam upper surface 65a and the pair of dam slopes 65d. Further, the gel-member 66 is formed so as to cover the annular dam-member 65 from upper side. The annular dam-member 65 is arranged inside the gel-member 66, and the gel-member 66 is supported by the annular dam-member 65.

The gel-member 66 has a gel surface 66a. The gel surface 66a is an outer surface, of the gel-member 66, along with the chip surface 2b. As illustrated in FIG. 16, the gel surface 66a is adhered to the top surface 99E of the cap 99 so as to surround the whole of the sound hole 99B. The element hole-part 2c is arranged outside the sound hole 99B, further the dammed-seal part 70 is arranged outside the element hole-part 2c.

The front volume 99F and the back volume 99R are formed inside the cap 99, even with the MEMS microphone 121.

(Method of Manufacturing the MEMS Package 101, MEMS Microphone 121)

Figure 19:
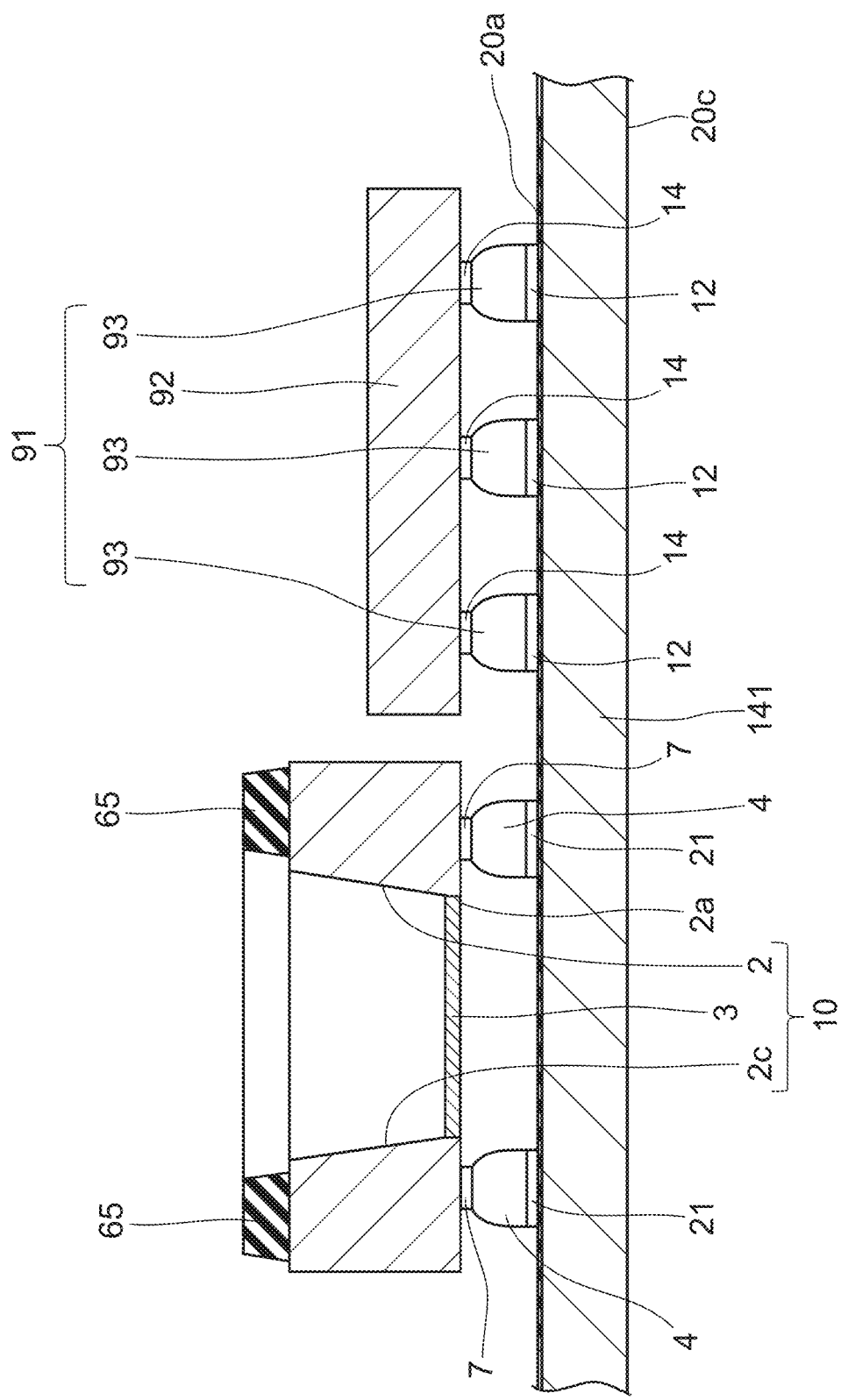
FIG. 19 is a sectional view showing the manufacturing step of the MEMS package according to the second embodiment of the present invention, corresponding to FIG. 13.
Figure 20:
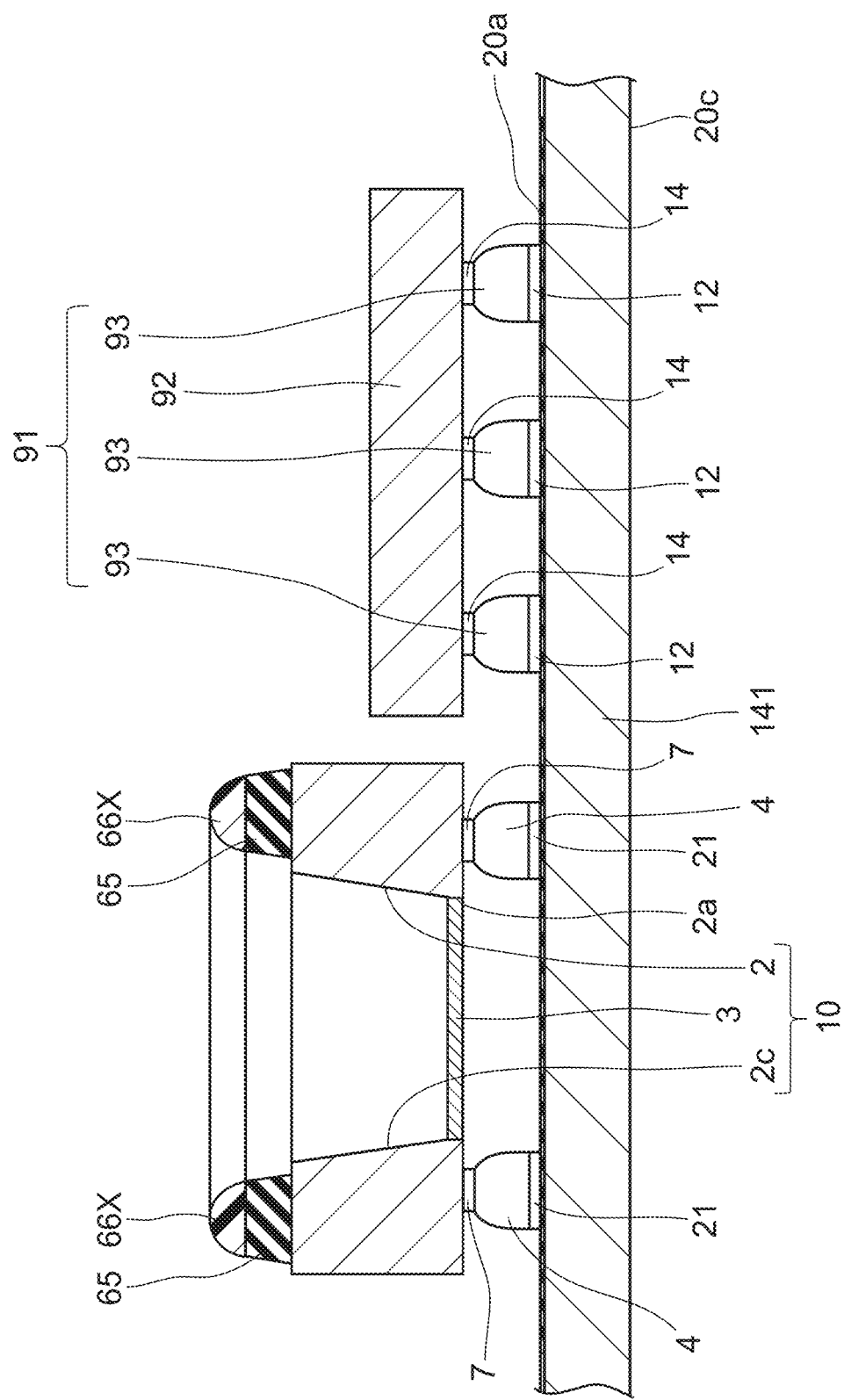
FIG. 20 is a sectional view showing the manufacturing step subsequent to that in FIG. 19.

Subsequently, the method of manufacturing the MEMS package 101 and the MEMS microphone 121, having the above structures, will be explained with reference to FIG. 19 to FIG. 20, in addition to FIG. 16. Here, FIG. 19 is a sectional view showing the manufacturing step of the MEMS package 101, corresponding to FIG. 13, FIG. 20 is a sectional view showing the manufacturing step subsequent to that in FIG. 19, corresponding to FIG. 13.

The method of manufacturing the MEMS package 101 and the method of manufacturing the MEMS microphone 121 are different from the above-described method of manufacturing the MEMS package 1 and the method of manufacturing the MEMS microphone 100 in that the annular dam-member forming step, the gel member forming step, the cap mounting step.

(Annular Dam-Member Forming Step)

In the annular dam-member forming step, the above-described annular dam-members 65 are formed. The annular dam-members 65 are formed on the dam expected areas 41r of the respective MEMS regions 41, about the MEMS wafer 40, similar with the annular dam-members 25. Even in case of the annular dam-members 65, the dam layer forming step is performed repeatedly, thereby the laminated dam layer is formed, similar with the annular dam-members 25. However, in case of the annular dam-members 65, the laminated dam layers, having the single-ring structures, are formed.

(Gel Member Forming Step and Cap Mounting Step)

Then, in the gel member forming step, the gel members 66 are formed. In the gel member forming step of this case, as illustrated in FIG. 20, gels 66X, of the predetermined amount, are applied to the annular dam-members 65, in the respective package regions 141 of the package-panel 140. Then, the gels 66X have fluidity at the time of being applied to the annular dam-members 65. In this case, for example, as illustrated in FIG. 20, the gels 66 X, which the surface form are curved surface, are formed.

Subsequently, the cap mounting step is performed. In the cap mounting step, the caps 99 are mounted on the respective package regions 141 of the package-panel 140. In this case, the caps 99 are mounted so that the top surfaces 99E of the caps 99 are in contact with the gels 66 X, and the caps 99 push the gels 66X. Thereby, because the gels 66 X are pushed by the caps 99, parts of the gels 66X flow from the dam upper surfaces 65a to the dam slopes 65d. As a result, the gels 66x are formed so as to cover the annular dam-members 65 from upper side. After that, the gel-members 66 are formed by hardening of gels 66X.

After the above, the panel cutting step is performed similar with the method of manufacturing the MEMS package 1 and the method of manufacturing the MEMS microphone 100, thereby, the MEMS package 101 and the MEMS microphone 121 are manufactured.

Because the MEMS package 101 and the MEMS microphone 121 have the dammed-seal part 70, the MEMS package 101 and the MEMS microphone 121 are able to be manufactured certainly.

Especially, in case of the dammed-seal part 70, the gels 66X, which the surface forms are curved surfaces, are pushed by the caps 99, thereby the gel members 66 are formed. The gels 66 X, having fluidity, are transformed along with the top surfaces 99E, after that the gel members 66 are formed. Therefore, the gel members 66 are in contact closely with the top surfaces 99E. Further, the top-seal structure, by the dammed-seal parts 70, are formed certainly.

Third Embodiment (Structure of the MEMS Package, MEMS Microphone)

To begin with, the structure of the MEMS package 102, MEMS microphone 131, according to the third embodiment of the present invention will be explained with reference to FIG. 21 to FIG. 26.

Figure 21:
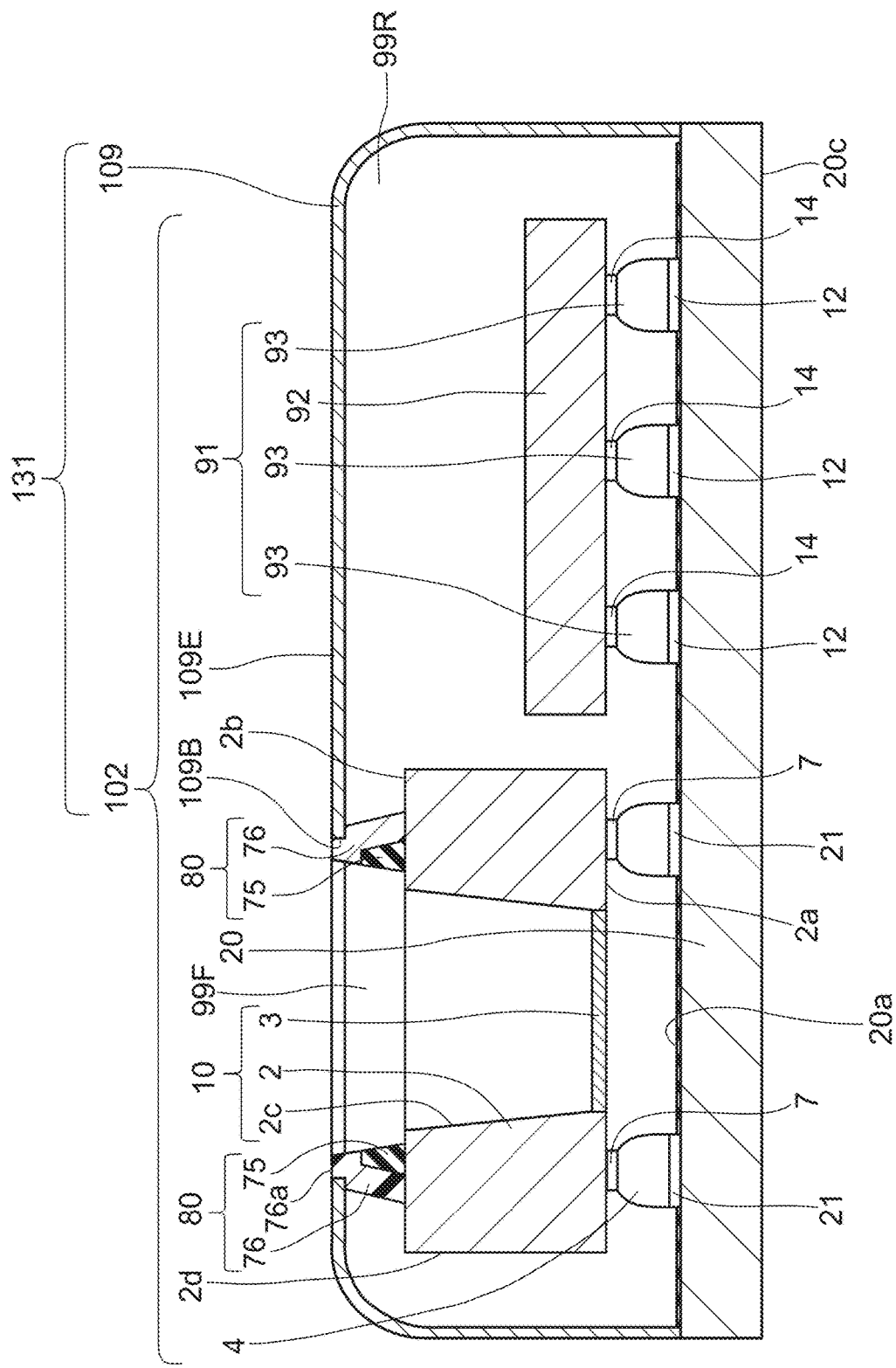
FIG. 21 is a sectional view showing the MEMS microphone according to the third embodiment of the present invention, corresponding to FIG. 1.
Figure 22:
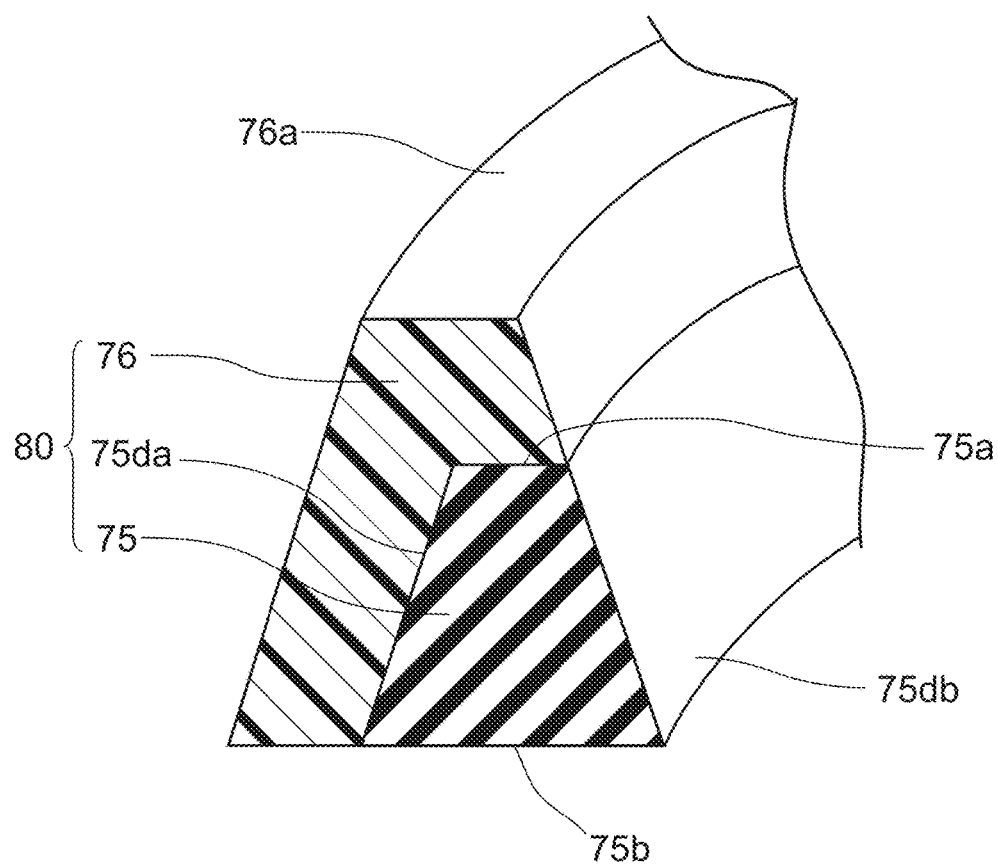
FIG. 22 is a perspective view showing the dammed-seal part according to the third embodiment of the present invention, corresponding to FIG. 5.
Figure 23:
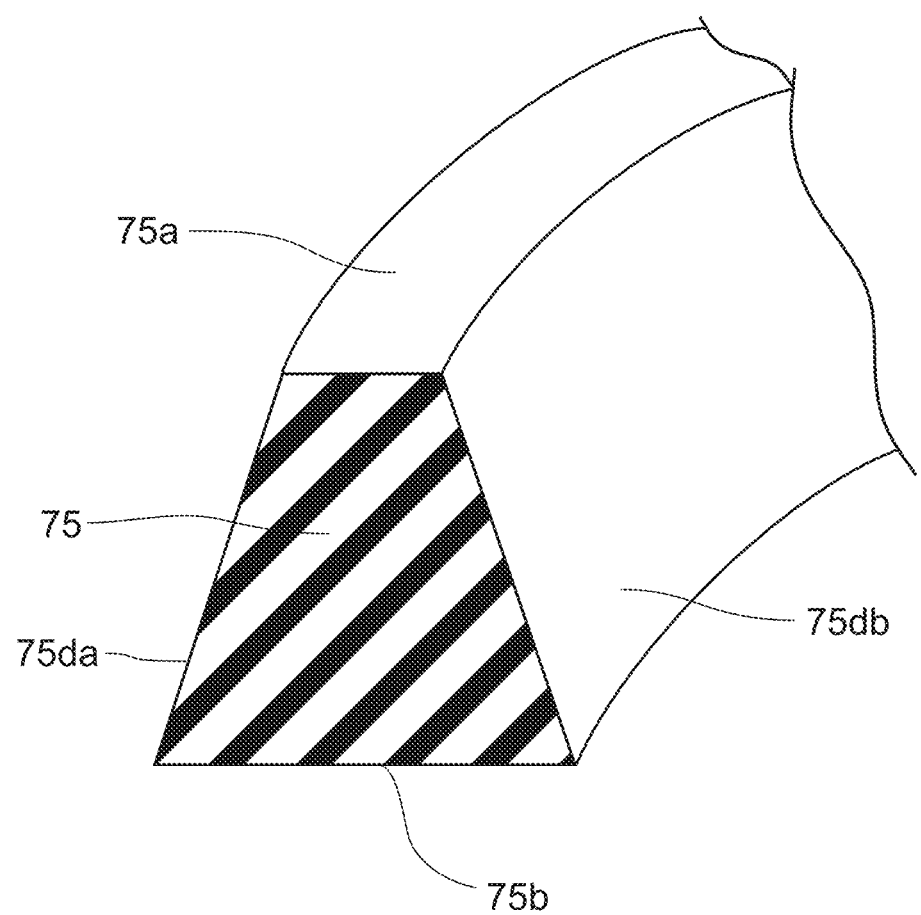
FIG. 23 is a perspective view showing the annular dam-member according to the third embodiment of the present invention, corresponding to FIG. 6.
Figure 24:
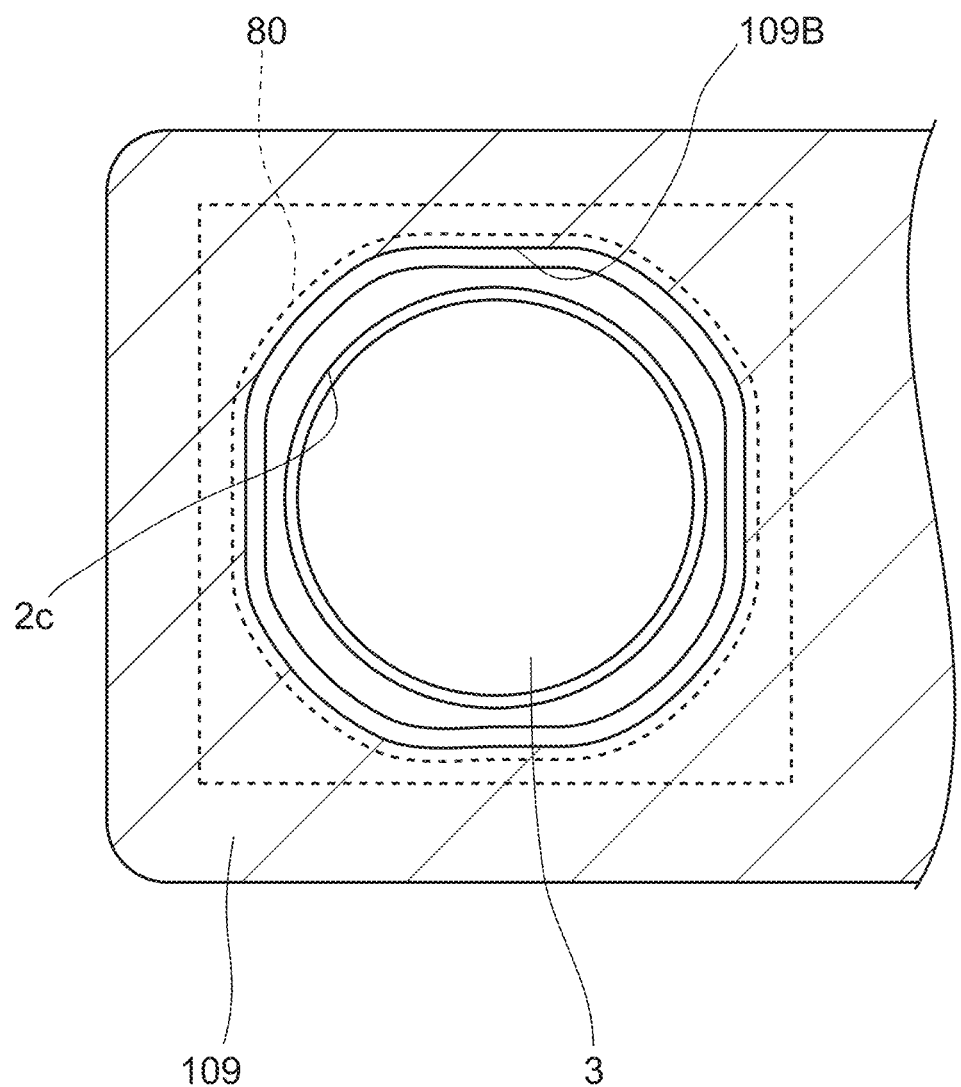
FIG. 24 is a plan view showing the principal part, including the sound hole, of the cap of the MEMS microphone according to the third embodiment of the present invention.
Figure 25:
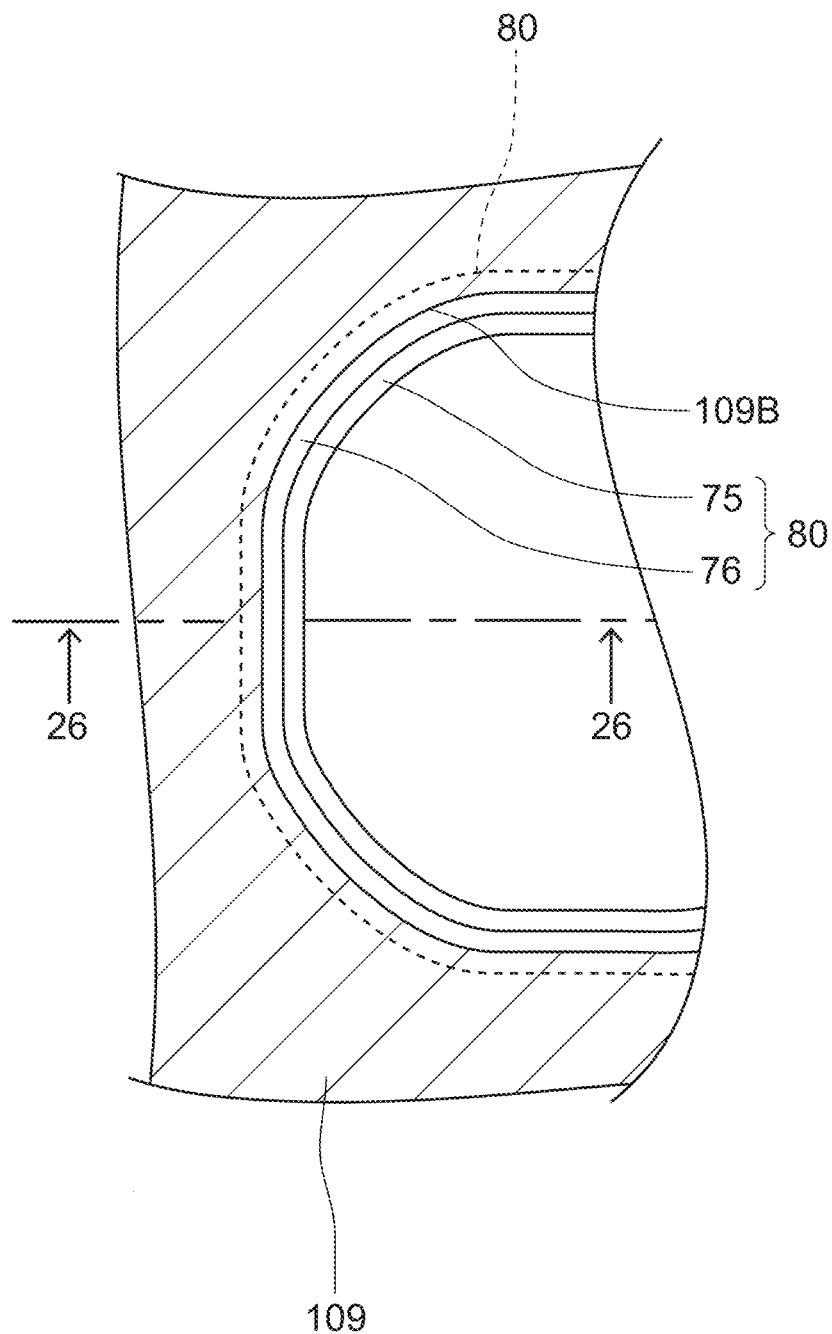
FIG. 25 is a plan view showing the principal part of the sound hole and the dammed-seal part in FIG. 24 with enlargement.
Figure 26:
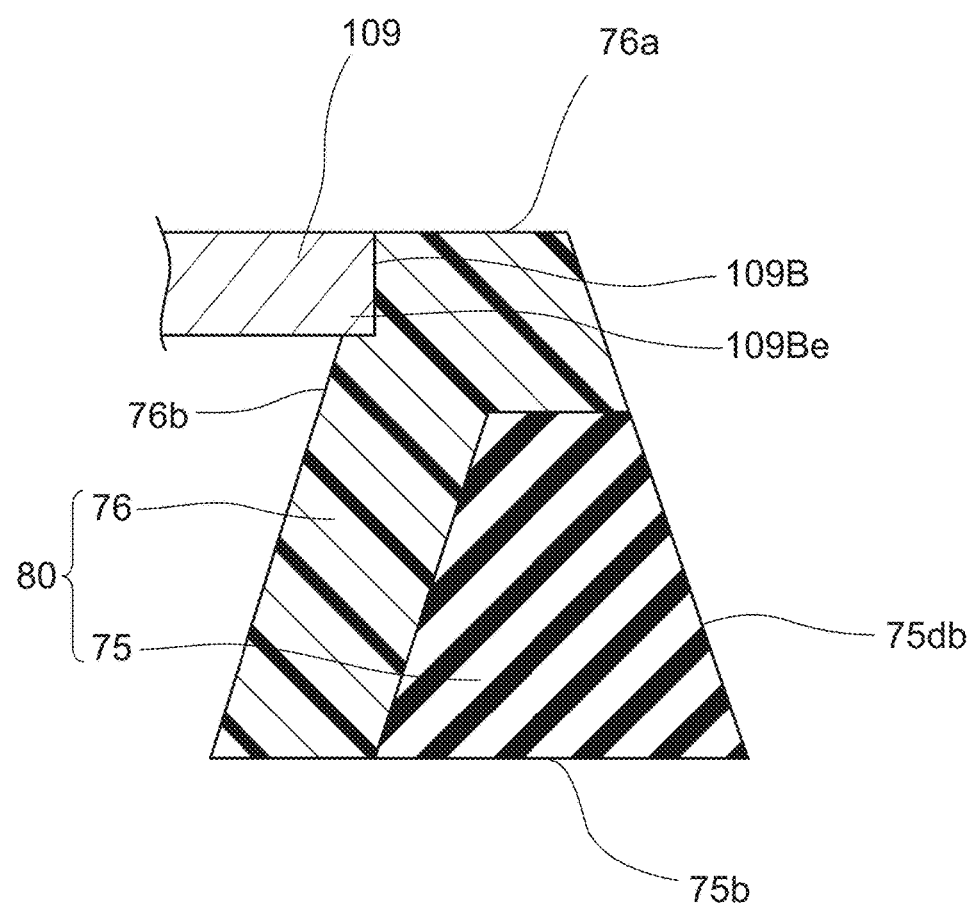
FIG. 26 is a sectional view, taken along the line 26-26 in FIG. 25.

Here, FIG. 21 is a sectional view showing the MEMS microphone 131 according to the third embodiment of the present invention, corresponding to FIG. 1. FIG. 22 is a perspective view showing a dammed-seal part 80 of the MEMS microphone 131, corresponding to FIG. 5. FIG. 23 is a perspective view showing an annular dam-member 75, corresponding to FIG. 6. Further, FIG. 24 is a plan view showing the principal part, including a sound hole 109B, of a cap 109. FIG. 25 is a plan view showing the principal part of a sound hole 109B and the dammed-seal part 80 with enlargement, FIG. 26 is a sectional view, taken along the line 26-26 in FIG. 25.

The MEMS package 102, MEMS microphone 131 are different in that they have the dammed-seal parts 80 in place of the dammed-seal parts 30, they have the caps 109 in place of the caps 99, as compared with the MEMS package 1, MEMS microphone 100.

The dammed-seal part 80 is different in that it has an annular dam-member 75, a gel member 76 in place of the annular dam-member 25, the gel member 26, as compared with the dammed-seal parts 30.

As illustrated in FIG. 22, FIG. 23, the annular dam-member 75 has a dam upper surface 75a, being along with the chip surface 2b, a dam bottom surface 75b, being in contact with the chip surface 2b, a pair of dam slopes (outer dam slope 75da, inner dam slope 75db), connecting the dam upper surface 75a and the dam bottom surface 75b. Then, the annular dam-member 75 has the variable width structure in which the width (the width is a width along with the chip surface 2b) gradually increases toward the dam bottom surface 75b from the dam upper surface 75a. The annular dam-member 75 has the fixed structures which its form does not change, similar with the annular dam-member 25. However, the annular dam-member 75 has the single-ring structure, being different form the annular dam-member 25.

The gel-member 76 is a member formed by hardening of gel, which is applied on the annular dam-member 75. The gel-member 76 is in contact with the dam upper surface 75a and the outer dam slope 75da. Further, the gel-member 76 is formed so as to lean against the annular dam-member 75. The gel-member 76 is formed by being supported by the annular dam-member 75 from under side as the above.

The gel-member 76 has a gel surface 76a. The gel surface 76a is an outer surface, of the gel-member 76, along with the chip surface 2b. As illustrated in FIG. 21, FIG. 26, an annular end part 109Be, forming the sound hole 109B of the cap 109, sinks into the gel surface 76a and a gel slope 76b, the cap 109 is adhered to the gel-member 76 on that condition. Further, as illustrated in FIG. 25, a part of the gel surface 76a is arranged annularly along with the periphery of the sound hole 109B. The gel surface 76a is arranged in the periphery of the sound hole 109B.

Further, the front volume 99F and the back volume 99R are formed inside the cap 99, even with the MEMS microphone 131.

(Method of Manufacturing the MEMS Package 102, MEMS Microphone 131)

Figure 27:
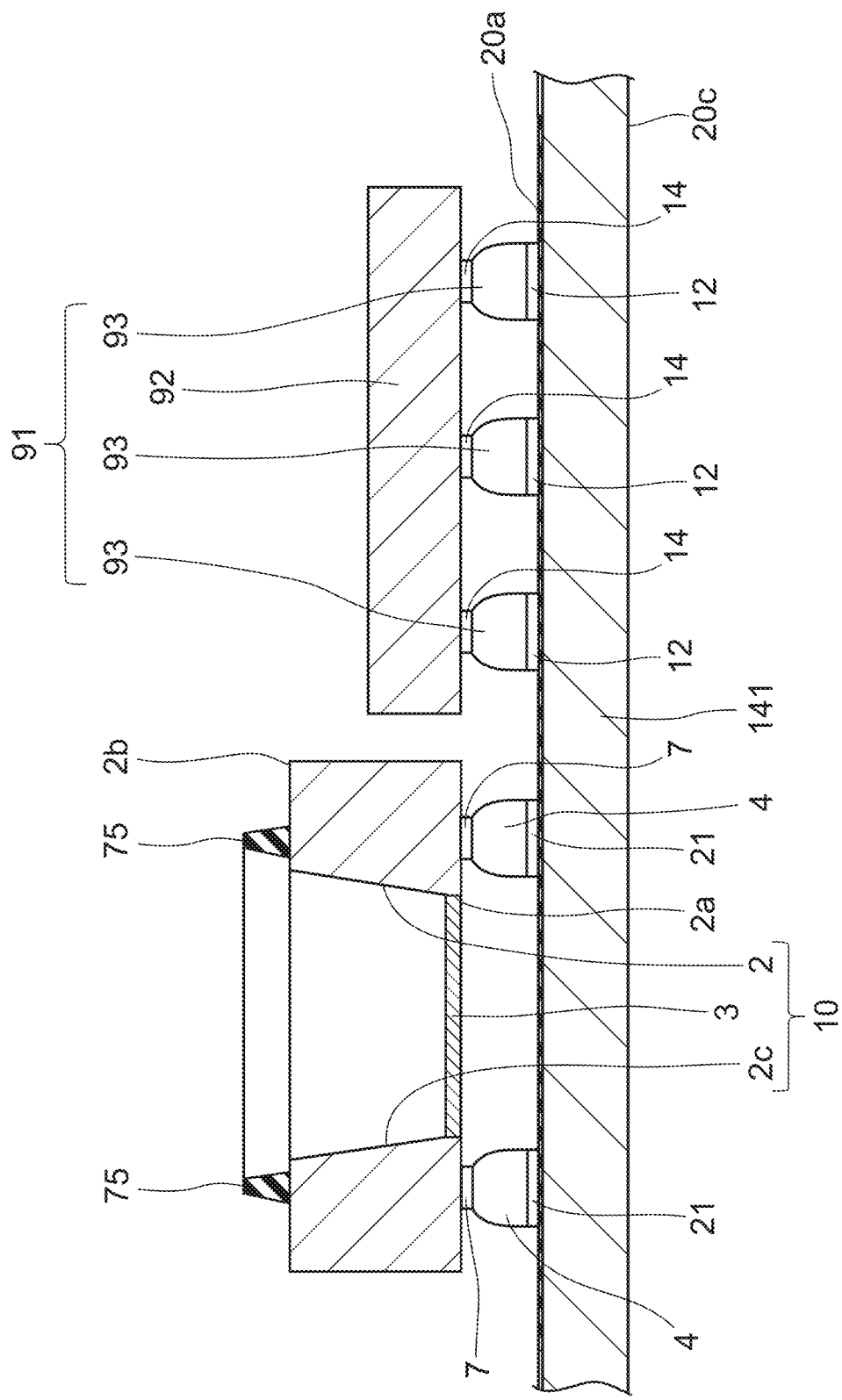
FIG. 27 is a sectional view showing the manufacturing step of the MEMS package according to the third embodiment of the present invention, corresponding to FIG. 13.
Figure 28:
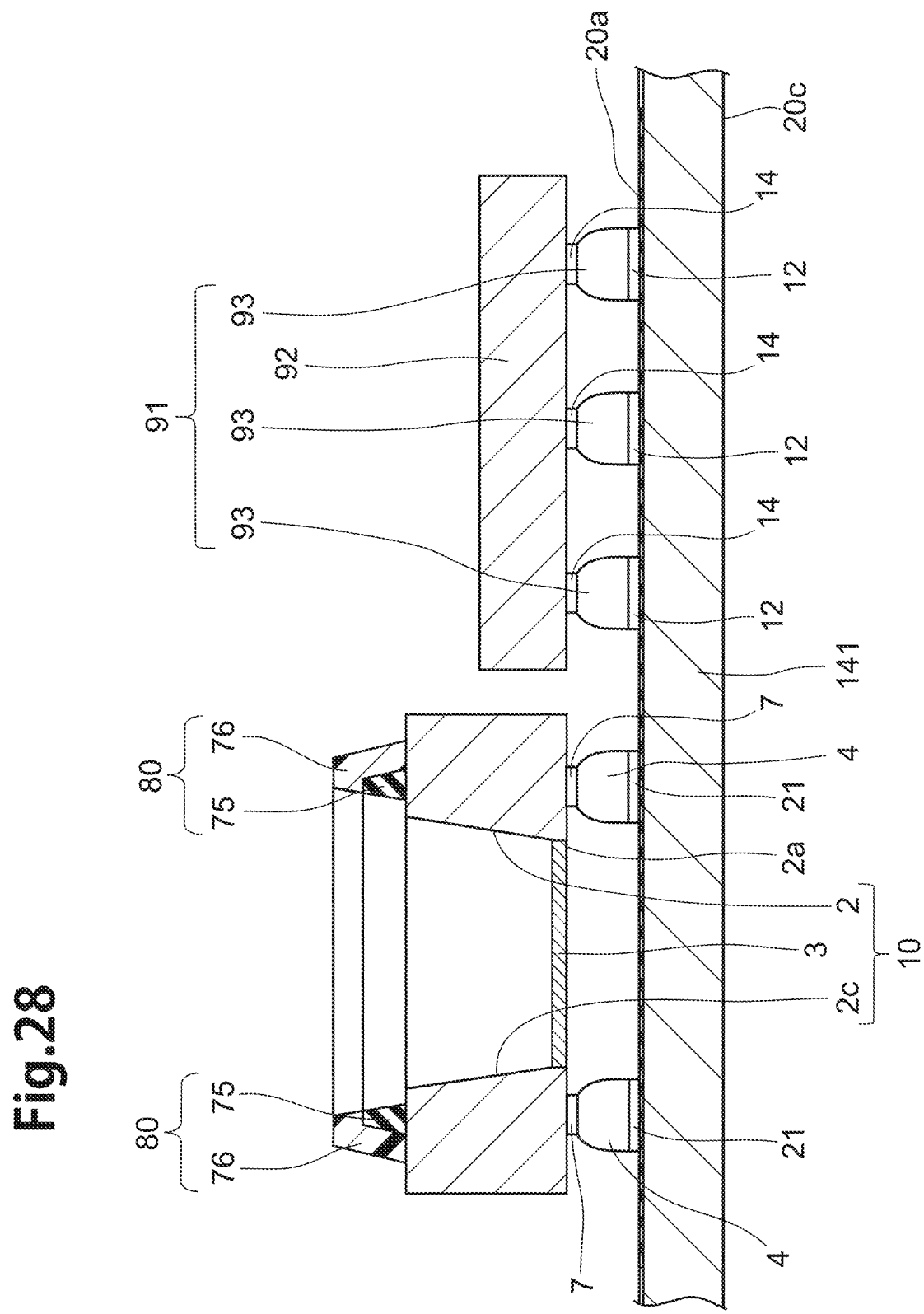
FIG. 28 is a sectional view showing the manufacturing step subsequent to that in FIG. 27.
Figure 29:
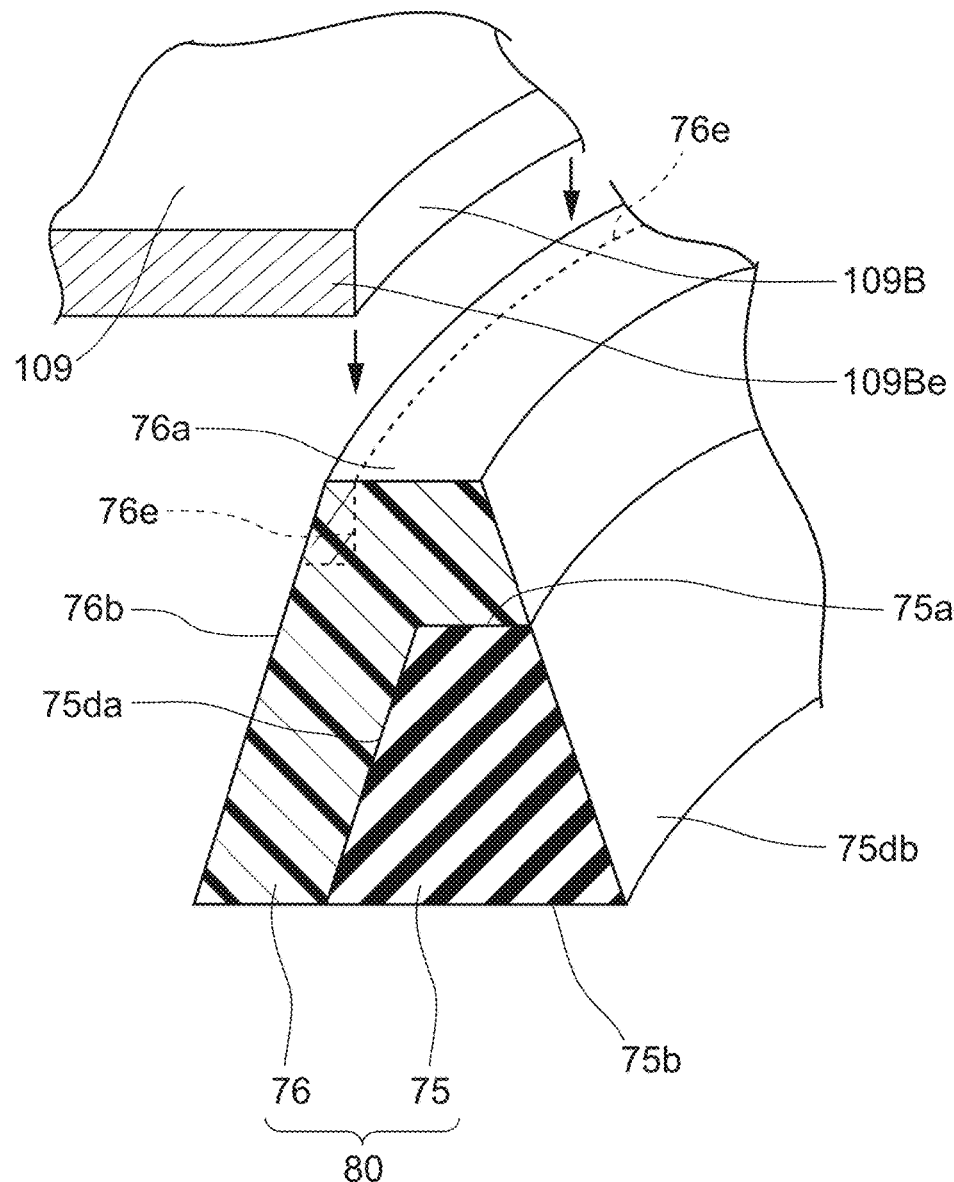
FIG. 29 is a perspective view showing the principal part of the manufacturing step of the MEMS package according to the third embodiment of the present invention, corresponding to FIG. 22.

Subsequently, the method of manufacturing the MEMS package 102 and the MEMS microphone 131, having the above structures, will be explained with reference to FIG. 27 to FIG. 29, in addition to FIG. 22, FIG. 26. Here, FIG. 27 is a sectional view showing the manufacturing step of the MEMS package 102, corresponding to FIG. 13, FIG. 28 is a sectional view showing the manufacturing step subsequent to that in FIG. 27, corresponding to FIG. 13. FIG. 29 is a perspective view showing the principal part of the manufacturing step of the MEMS package 102, corresponding to FIG. 22.

The method of manufacturing the MEMS package 102 and the method of manufacturing the MEMS microphone 131 are different from the above-described method of manufacturing the MEMS package 1 and the method of manufacturing the MEMS microphone 100 in that the annular dam-member forming step, the gel member forming step, the cap mounting step.

(Annular Dam-Member Forming Step)

In the annular dam-member forming step, the above-described annular dam-members 75 are formed. The annular dam-members 75 are formed on the dam expected areas 41r of the respective MEMS regions 41, about the MEMS wafer 40, similar with the annular dam-members 25. Even in case of the annular dam-members 75, the dam layer forming step is performed repeatedly, thereby the laminated dam layer is formed, similar with the annular dam-member 25. However, in case of the annular dam-member 75, the laminated dam layer, having the single-ring structure, is formed, as illustrated in FIG. 27.

(Gel Member Forming Step and Cap Mounting Step)

Then, in the gel member forming step, the gel members 76 are formed. In the gel member forming step of this case, as illustrated in FIG. 28, FIG. 29, gel of the predetermined amount, is applied to cover the dam upper surfaces 75a, the outer dam slopes 75da of the annular dam-member 75. When the gel loses fluidity to become solid like condition, the gel members 76 are formed.

Subsequently, the cap mounting step is performed. In the cap mounting step, the caps 109 are mounted on the respective package regions 141 of the package-panel 140. In this case, as illustrated in FIG. 29, the annular end part 109Be, forming the sound hole 109B, is in contact with the gels before hardening (or the gel members 76) and sinks into a gel slope 76b. After that, the annular end parts 109Be are arranged in sunk parts 76e of the gel members 76. In this way, after that, hardening of gels form the gel members 76 with the condition which the annular end parts 109Be sink into the gel slopes 76b. Therefore, the caps 109 are engaged with the gel members 76. When the other steps are performed similar with the method of manufacturing the MEMS package 1 and the method of manufacturing the MEMS microphone 100, the MEMS package 102 and the MEMS microphone 131 are manufactured.

Because the MEMS package 102 and the MEMS microphone 131 have the dammed-seal part 80, the MEMS package 102 and the MEMS microphone 131 are able to be manufactured certainly.

Especially, in case of the dammed-seal part 80, the cap 109 is adhered to the gel member 76 on the condition which the annular end part 109Be sinks into the gel slope 76b. Therefore, the annular end part 109Be is arranged outside the annular dam-member 75. Thereby, the size of the sound hole 109B is extended in compared with the sound hole 99B of the MEMS microphone 100. Therefore, because air amount, passing through the sound hole 109B, increases, sensitivity of the MEMS microphone 131 is improved.

Modified Example

Figure 30:
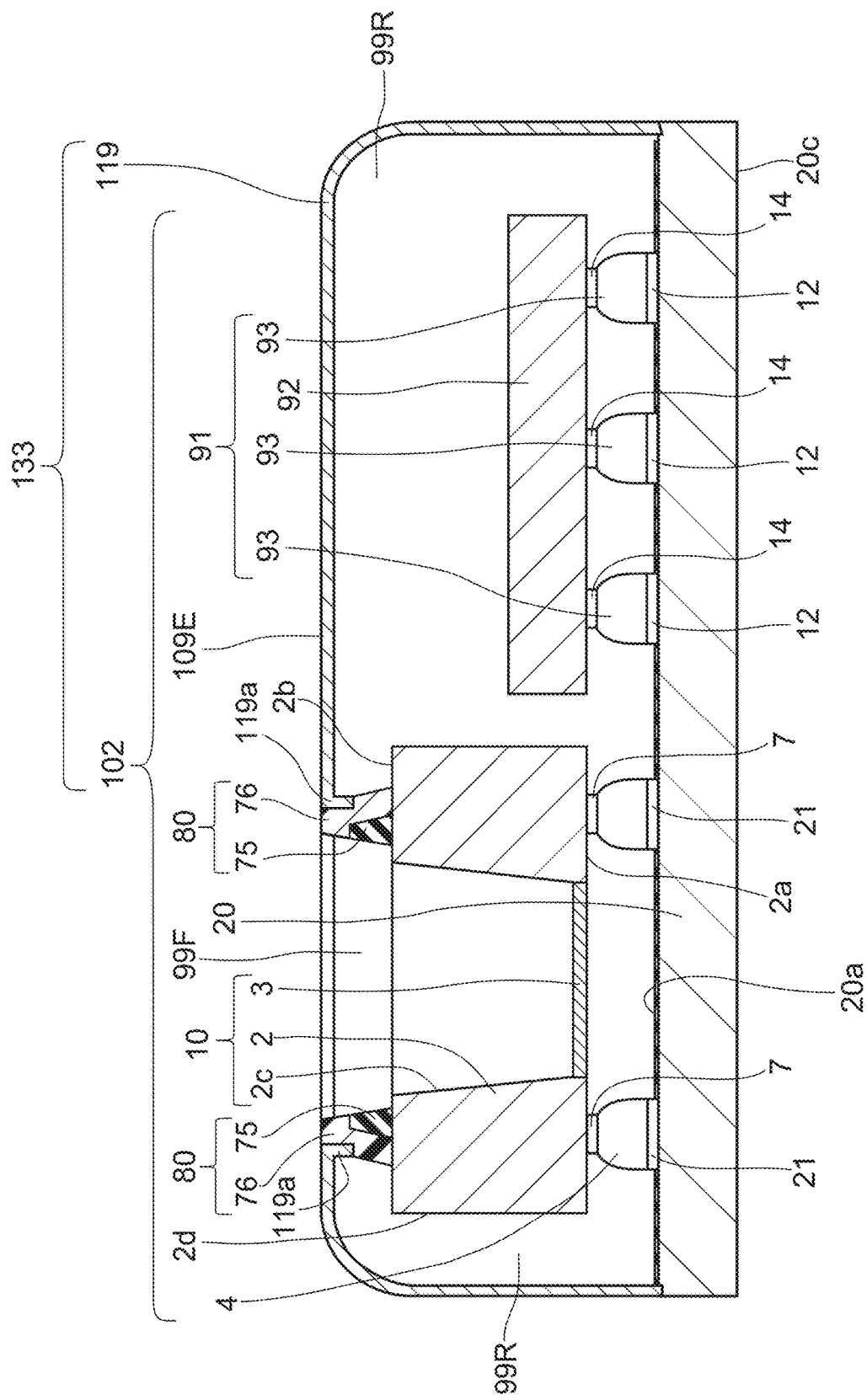
FIG. 30 is a sectional view showing the MEMS microphone according to the modified example, corresponding to FIG. 1.
Figure 31:
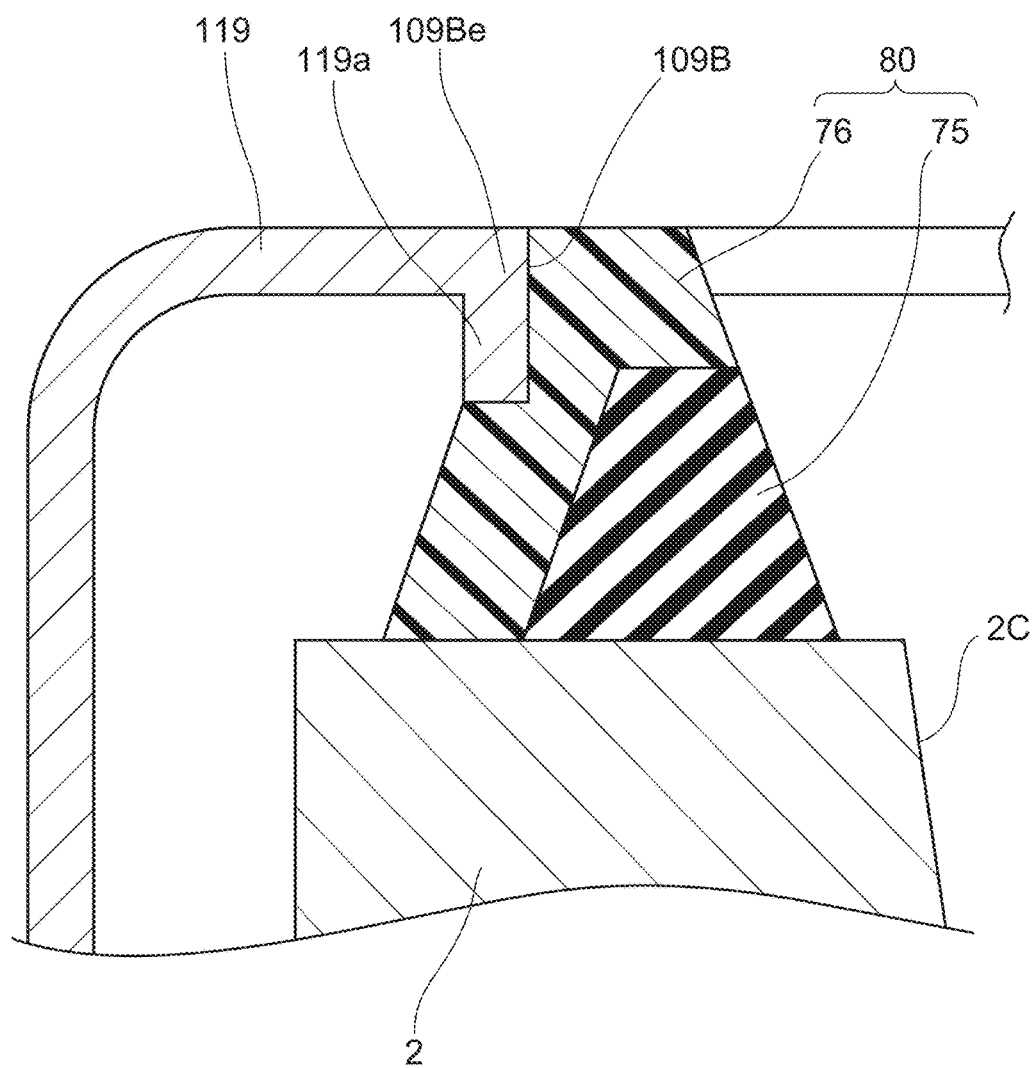
FIG. 31 is a sectional view showing the principal part of the cap and the dammed-seal part of the MEMS microphone in FIG. 30, corresponding to FIG. 26.

FIG. 30 is a sectional view showing the MEMS microphone 133 according to the modified example of the third embodiment of the present invention, corresponding to FIG. 1. FIG. 31 is a sectional view showing the principal part of a cap 119 and the dammed-seal part 80 of a MEMS microphone 133, corresponding to FIG. 26.

The MEMS microphone 133 is different in that it has the cap 119 in place of the cap 109, as compared with the MEMS microphone 131.

The cap 119 is different in that the annular end part 109Be has a sunk edge 119a, as compared with the cap 109. The sunk edge 119a protrudes along with the intersecting direction of the top surface 109E, and it sinks into the gel slope 76b. The cap 119 is adhered more closely to the gel member 76 by the sunk-end part 119a.

Fourth Embodiment (Structure of the MEMS Package, MEMS Microphone)

To begin with, the structure of the MEMS package 103, MEMS microphone 231, according to the fourth embodiment of the present invention will be explained with reference to FIG. 36 to FIG. 39.

Figure 36:
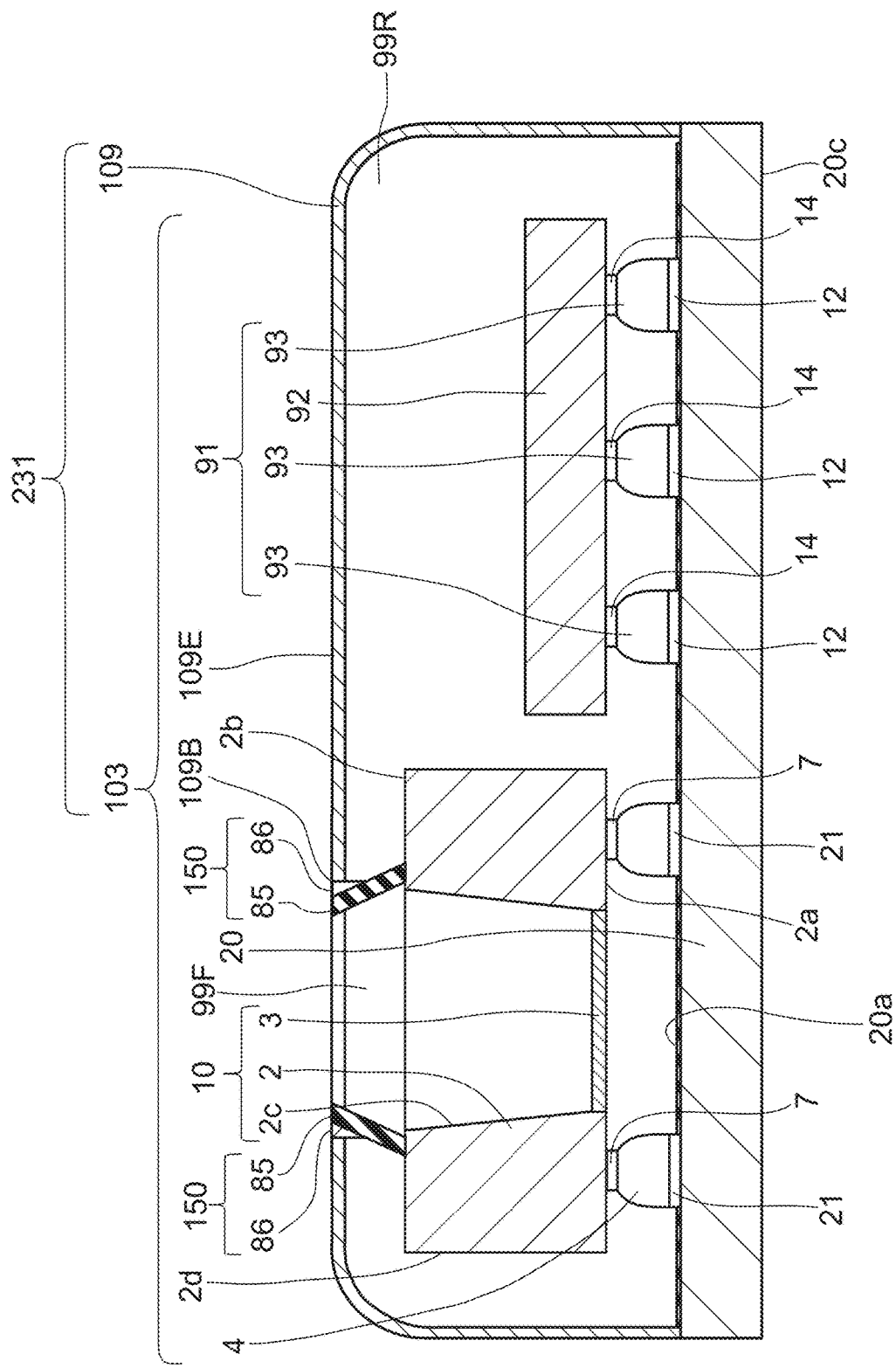
FIG. 36 is a sectional view showing the MEMS microphone according to the fourth embodiment of the present invention, corresponding to FIG. 1.
Figure 37:
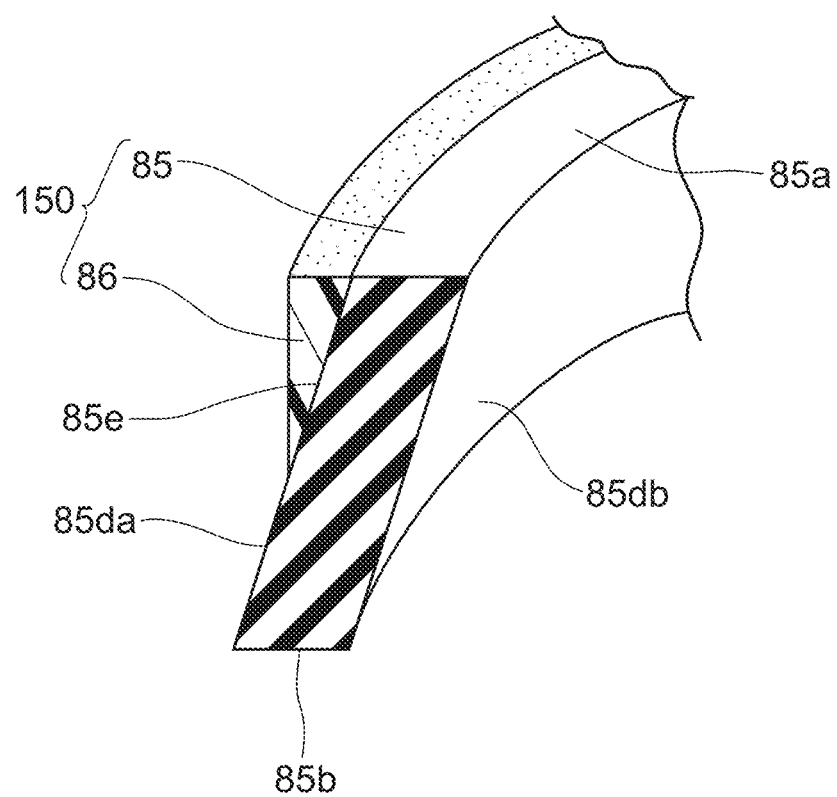
FIG. 37 is a perspective view showing the principal part of a dammed-seal part of the MEMS microphone, according to the fourth embodiment of the present invention, corresponding to FIG. 5.
Figure 38:
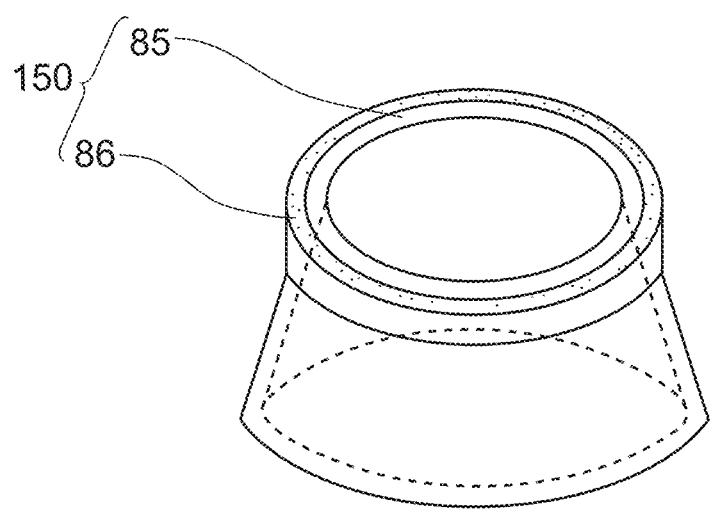
FIG. 38 is a perspective view showing the dammed-seal part according to the fourth embodiment of the present invention.
Figure 39:
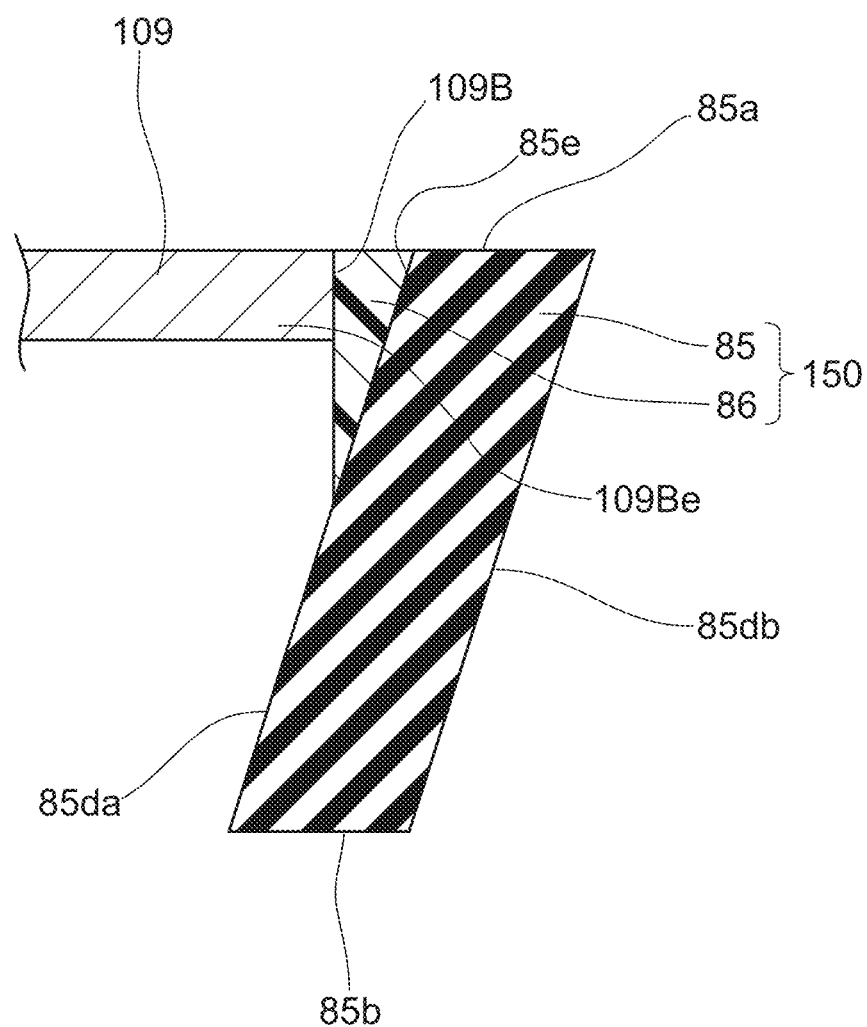
FIG. 39 is a sectional view showing the principal part of the dammed-seal part and the cap, corresponding to FIG. 26.

Here, FIG. 36 is a sectional view showing the MEMS microphone 231 according to the fourth embodiment of the present invention, corresponding to FIG. 1. FIG. 37 is a perspective view showing a principal part of a dammed-seal part 150 of the MEMS microphone 231, corresponding to FIG. 5. FIG. 38 is a perspective view showing the dammed-seal part 150. FIG. 39 is a sectional view showing the principal part of the dammed-seal part 150 and the cap 109, corresponding to FIG. 26.

The MEMS package 103, MEMS microphone 231 are different in the points indicated in the following a), b), as compared with the MEMS package 102, MEMS microphone 131 according to the third embodiment.

a) the MEMS microphone 231 has the dammed-seal part 150 in place of the dammed-seal parts 80.

b) the size of the sound hole 109B of the MEMS microphone 231 is smaller than the size of the sound hole 109B of the MEMS microphone 131.

The dammed-seal part 150 is different in that it has an annular dam-member 85, a gel member 86 in place of the annular dam-member 75, the gel member 76, as compared with the dammed-seal parts 80. The dammed-seal part 150 has the annular structure, formed along with the whole of the element hole-part 2c, similar with the dammed-seal part 75.

As illustrated in FIG. 37, FIG. 39, the annular dam-member 85 has a dam upper surface 85a, being along with the chip surface 2b, a dam bottom surface 85b, being in contact with the chip surface 2b, a pair of dam side surfaces (outer dam side surface 85da, inner dam side surface 85db), connecting the dam upper surface 85a and the dam bottom surface 85b.

Then, the annular dam-member 85 has the fixed width (the width is a width along with the chip surface 2b) from the dam upper surface 85a to the dam bottom surface 85b. However, the pair of dam side surfaces 85da, 85db are slanted along with the direction which the pair of dam side surfaces 85da, 85db are widened toward the dam bottom surface 85b from the dam upper surface 85a (widen toward end). A later-described dam upper end part 85e of the annular dam-member 85 is arranged inside the sound hole 109B. Further, the dam upper surface 85a is exposed inside the sound hole 109B. The annular dam-member 85 has the fixed structure which its form does not change, similar with the annular dam-member 75.

The gel-member 86 is a member formed by hardening of gel, which is applied on the annular dam-member 85. The gel-member 86 is formed by being adhered to the dam upper end part 85e of the annular dam-member 85, without being in contact with the chip surface 2b (distant from the chip surface 2b). The dam upper end part 85e is a part of the dam upper surface 85a side of the annular dam-member 85.

The gel-member 86 is adhered to the part, of the dam upper end part 85e, arranged on the outer dam side surface 85da. Further, as illustrated in FIG. 39, the gel-member 86 enters between the dam upper end part 85e and the annular end part 109Be, forming the sound hole 109B, and it is adhered both the dam upper end part 85e and the annular end part 109Be. Then, a gap between the dam upper end part 85e and the annular end part 109Be (a later-described dam gap 87, see FIG. 41) is sealed by the gel-member 86.

Further, the front volume 99F and the back volume 99R are formed inside the cap 109, even with the MEMS microphone 231.

(Method of Manufacturing the MEMS Package 103, MEMS Microphone 231)

Figure 40:
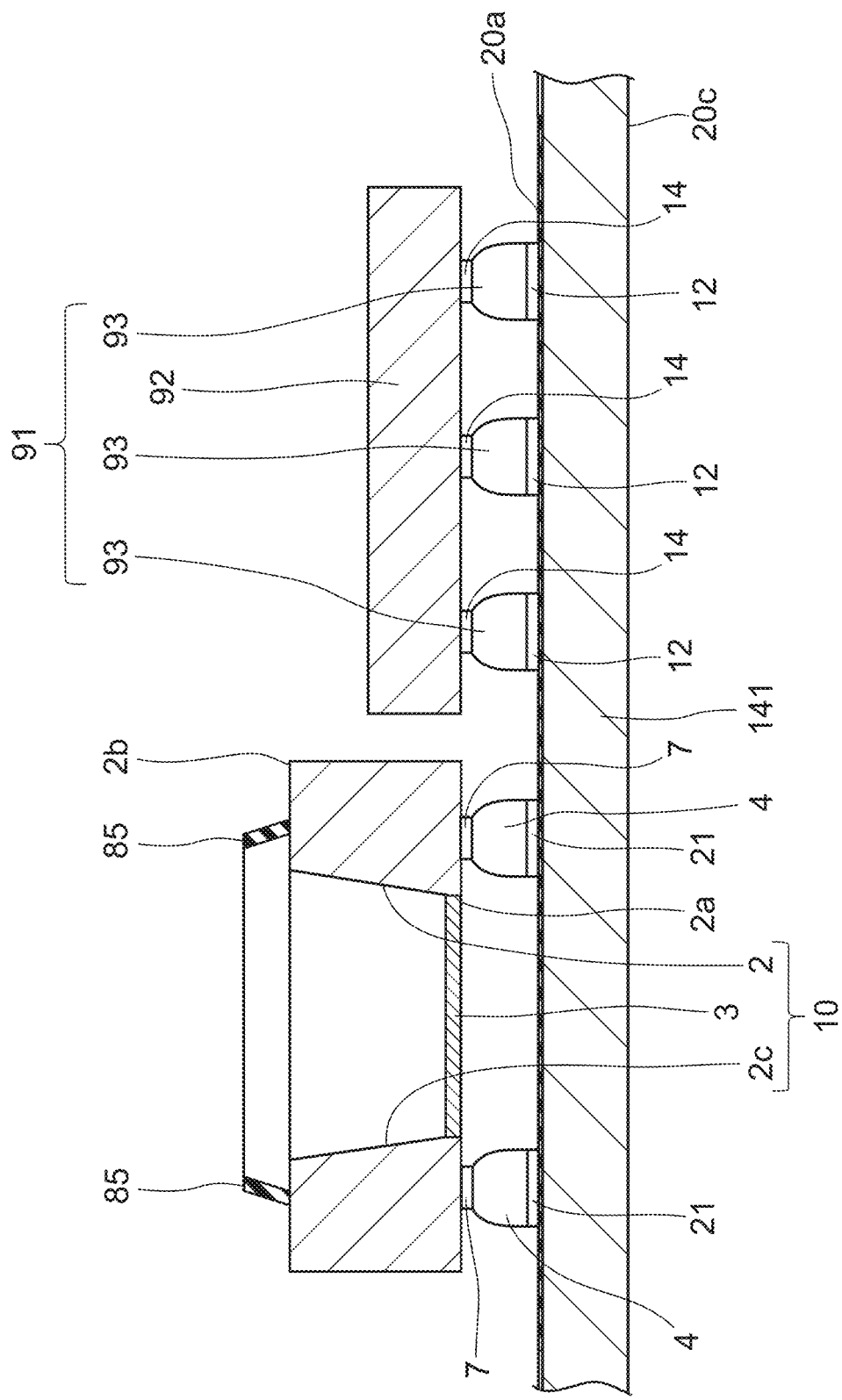
FIG. 40 is a sectional view showing the manufacturing step of the MEMS package and the MEMS microphone according to the fourth embodiment of the present invention, corresponding to FIG. 13.
Figure 41:
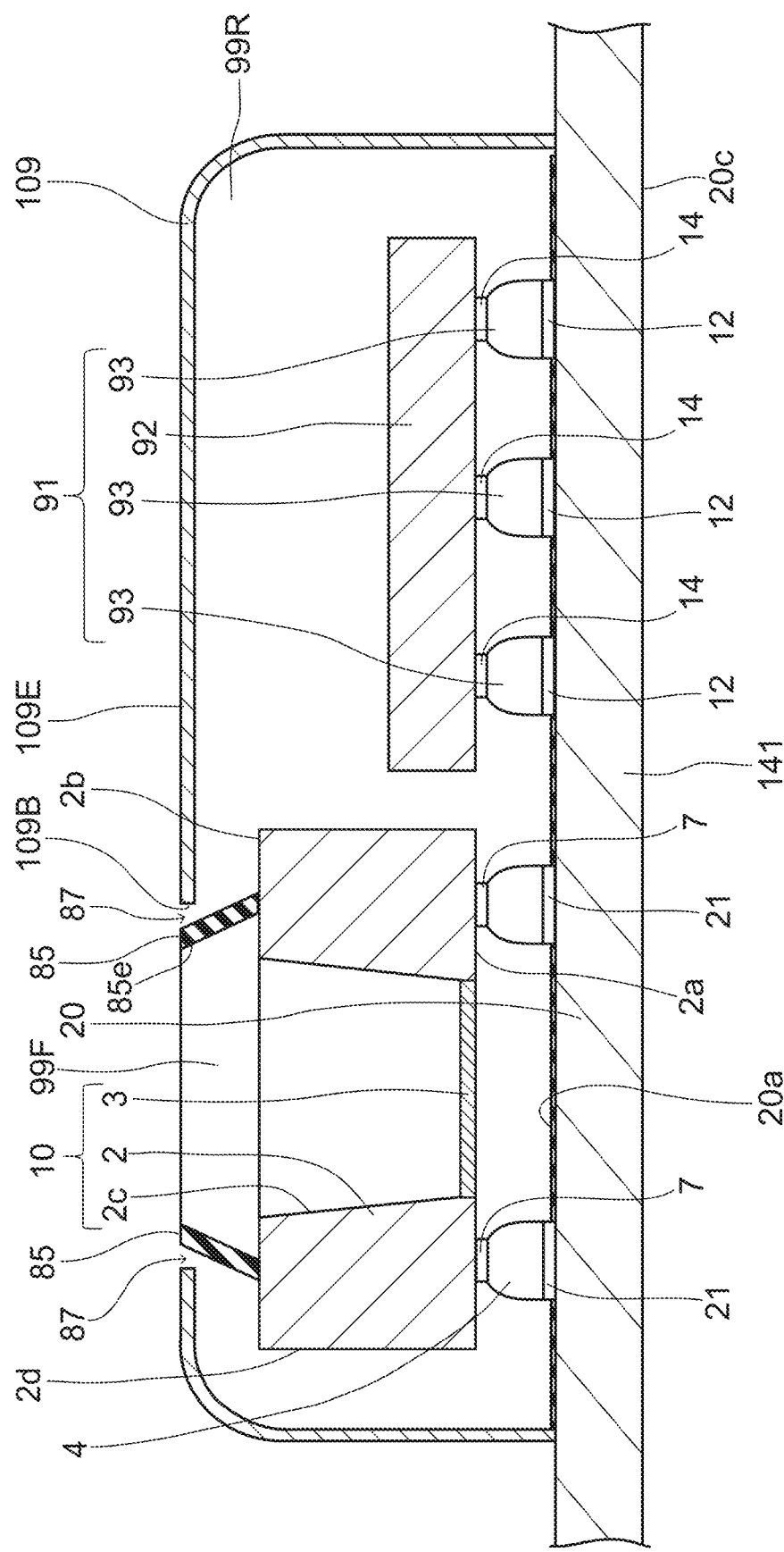
FIG. 41 is a sectional view showing the manufacturing step subsequent to that in FIG. 40.

Subsequently, the method of manufacturing the MEMS package 103 and the MEMS microphone 231, having the above structures, will be explained with reference to FIG. 40 to FIG. 41, in addition to FIG. 36, FIG. 39. Here, FIG. 40 is a sectional view showing the manufacturing step of the MEMS package 103, the MEMS microphone 231 corresponding to FIG. 13. FIG. 41 is a sectional view showing the manufacturing step subsequent to that in FIG. 40.

The method of manufacturing the MEMS package 103 and the method of manufacturing the MEMS microphone 231 are different in the annular dam-member forming step, the gel member forming step, and the cap mounting step, as compared with the above-described method of manufacturing the MEMS package 102 and the method of manufacturing the MEMS microphone 131.

(Annular Dam-Member Forming Step)

In the annular dam-member forming step, the above-described annular dam-members 85 are formed. The annular dam-members 85 are formed on the dam expected areas 41r of the respective MEMS regions 41, about the MEMS wafer 40, similar with the annular dam-members 75. Even in case of the annular dam-members 85, the dam layer forming step is performed repeatedly, thereby the laminated dam layer is formed, similar with the annular dam-member 75. However, in case of the annular dam-member 85, the laminated dam layer is formed by laminating a plurality of dam layers, which the widths are narrowed gradually.

In the method of manufacturing the MEMS package 103 and the method of manufacturing the MEMS microphone 231, the cap mounting step is performed previously than the gel member forming step.

In the cap mounting step, the caps 109 are mounted on the respective package regions 141 of the package-panel 140, as illustrated in FIG. 41. Then, the dam upper end parts 85e of the annular dam-members 85 are arranged inside the sound holes 109B, in the respective package regions 141. Further, the dam gaps 87 are formed between the dam upper end parts 85e and the annular end parts 109Be.

Subsequently, the gel member forming step is performed. In this case, the gel member forming step is performed so that the gels, having fluidity, enter between the dam upper end parts 85e and the annular end parts 109Be, namely the dam gaps 87. After that, the gel-members 86 are formed by hardening of gels. When the other steps are performed similar with method of manufacturing the MEMS package 102 and the method of manufacturing the MEMS microphone 131, the MEMS packages 103 and the MEMS microphones 231 are manufactured.

The MEMS package 103 and the MEMS microphone 231 have the dammed-seal part 150. Therefore, the MEMS package 103 and the MEMS microphone 231 are able to be manufactured certainly.

Especially, the dam upper end parts 85e are arranged inside the sound holes 109B, the dam upper surfaces 85a are exposed inside the sound hole 109B. Therefore, the dam upper end parts 85e appear clearly without being hidden by the caps 109. Then after the caps 109 are mounted in the respective package regions 141, the gels are able to be applied while viewing the annular dam-members 85 and the dam gaps 87. Therefore, the dam gaps 87 are sealed with the gel members 86 certainly.

Modified Example

Figure 42:
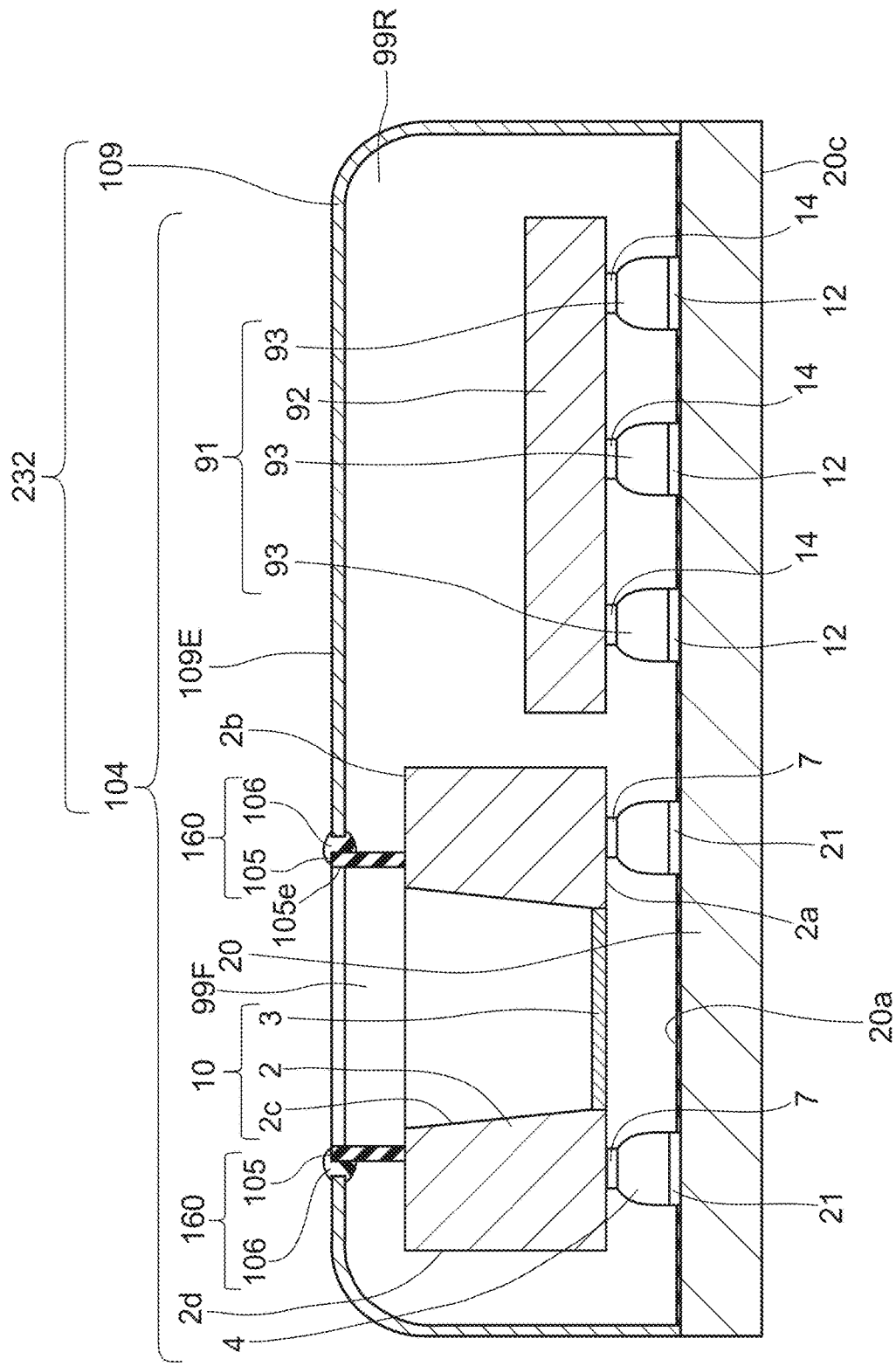
FIG. 42 is a sectional view showing a MEMS microphone according to the modified example, corresponding to FIG. 1.
Figure 43:
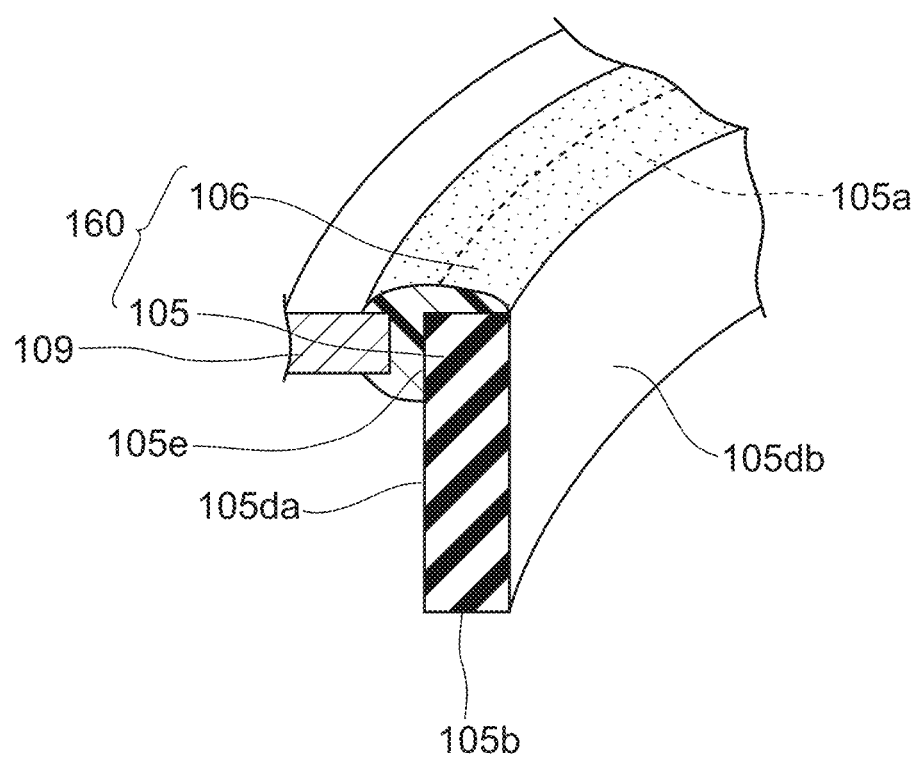
FIG. 43 is a perspective view showing the principal part of a dammed-seal part according to the modified example, corresponding to FIG. 5.
Figure 44:
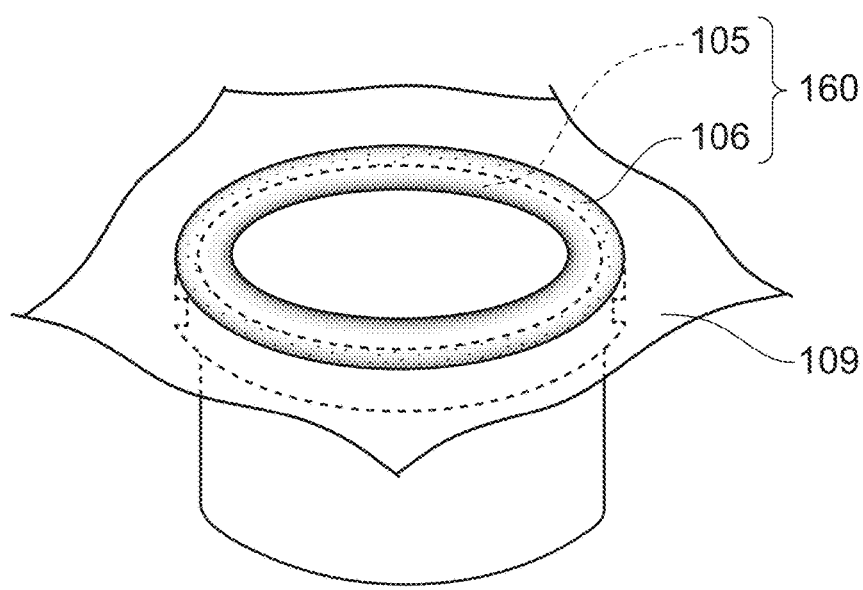
FIG. 44 is a perspective view showing the dammed-seal part according to the modified example.

FIG. 42 is a sectional view showing a MEMS microphone 232 according to the modified example of the fourth embodiment of the present invention, corresponding to FIG. 1. FIG. 43 is a perspective view showing the principal part of a dammed-seal part 160 of the MEMS microphone 232, corresponding to FIG. 5. FIG. 44 is a perspective view showing the dammed-seal part 160.

The MEMS package 104 and the MEMS microphone 232 are different in that they have dammed-seal parts 160 in place of the dammed-seal parts 150, as respectively compared with the MEMS package 103 and the MEMS microphone 231.

The dammed-seal part 160 is different in that it has an annular dam-member 105, a gel member 106 in place of the annular dam-member 85, the gel member 106, as compared with the dammed-seal parts 150.

As illustrated in FIG. 43, FIG. 44, the annular dam-member 105 has a dam upper surface 105a, being along with the chip surface 2b, a dam bottom surface 105b, being in contact with the chip surface 2b, a pair of dam side surfaces (outer dam side surface 105da, inner dam side surface 105db), connecting the dam upper surface 105a and the dam bottom surface 105b.

Then, the annular dam-member 105 has the fixed width (the width is a width along with the chip surface 2b) from the dam upper surface 105a to the dam bottom surface 105b. Further, the pair of dam side surfaces 105da, 105db are formed along with the perpendicular direction to the chip surface 2b. A dam upper end part 105e of the annular dam-member 105 is arranged inside the sound hole 109B. Further, the dam upper surface 105a is exposed inside the sound hole 109B. The annular dam-member 105 has the fixed structure which its form does not change, similar with the annular dam-member 85.

The gel-member 106 is a member formed by hardening of gel, which is applied on the annular dam-member 105. The gel-member 106 is formed by being adhered to the dam upper end part 105e, without being in contact with the chip surface 2b (distant from the chip surface 2b). The dam upper end part 105e is a part of the dam upper surface 105a side of the annular dam-member 105. The gel-member 106 is also adhered to the dam upper surface 105a.

Further, the gel-member 106 enters between the dam upper end part 105e and the annular end part 109Be, and it is adhered to both the dam upper end part 105e and the annular end part 109Be. Then, a gap between the dam upper end part 105e and the annular end part 109Be is sealed by the gel-member 106.

Because, the MEMS package 104 and the MEMS microphone 232 have the dammed-seal part 160, the MEMS package 104 and the MEMS microphone 232 are able to be manufactured certainly.

Especially, the dam upper end parts 105e are arranged inside the sound holes 109B, similar with the dam upper end parts 85e, the dam upper surfaces 85a are exposed inside the sound holes 109B. Therefore, the gels are able to be applied while viewing the annular dam-members 105 and the dam gaps. Therefore, the dam gaps are sealed with the gel member 106 certainly.

Fifth Embodiment (Structure of the MEMS Package, MEMS Microphone)

To begin with, the structure of the MEMS package 108, MEMS microphone 233, according to the fifth embodiment of the present invention will be explained with reference to FIG. 45 to FIG. 47.

Figure 45:
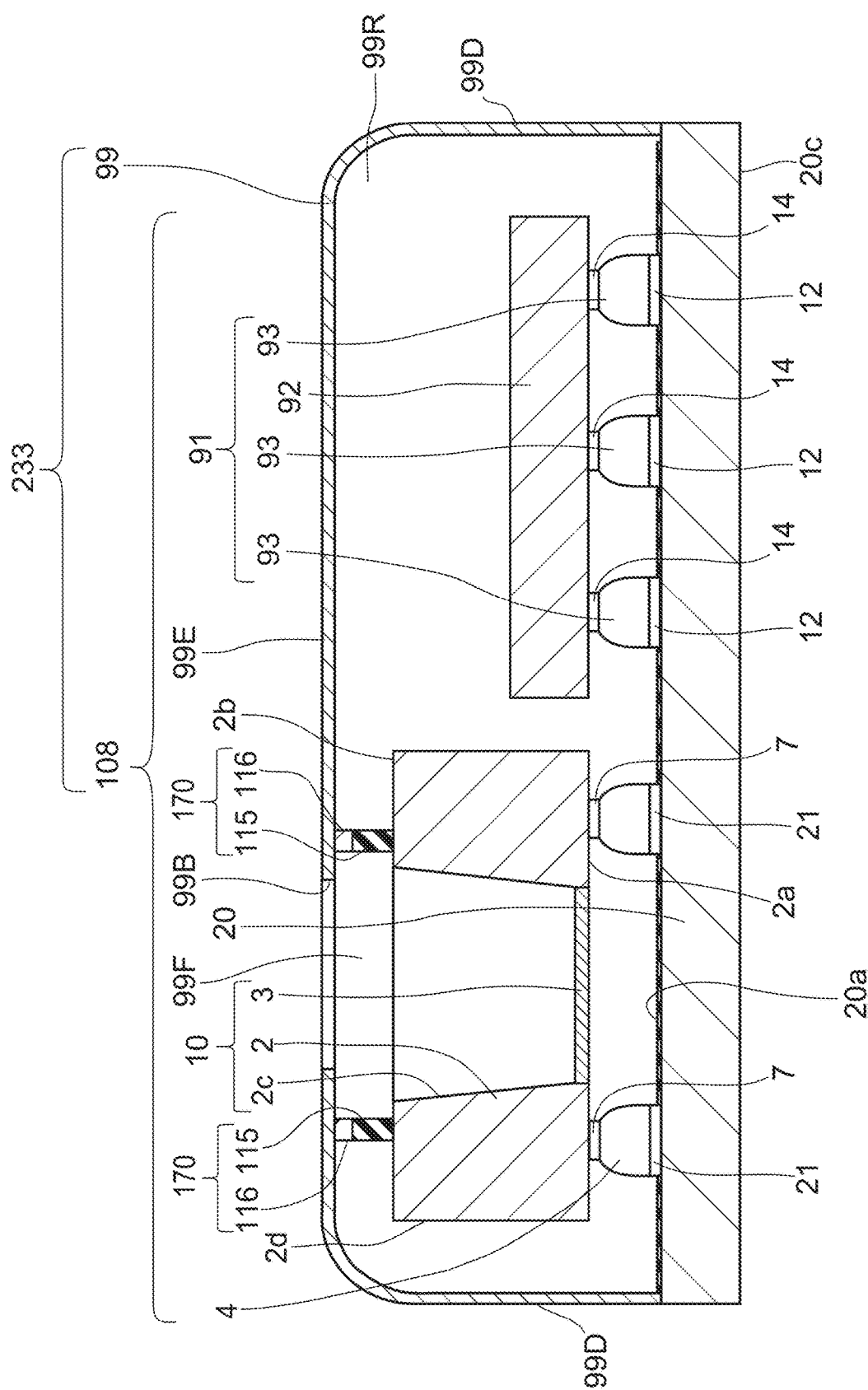
FIG. 45 is a sectional view showing the MEMS microphone according to the fifth embodiment of the present invention, corresponding to FIG. 1.

Here, FIG. 45 is a sectional view showing the MEMS microphone 233 according to the fifth embodiment of the present invention, corresponding to FIG. 1. FIG. 46 is a perspective view showing a principal part of a dammed-seal part 170 of the MEMS microphone 233, corresponding to FIG. 5. FIG. 47 is a perspective view showing the dammed-seal part 170.

The MEMS package 108, MEMS microphone 233 are different in that they have the dammed-seal parts 170, in place of the dammed-seal parts 70, as respectively compared with the MEMS package 101, MEMS microphone 121, according to the second embodiment of the present invention The dammed-seal part 170 is different in that it has an annular dam-member 115, a gel member 116 in place of the annular dam-member 65, the gel member 66, as compared with the dammed-seal part 70.

Figure 46:
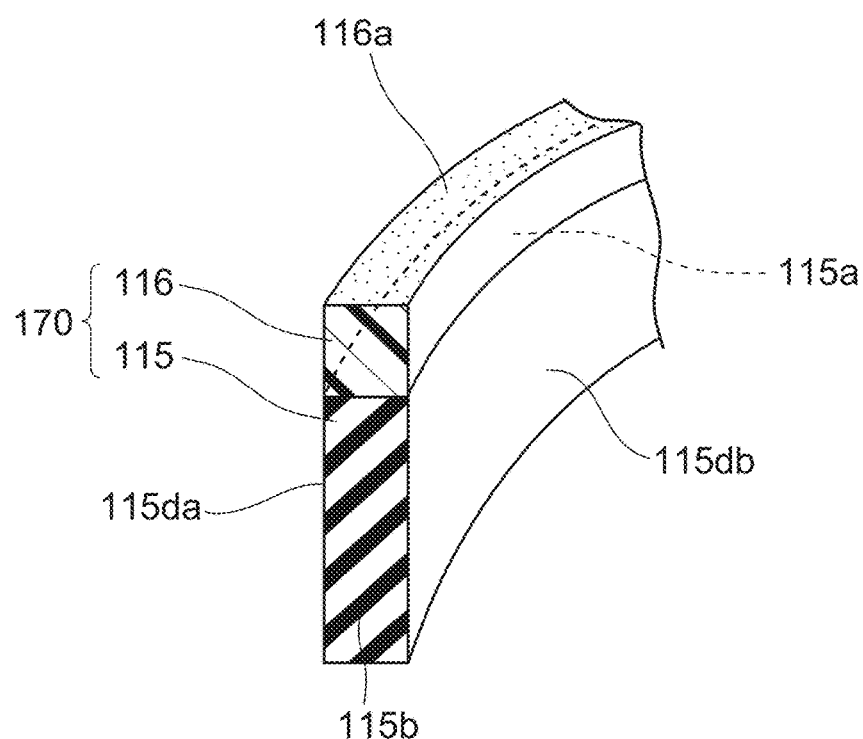
FIG. 46 is a perspective view showing the principal part of a dammed-seal part according to the fifth embodiment of the present invention, corresponding to FIG. 5.
Figure 47:
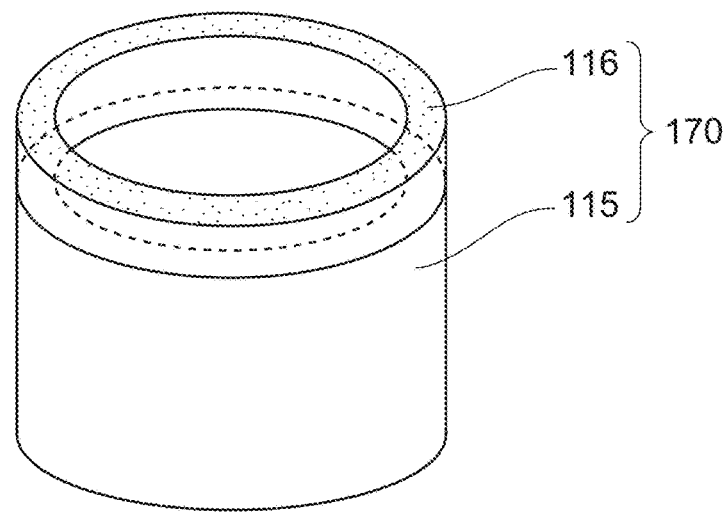
FIG. 47 is a perspective view showing the dammed-seal part according to the fifth embodiment of the present invention.

As illustrated in FIG. 46, the annular dam-member 115 has a dam upper surface 115a, being along with the chip surface 2b, a dam bottom surface 115b, being in contact with the chip surface 2b, a pair of dam side surfaces (outer dam side surface 115da, inner dam side surface 115db), connecting the dam upper surface 115a and the dam bottom surface 115b.

Then, the annular dam-member 115 has the fixed width (the width is a width along with the chip surface 2b) from the dam upper surface 115a to the dam bottom surface 115b. Further, the pair of dam side surfaces 115da, 115db are formed along with the perpendicular direction to the chip surface 2b. The whole of the annular dam-member 115, including the dam upper end part, is arranged inside the sound hole 99B. The annular dam-member 115 has an annular structure, which surrounds the whole of the sound hole 99B and the element hole-part 2c.

The annular dam-member 115 has the fixed structures which its form does not change, similar with the annular dam-member 65.

The gel-member 116 is a member formed by hardening of gel, which is applied on the annular dam-member 115. The gel-member 116 is formed by being adhered to the dam upper end part of the annular dam-member 115, without being in contact with the chip surface 2b (distant from the chip surface 2b). At this point, because the gel-member 116 is formed by being adhered to the dam upper surface 115a, in the annular dam-member 115, the dam upper surface 115a corresponds to the dam upper end part. Further, a gel surface 116a of the gel-member 116 is adhered to the top surface 99E of the cap 99 so as to surround the whole of the sound hole 99B.

(Method of Manufacturing the MEMS Package 108, MEMS Microphone 233)

Figure 48:
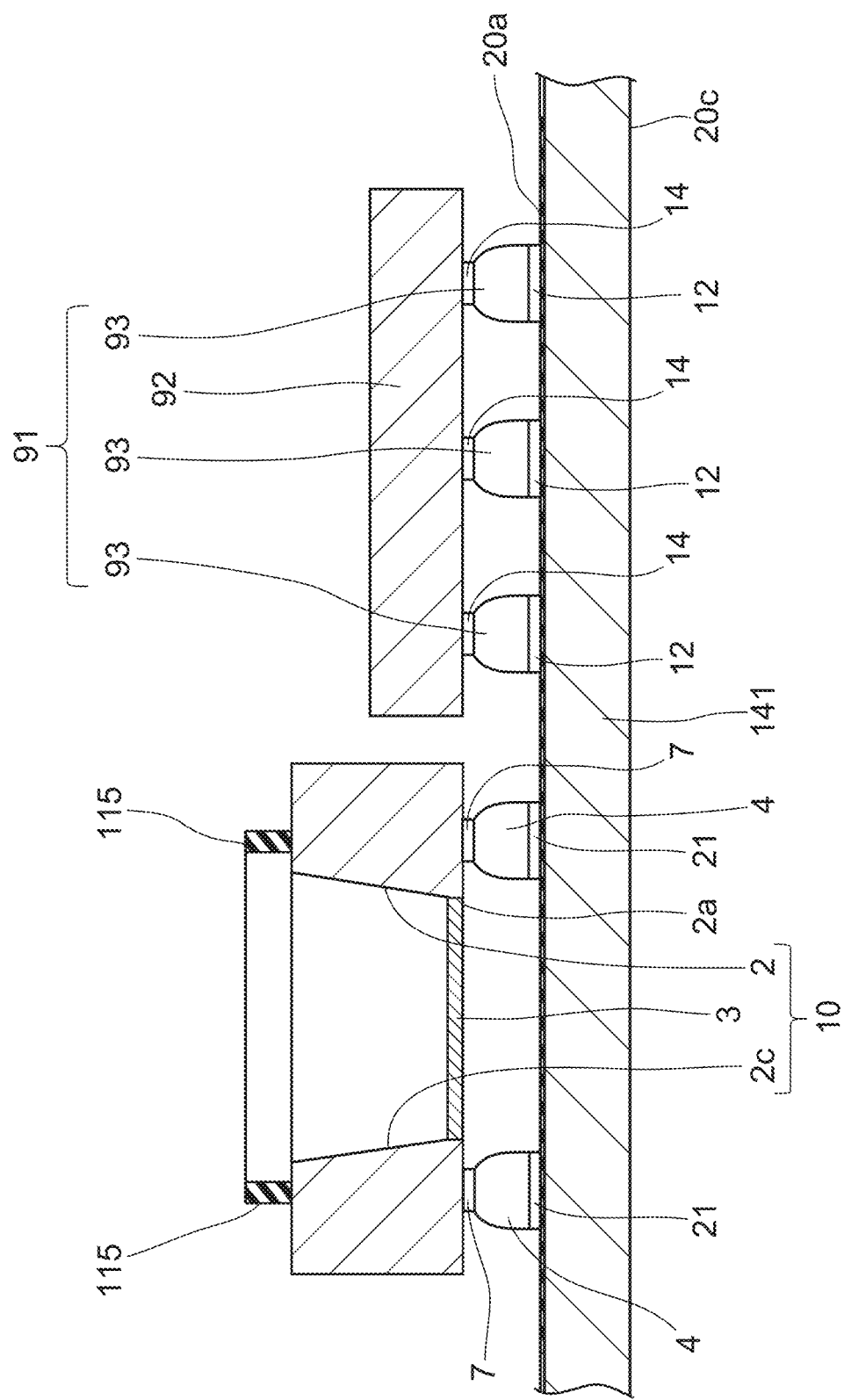
FIG. 48 is a sectional view showing the manufacturing step of the MEMS package and the MEMS microphone according to the fifth embodiment of the present invention, corresponding to FIG. 13.
Figure 49:
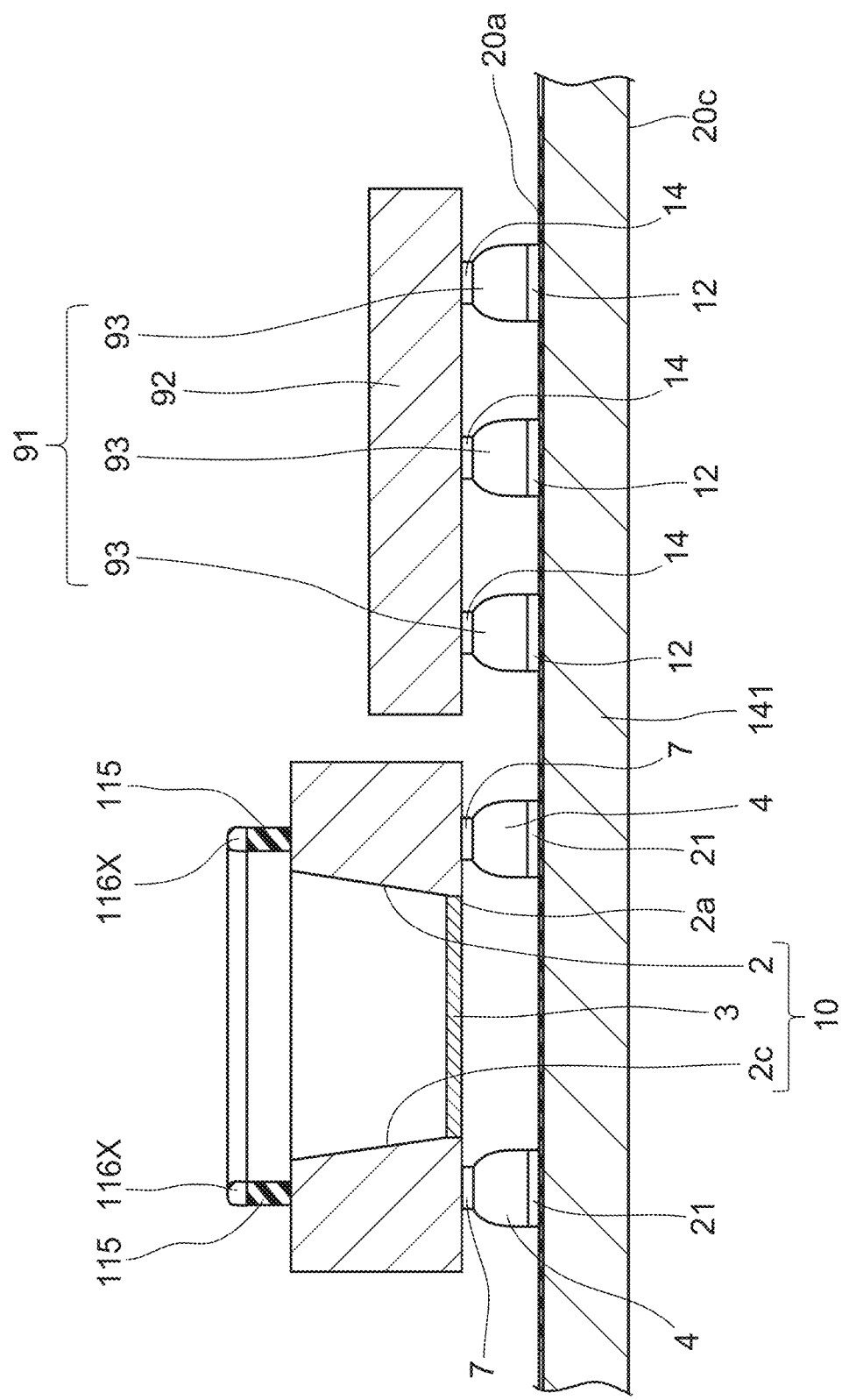
FIG. 49 is a sectional view showing the manufacturing step subsequent to that in FIG. 48.

Subsequently, the method of manufacturing the MEMS package 108 and the MEMS microphone 233, having the above structures, will be explained with reference to FIG. 48 to FIG. 49. Here, FIG. 48 is a sectional view showing the manufacturing step of the MEMS package 108, the MEMS microphone 233 corresponding to FIG. 13. FIG. 49 is a sectional view showing the manufacturing step subsequent to that in FIG. 48.

The method of manufacturing the MEMS package 108 and the method of manufacturing the MEMS microphone 233 are different in the annular dam-member forming step, the gel member forming step, and the cap mounting step, as compared with the above-described method of manufacturing the MEMS package 101 and the method of manufacturing the MEMS microphone 121.

(Annular Dam-Member Forming Step)

In the annular dam-member forming step, the above-described annular dam-members 115 are formed. The annular dam-members 115 are formed on the dam expected areas 41r of the respective MEMS regions 41, about the MEMS wafer 40, similar with the annular dam-members 65. Further, even in case of the annular dam-members 115, the laminated dam layer is formed. However, in case of the annular dam-members 115, the laminated dam layers are formed by laminating a plurality of dam layers having equal widths.

Then, in the gel member forming step, the gels, having fluidity, are applied on the dam upper surfaces 115a. In this case, as illustrated in FIG. 49, gels 116X, of the predetermined amount, are applied so that the gels 116X do not flow out from the dam upper surfaces 115a to the dam side surfaces 115da, 115db.

Further, in the cap mounting step, the caps 99 are mounted on the respective package regions 141 of the package-panel 140. In this case, the caps 99 are mounted so that the top surfaces 99E of the caps 99 are in contact with the gels 116X, but they do not push the gels 116X. After that, when the gels 116X lose fluidity to become solid like condition, the gel members 116 are formed.

The other steps are performed similar with the method of manufacturing the MEMS package 101 and the method of manufacturing the MEMS microphone 121, thereby, the MEMS package 108 and the MEMS microphone 233 are manufactured. In the MEMS package 108 and the MEMS microphone 233, the gel members 116 are in contact closely with the top surfaces 99E. Further, the top-seal structure, by the dammed-seal part 170, is formed certainly. In case of the dammed-seal part 170, the width of the annular dam-member 115 is fixed, there is a room in the space on the chip surface 2b than the MEMS package 101 and the MEMS microphone 121. Accordingly, the MEMS package 108 and the MEMS microphone 233 are able to be manufactured certainly.

Other Modified Examples

A modified example of the MEMS microphone 131 and a modified example of the MEMS microphone 133, according to the third embodiment of the present invention will be explained. The MEMS microphone 131 has the dammed-seal part 80 though, it may have a dammed-seal part 80A, illustrated in FIG. 50. Further, the MEMS microphone 133 also has the dammed-seal part 80 though, it may have the dammed-seal part 80A, illustrated in FIG. 51.

Figure 50:
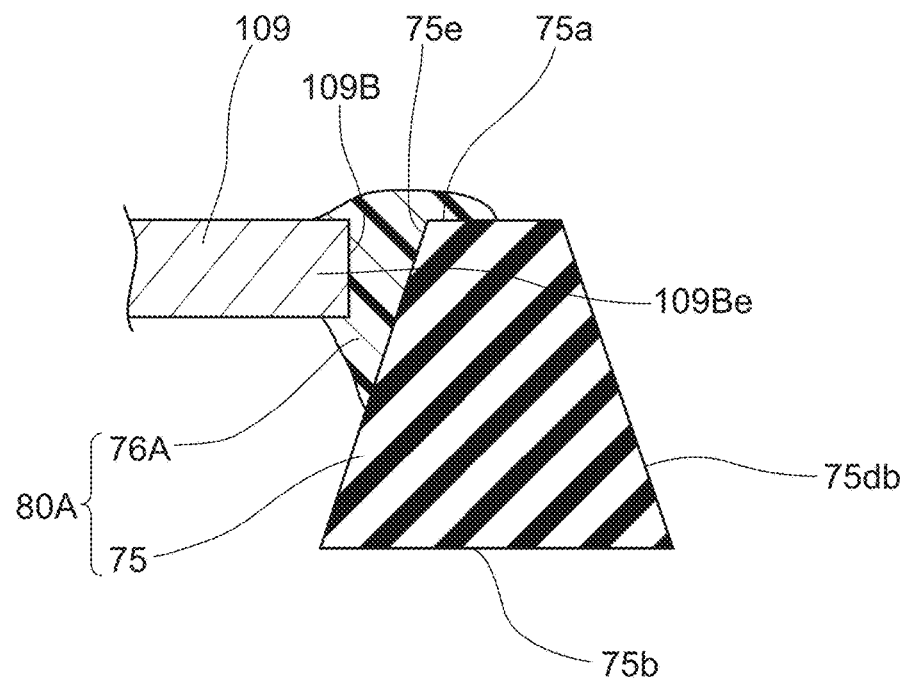
FIG. 50 is a sectional view showing a dammed-seal part and the principal part of the cap according to the modified example, corresponding to FIG. 26.
Figure 51:
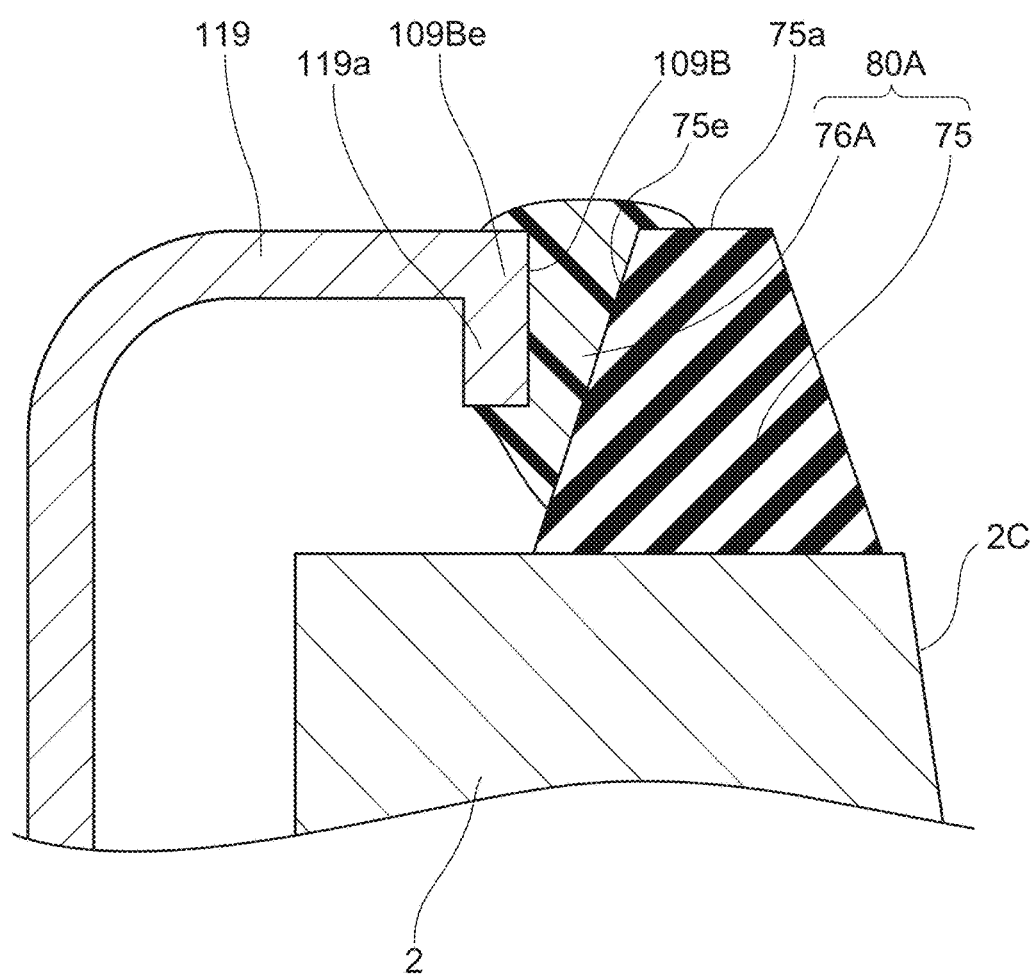
FIG. 51 is a sectional view showing a dammed-seal part and the principal part of the cap according to another modified example, corresponding to FIG. 31.
Figure 52:
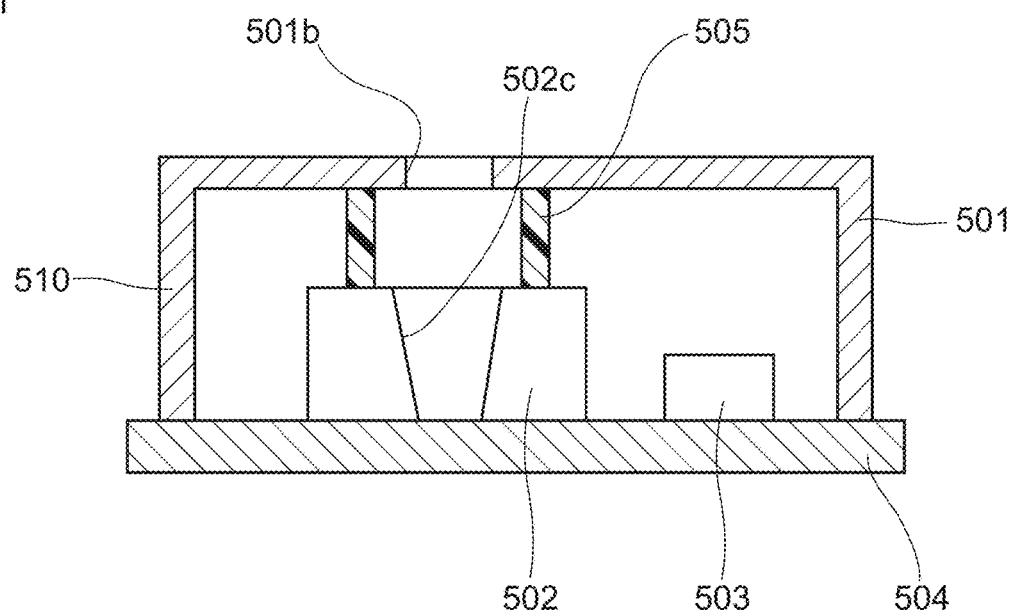
FIG. 52 is a sectional view showing the conventional MEMS microphone.
Figure 53:
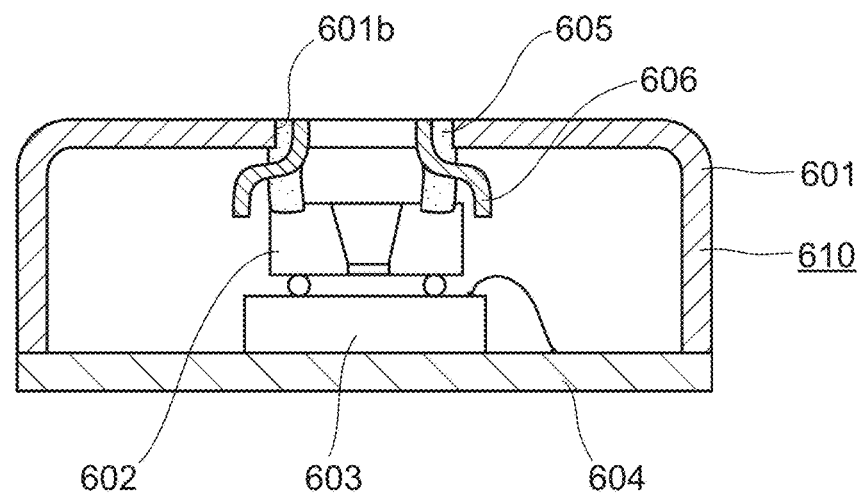
FIG. 53 is a sectional view showing the conventional MEMS microphone, different from that in FIG. 52.

The dammed-seal parts 80A are different in that they have gel members 76A in place of the gel members 76, as compared with the dammed-seal part 80. Further, the dammed-seal parts 80A have the annular dam-members 75, similar with the dammed-seal parts 80 though, as illustrated in FIG. 50, FIG. 51, the dam upper end parts 75e of the annular dam-members 75 are arranged inside the sound holes 109B. Further, the dam upper surfaces 75a are exposed inside the sound holes 109B.

The gel-members 76A are members formed by hardening of gel, which are applied on the annular dam-members 75. The gel-members 76A are formed by being adhered to the dam upper end parts 75e, without being in contact with the chip surface 2b (distant from the chip surface 2b). The dam upper end parts 75e are parts of the dam upper surfaces 75a sides of the annular dam-members 75. Further, the gel-members 76A enter between the dam upper end parts 75e and the annular end parts 109Be. The dam gaps are sealed by the gel-member 76A.

Then, when the MEMS microphones 131, 133 have the dammed-seal part 80A, the gel member forming step and the cap mounting step are performed, similar with the MEMS microphone 231, according to the fourth embodiment of the present invention. Thereby, the MEMS microphones 131, 133, having the dammed-seal parts 80A, are manufactured. In this case, after the caps 109 are mounted on the respective package regions 141 of the package-panel 140, the gels are able to be applied while viewing the annular dam-members 75 and the dam gaps. Thereby, the MEMS microphones 131, 133, having the dammed-seal parts 80A, are manufactured. Therefore, the dam gaps are sealed with the gel members 76A certainly, in the MEMS microphones 131, 133.

The type "double back-plate", having two not illustrated thin-films which are called back-plate are arranged in the upper side and the lower side of the membrane 3, is explained exemplarily in the embodiment. The present invention is also applicable to the type "single back-plate", having one back-plate is arranged in the one side of the membrane 3.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A MEMS package comprising:
a MEMS chip, a package substrate which the MEMS chip is adhered, and a dammed-seal part,
wherein the MEMS chip comprises an element substrate which a movable element is formed,
wherein the element substrate comprises an element hole-part which the movable element is arranged,
wherein the dammed-seal part comprises an annular dam-member which is formed on the element substrate so as to surround the element hole-part, and a gel member,
wherein the gel member is formed by hardening of gel which is applied on the annular dam-member;
wherein the annular dam-member is formed on an outside surface of the element substrate without sticking out of an outer edge of the outside surface of the element substrate, and
wherein the gel member is adhered to a dam upper end part or a dam upper surface of the annular dam-member, a distance from an upper surface of the gel member to the outside surface of the element substrate being greater than or equal to a distance from the dam upper surface of the annular dam-member to the outside surface of the element substrate.

2. A MEMS package comprising:
a MEMS chip, a package substrate which the MEMS chip is adhered, and a dammed-seal part,
wherein the MEMS chip comprises an element substrate which a movable element is formed,
wherein the element substrate comprises an element hole-part which the movable element is arranged,
wherein the dammed-seal part comprises an annular dam-member which is formed on the element substrate so as to surround the element hole-part, and a gel member,
wherein the gel member is formed by hardening of gel which is applied on the annular dam-member,
wherein the annular dam-member has a double-ring structure constituted by an inner dam-member, which surrounds the element hole-part, and an outer dam-member, which surrounds the inner dam-member.

3. The MEMS package according to claim 2,
wherein the inner dam-member and the outer dam-member comprises respectively a dam upper surface, which is along with a chip surface being an outer surface of the element substrate, a dam bottom surface, which is in contact with the chip surface, a pair of dam slopes, which connects the dam upper surface and the dam bottom surface, and a variable width structure in which the width gradually increases toward the dam bottom surface from the dam upper surface, an annular groove-part, having a V-figure shape in a sectional view, is secured between the inner dam-member and the outer dam-member,
wherein the gel member is in contact with both the dam upper surface of the inner dam-member and the dam upper surface of the outer dam-member, and the gel member enters the annular groove-part to be in contact with the dam slopes of the inner dam-member and the outer dam-member.

4. A MEMS package comprising:
a MEMS chip, a package substrate which the MEMS chip is adhered, and a dammed-seal part,
wherein the MEMS chip comprises an element substrate which a movable element is formed,
wherein the element substrate comprises an element hole-part which the movable element is arranged,
wherein the dammed-seal part comprises an annular dam-member which is formed on the element substrate so as to surround the element hole-part, and a gel member,
wherein the gel member is formed by hardening of gel which is applied on the annular dam-member,
wherein the annular dam-member comprises a dam upper surface, which is along with a chip surface being an outer surface of the element substrate, a dam bottom surface, which is in contact with the chip surface, a pair of dam slopes, which connect the dam upper surface and the dam bottom surface, and a variable width structure in which the width gradually increases toward the dam bottom surface from the dam upper surface, wherein the gel member is in contact with the dam upper surface and the pair of dam slopes, and the gel member is formed so as to cover the annular dam-member.

5. A MEMS package comprising:

a MEMS chip, a package substrate which the MEMS chip is adhered, and a dammed-seal part, wherein the MEMS chip comprises an element substrate which a movable element is formed, wherein the element substrate comprises an element hole-part which the movable element is arranged, wherein the dammed-seal part comprises an annular dam-member which is formed on the element substrate so as to surround the element hole-part, and a gel member, wherein the gel member is formed by hardening of gel which is applied on the annular dam-member, wherein the annular dam-member comprises a dam upper surface, which is along with a chip surface being an outer surface of the element substrate, a dam bottom surface, which is in contact with the chip surface, a pair of dam slopes, which connect the dam upper surface and the dam bottom surface, and a variable width structure in which the width gradually increases toward the dam bottom surface from the dam upper surface, wherein the gel member is in contact with the dam upper surface and an outer dam slope, which is arranged outside, of the pair of dam slopes, and the gel member is formed so as to lean against the annular dam-member.

6. A MEMS microphone comprising:

a MEMS package, and a cap which wraps the MEMS package, wherein the MEMS package comprises a MEMS chip, a package substrate which the MEMS chip is adhered, and a dammed-seal part, wherein the MEMS chip comprises an element substrate which a movable element is formed, wherein the element substrate comprises an element hole-part which the movable element is arranged, wherein the dammed-seal part comprises an annular dam-member which is formed on the element substrate so as to surround the element hole-part, and a gel member, wherein the gel member is formed by hardening of gel which is applied on the annular dam-member, wherein the annular dam-member is formed on an outside surface of the element substrate without sticking out of an outer edge of the outside surface of the element substrate, wherein the gel member is adhered to a dam upper end part or a dam upper surface of the annular dam-member, a distance from an upper surface of the gel member to the outside surface of the element substrate being greater than or equal to a distance from the dam upper surface of the annular dam-member to the outside surface of the element substrate, wherein the cap comprises a top surface, which is formed so as to oppose to the package substrate, and a cap side-surface, which surrounds the top surface to be adhered to the package substrate, wherein the top surface comprises a sound hole, wherein the gel member of the dammed-seal part is adhered to the top surface so as to surround the sound hole, or the gel member of the dammed-seal part is adhered to an annular end part, forming the sound hole.

7. The MEMS microphone according to claim 6, wherein the dam upper end part of the annular dam-member is arranged inside the sound hole, and the gel member enters between the dam upper end part and the annular end part.

8. The MEMS microphone according to claim 6, wherein the annular dam-member has a double-ring structure constituted by an inner dam-member, which surrounds the element hole-part, and an outer dam-member, which surrounds the inner dam-member, wherein the inner dam-member and the outer dam-member comprises respectively a dam upper surface, which is along with a chip surface being an outer surface of the element substrate, a dam bottom surface, which is in contact with the chip surface, a pair of dam slopes, which connects the dam upper surface and the dam bottom surface, and a variable width structure in which the width gradually increases toward the dam bottom surface from the dam upper surface, an annular groove-part, having a V-figure shape in a sectional view, is secured between the inner dam-member and the outer dam-member, wherein the gel member is in contact with both the dam upper surface of the inner dam-member and the dam upper surface of the outer dam-member, and the gel member enters the annular groove-part to be in contact with the dam slopes of the inner dam-member and the outer dam-member.

9. The MEMS microphone according to claim 6, wherein the annular dam-member comprises a dam upper surface, which is along with a chip surface being an outer surface of the element substrate, a dam bottom surface, which is in contact with the chip surface, a pair of dam slopes, which connect the dam upper surface and the dam bottom surface, and a variable width structure in which the width gradually increases toward the dam bottom surface from the dam upper surface, wherein the gel member is in contact with the dam upper surface and the pair of dam slopes, and the gel member is formed so as to cover the annular dam-member.

10. The MEMS microphone according to claim 6, wherein the annular dam-member comprises a dam upper surface, which is along with a chip surface being an outer surface of the element substrate, a dam bottom surface, which is in contact with the chip surface, a pair of dam slopes, which connects the dam upper surface and the dam bottom surface, and a variable width structure in which the width gradually increases toward the dam bottom surface from the dam upper surface, wherein the gel member is in contact with the dam upper surface and an outer dam slope, which is arranged outside, of the pair of dam slopes, and the gel member is formed so as to lean against the annular dam-member.

11. The MEMS microphone according to claim 10, wherein the top surface has an annular end part which forms the sound hole, wherein the annular end part sinks into the gel member.

12. The MEMS microphone according to claim 11, wherein the annular end part has a sunk edge which protrudes along with the intersecting direction of the top surface, wherein the sunk edge sinks into the gel member.

13. The MEMS microphone according to claim 6, wherein the annular dam-member comprises a dam upper surface, which is along with a chip surface being an outer surface of the element substrate, a dam bottom surface, which is in contact with the chip surface, a pair of dam slopes, which connects the dam upper surface and the dam bottom surface, and a variable width structure in which the width gradually increases toward the dam bottom surface from the dam upper surface, a dam upper end part of the dam upper surface side of the annular dam-member is arranged inside the sound hole, wherein the gel member is formed by being adhered to the dam upper end part, without being in contact with the chip surface, and the gel member enters between the dam upper end part and the annular end part.

* * * * *